United States Patent
Ohno et al.

(10) Patent No.: US 9,165,848 B2
(45) Date of Patent: Oct. 20, 2015

(54) SEMICONDUCTOR DEVICE

(75) Inventors: Hirotaka Ohno, Miyoshi (JP); Takuya Kadoguchi, Toyota (JP)

(73) Assignee: TOYOTA JIDOSHA KABUSHIKI KAISHA, Toyota-Shi (JP)

(*) Notice: Subject to any disclaimer, the term of this patent is extended or adjusted under 35 U.S.C. 154(b) by 0 days.

(21) Appl. No.: 14/347,505

(22) PCT Filed: Sep. 29, 2011

(86) PCT No.: PCT/JP2011/072433
§ 371 (c)(1),
(2), (4) Date: Mar. 26, 2014

(87) PCT Pub. No.: WO2013/046400
PCT Pub. Date: Apr. 4, 2013

(65) Prior Publication Data
US 2014/0232016 A1  Aug. 21, 2014

(51) Int. Cl.
| | |
|---|---|
| H01L 23/10 | (2006.01) |
| H01L 23/48 | (2006.01) |
| H01L 23/28 | (2006.01) |
| H01L 25/18 | (2006.01) |
| H01L 23/433 | (2006.01) |
| H01L 23/492 | (2006.01) |
| H01L 25/07 | (2006.01) |
| H01L 23/31 | (2006.01) |
| H01L 23/00 | (2006.01) |

(52) U.S. Cl.
CPC ............ *H01L 23/28* (2013.01); *H01L 23/4334* (2013.01); *H01L 23/492* (2013.01); *H01L 25/072* (2013.01); *H01L 25/18* (2013.01); *H01L 23/3107* (2013.01); *H01L 23/562* (2013.01); *H01L 2224/48091* (2013.01); *H01L 2224/48247* (2013.01); *H01L 2924/1305* (2013.01); *H01L 2924/13055* (2013.01); *H01L 2924/30107* (2013.01)

(58) Field of Classification Search
USPC .................. 257/707, 713, 787, 723, E23.051, 257/E23.101
See application file for complete search history.

(56) References Cited

U.S. PATENT DOCUMENTS

| | | | | |
|---|---|---|---|---|
| 5,726,466 | A * | 3/1998 | Nishitani | 257/181 |
| 6,448,645 | B1 * | 9/2002 | Kimura et al. | 257/735 |
| 6,703,707 | B1 * | 3/2004 | Mamitsu et al. | 257/718 |
| 6,960,825 | B2 * | 11/2005 | Mamitsu et al. | 257/718 |
| 6,967,404 | B2 * | 11/2005 | Mamitsu et al. | 257/718 |
| 6,998,707 | B2 * | 2/2006 | Fukuda et al. | 257/713 |

FOREIGN PATENT DOCUMENTS

| | | |
|---|---|---|
| JP | 2003-124406 A | 4/2003 |
| JP | 2005-228929 A | 8/2005 |

* cited by examiner

*Primary Examiner* — Nitin Parekh
(74) *Attorney, Agent, or Firm* — Kenyon & Kenyon LLP

(57) ABSTRACT

This semiconductor device includes: a first metal plate; a plurality of semiconductor elements mounted on the first metal plate; a spacer that is connected to a surface on the opposite side to the surface where the plurality of semiconductor elements are mounted on the first metal plate; a second metal plate that is connected to a surface on the opposite side to the surface where the spacer is connected to the semiconductor elements; and an encapsulating resin between the first plate and the second plate that seals the plurality of semiconductor elements. Stress due to contraction that occurs in the encapsulating resin between the plurality of semiconductor elements is relaxed to a greater extent than stress due to contraction that occurs in the encapsulating resin in the locations other than the location between the plurality of semiconductor devices.

6 Claims, 40 Drawing Sheets

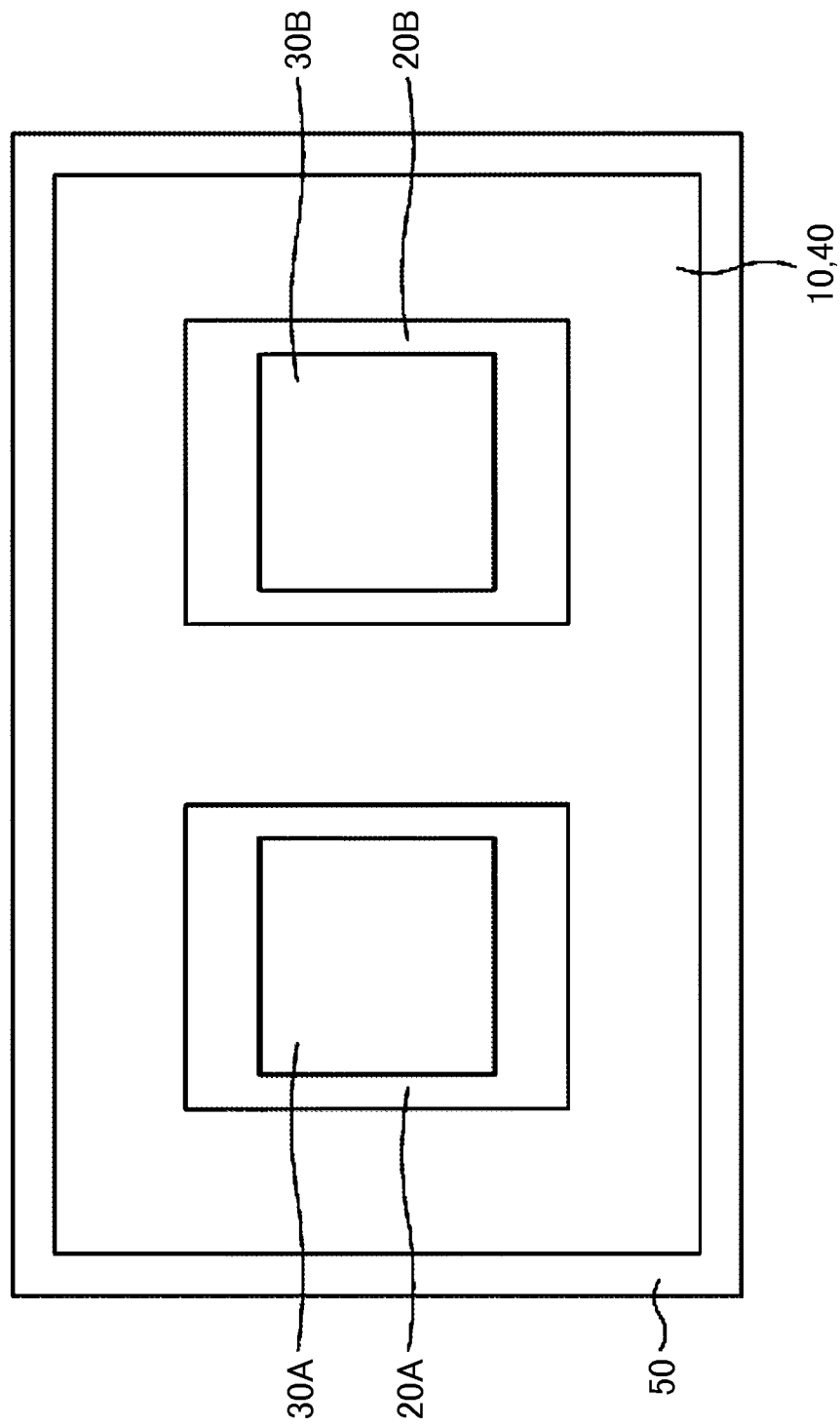

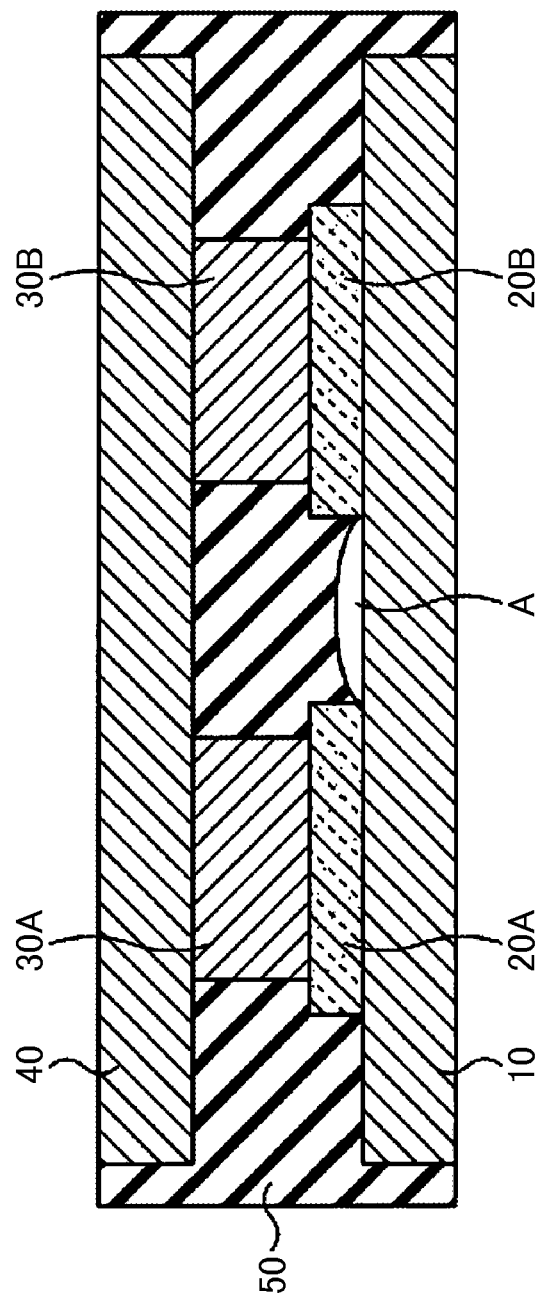

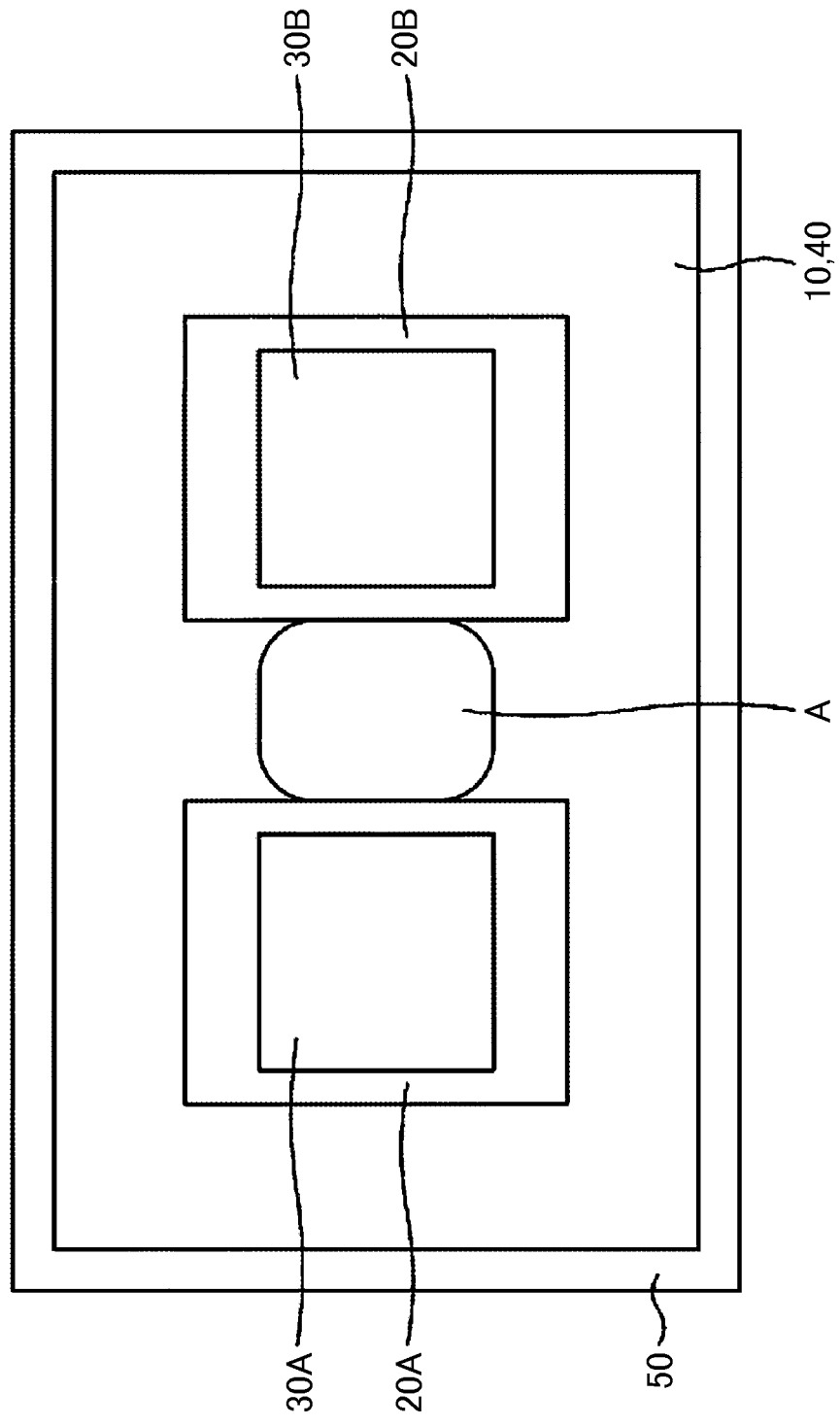

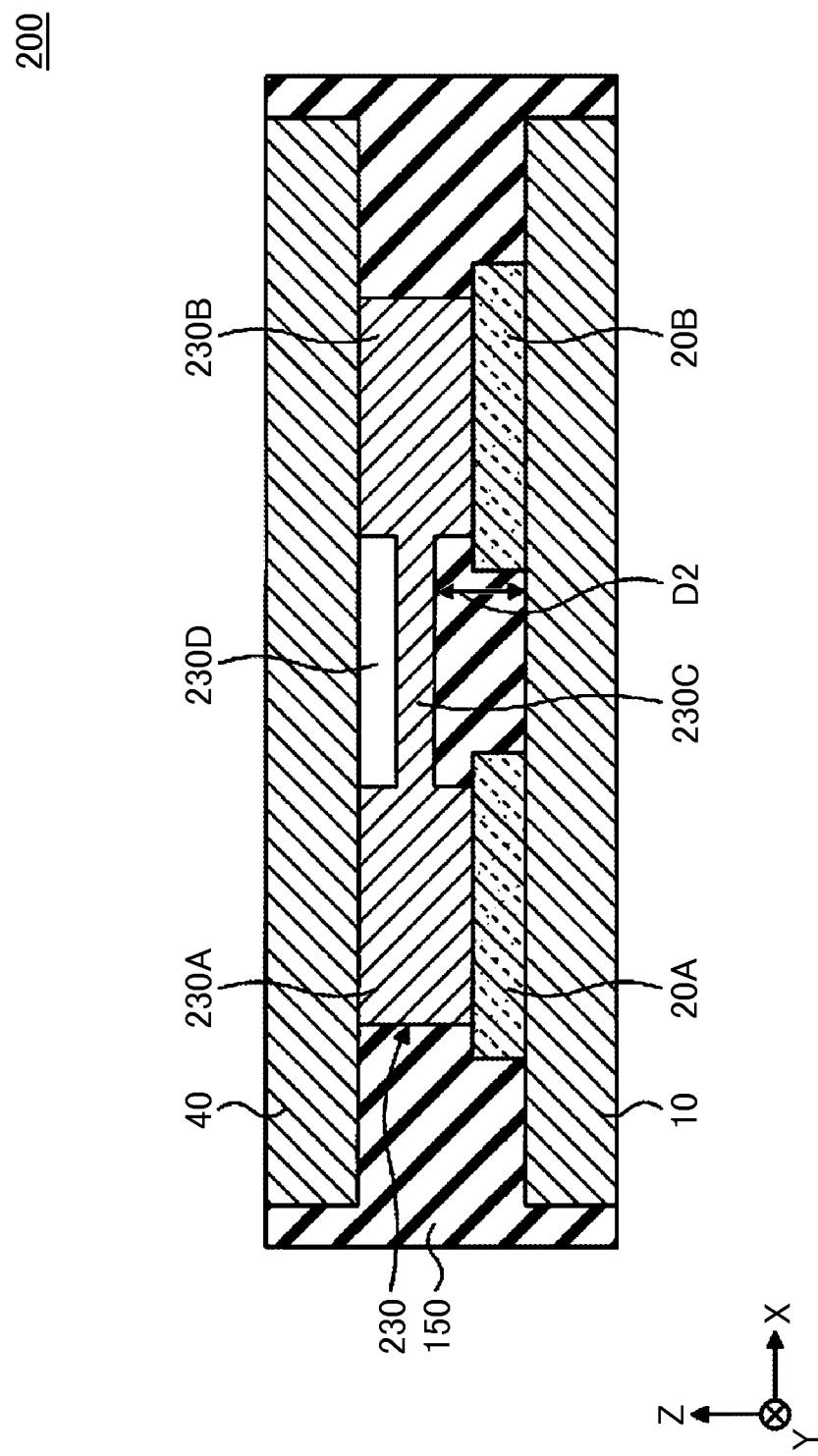

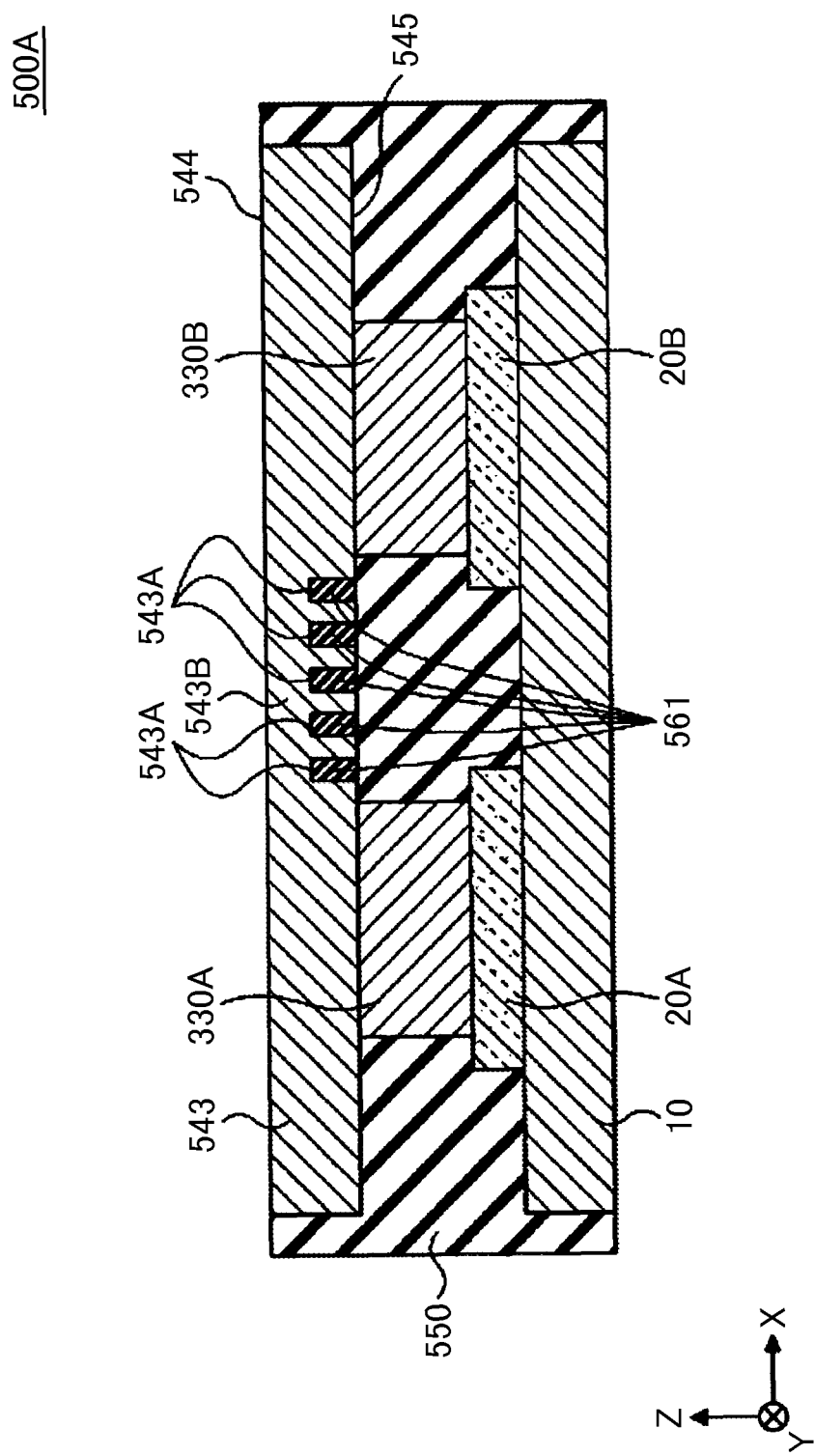

F I G . 17
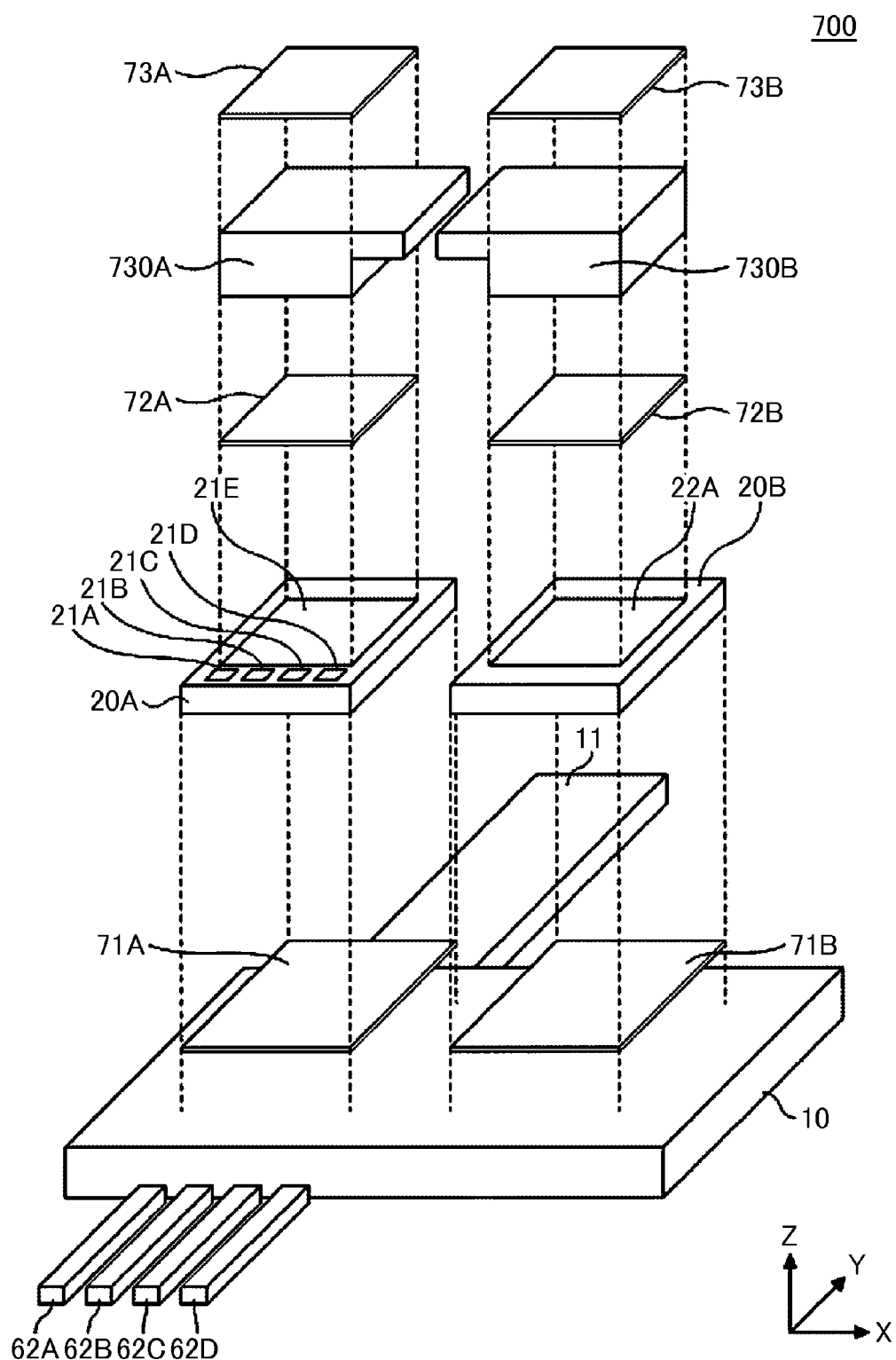

F I G . 21
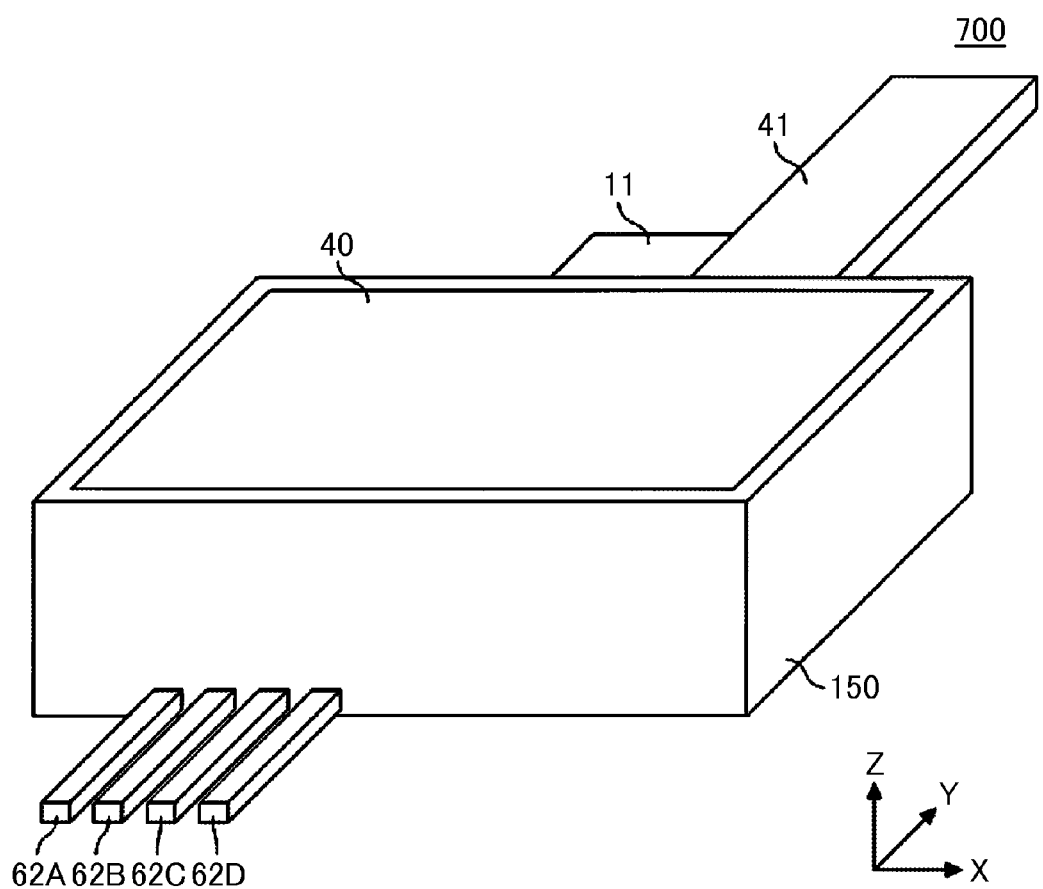

F I G . 24B
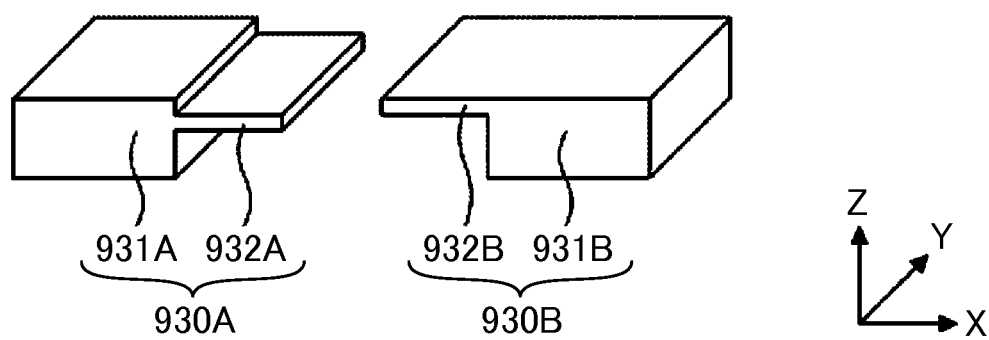

SEMICONDUCTOR DEVICE

CROSS-REFERENCE TO RELATED APPLICATIONS

This is a national phase application based on the PCT International Patent Application No. PCT/JP2011/072433 filed on Sep. 29, 2011, the entire contents of which are incorporated herein by reference.

TECHNICAL FIELD

The present invention relates to a semiconductor device.

BACKGROUND ART

Among semiconductor devices including a semiconductor element, a pair of heat radiating plates for radiating heat from both surfaces of the semiconductor element, and an encapsulating resin for covering all over the device, there has conventionally been a semiconductor device that further includes a solder layer for bonding the semiconductor element and the heat radiating plates and a polyamide resin that is applied to surfaces of the heat radiating plates and improves adhesion to the encapsulating resin. The heat radiating plate is connected to a terminal of the semiconductor element and also utilized as an electrode (see Patent Document 1, for example).

PRIOR ART DOCUMENTS

Patent Documents

Patent Document 1: Japanese Patent Application Publication No. 2003-124406 (JP 2003-124406 A)

SUMMARY OF THE INVENTION

Problem to be Solved by the Invention

When the conventional semiconductor device includes a plurality of the semiconductor elements, there is a case where the encapsulating resin is peeled from the heat radiating plates between the semiconductor elements due to contraction of the encapsulating resin. If the encapsulating resin is peeled from the heat radiating plates, stress acts between the semiconductor element and the heat radiating plate due to a difference between a linear expansion coefficient of the semiconductor element and that of the heat radiating plate, and this may cause a fatigue fracture.

If the fatigue fracture occurs between the semiconductor element and the heat radiating plate, electrical connection between the heat radiating plate that is used as the electrode and the terminal of the semiconductor element is damaged, and this may cause operational failure of or damage to the semiconductor device.

In view of the above, a purpose is to provide a semiconductor device that suppresses the fatigue fractures of a semiconductor elements and an electrode.

Means for Solving the Problem

A semiconductor device according to embodiments of the present invention includes: a first metal plate; plural semiconductor elements mounted on the first metal plate; a spacer connected to surfaces opposite from mounted surfaces of the plural semiconductor elements on the first metal plate; a second metal plate that is connected to a surface opposite from a connected surface of the spacer to the semiconductor elements; and an encapsulating resin for sealing the semiconductor elements between the first metal plate and the second metal plate, and stress generated by contraction of the encapsulating resin between the plural semiconductor elements is relaxed to a greater extent than stress generated by the contraction of the encapsulating resin in a portion other than that between the plural semiconductor elements.

Effect of the Invention

It is possible to provide a semiconductor device that can suppress the fatigue fractures of a semiconductor element and an electrode.

BRIEF DESCRIPTION OF THE DRAWINGS

FIG. 1B is a perspective view for showing the structure of the semiconductor device in the comparative example in a plan view.

FIG. 2A is a view for showing the cross-sectional structure of the semiconductor device in the comparative example in which peeling occurs.

FIG. 2B is a plan view for showing a state in which peeling occurs to the semiconductor device in the comparative example.

FIG. 12A is a cross-sectional view of the semiconductor device according to a second embodiment.

FIG. 14D is a cross-sectional view for showing the semiconductor device according to a first modification of the fourth embodiment.

FIG. 17 is a view for showing a manufacturing process of a semiconductor device 700 in the sixth embodiment.

FIG. 21 is a view for showing the manufacturing process of the semiconductor device 700 in the sixth embodiment.

FIG. 24B is a perspective view for showing the spacer of the semiconductor device in the eighth embodiment.

MODES FOR CARRYING OUT THE INVENTION

A description will hereinafter be made on embodiments to which a semiconductor device according to the present invention is applied.

Before the semiconductor device of the embodiments is described, a semiconductor device in a comparative example will be described with reference to FIG. 1 and FIG. 2.

Figure 1A:
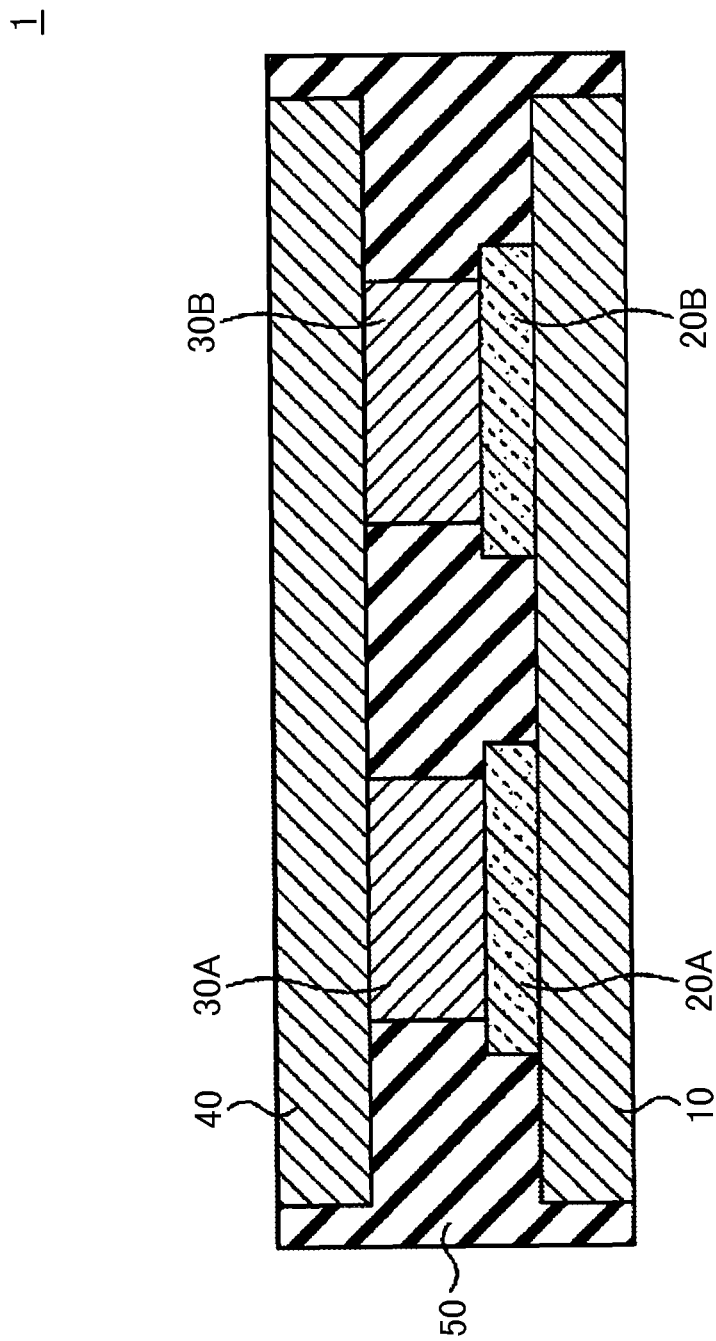
FIG. 1A is a view for showing a cross-sectional structure of a semiconductor device in a comparative example.

FIG. 1A is a view for showing a cross-sectional structure of the semiconductor device in the comparative example. FIG. 1B is a perspective view for showing the structure of the semiconductor device in the comparative example in a plan view.

FIG. 2A is a view for showing the cross-sectional structure of the semiconductor device in the comparative example in which peeling occurs, and FIG. 2B is a plan view for showing a state in which peeling occurs to the semiconductor device in the comparative example.

A semiconductor device 1 of the comparative example includes an electrode 10, semiconductor elements 20A, 20B, spacers 30A, 30B, an electrode 40, and an encapsulating resin 50.

The electrode 10 is connected to terminals on lower surfaces of the semiconductor elements 20A, 20B and functions as an electrode to drive the semiconductor elements 20A, 20B and as a heat radiating plate for radiating heat that is produced by the semiconductor elements 20A, 20B.

Each of the semiconductor elements 20A, 20B has a terminal on both an upper surface and the lower surface, the terminal on the lower surface side is connected to the electrode 10, and the terminal on the upper surface side is connected to the electrode 40 through the spacers 30A, 30B. It should be noted that the semiconductor elements 20A, 20B are in the same size in the plan view.

The spacer 30A is disposed between the semiconductor element 20A and the electrode 40 and connects between the terminal on the upper surface of the semiconductor element 20A and the electrode 40. The spacer 30B is disposed between the semiconductor element 20B and the electrode 40 and connects between the terminal on the upper surface of the semiconductor element 20B and the electrode 40. The spacers 30A, 30B are smaller than the semiconductor elements 20A, 20B in the plan view and are disposed to be positioned on the inside of the semiconductor elements 20A, 20B.

The electrode 40 is connected to the terminals on the upper surfaces of the semiconductor elements 20A, 20B respectively through the spacers 30A, 30B and functions as an electrode for driving the semiconductor elements 20A, 20B and as a heat radiating plate for radiating the heat that is produced by the semiconductor elements 20A, 20B.

The encapsulating resin 50 is a resin that seals the semiconductor elements 20A, 20B and the spacers 30A, 30B between the electrode 10 and the electrode 40. The semiconductor elements 20A, 20B and the spacers 30A, 30B are sealed by the encapsulating resin 50 between the electrode 10 and the electrode 40, and the encapsulating resin 50 adheres to the electrode 10 and the electrode 40.

In such a semiconductor device 1 in the comparative example, the semiconductor elements 20A, 20B are respectively an insulated gate bipolar transistor (IGBT) and a free wheel diode (FWD) that are included in an inverter.

For example, a collector of the IGBT and the electrode 10 are connected, and an emitter thereof is connected to the electrode 40 through the spacer 30A. In addition, for example, a cathode of the FWD is connected to the electrode 10, and an anode thereof is connected to the electrode 40 through the spacer 30B. In other words, the collector of the IGBT is connected to the cathode of the FWD through the electrode 10, and the emitter of the IGBT is connected to the anode of the FWD through the spacer 30A, the electrode 40, and the spacer 30B.

Here, the encapsulating resin 50 is configured of a thermosetting resin, is heated to, for example, approximately 80° C. to 200° C. to be cured, and is then cooled. At this time, the encapsulating resin 50 is contracted by heat. In addition, cure contraction that is associated with a progress in a chemical crosslinking reaction occurs, and a volume of the encapsulating resin 50 is reduced by a small percent. Just as described, the encapsulating resin 50 is contracted after thermal curing.

Meanwhile, because a distance between the electrode 10 and the electrode 40 is kept to be constant by the semiconductor elements 20A, 20B and the spacers 30A, 30B, surfaces of the encapsulating resin 50 bonded to the electrode 10 and the electrode 40 are applied with stress that possibly causes peeling.

When such stress is applied to the encapsulating resin 50, the electrodes 10 and 40 are slightly deflected in regions on the outside of the semiconductor element 20A and the semiconductor element 20B, and thus the stress is partially relaxed.

However, in a region between the semiconductor element 20A and the semiconductor element 20B, because degrees of deflection of the electrodes 10 and 40 are smaller than those in the regions on the outside of the semiconductor element 20A and the semiconductor element 20B, the stress that is applied to the encapsulating resin 50 is not relaxed.

Accordingly, within the region between the semiconductor element 20A and the semiconductor element 20B, the surface of the encapsulating resin 50 that is bonded to the electrode 10 and whose width in a horizontal direction is small may be peeled. As shown by an arrow A in FIG. 2A and FIG. 2B, the peeling occurs between the semiconductor element 20A and the semiconductor element 20B.

When the encapsulating resin 50 is peeled just as described, the stress is applied to surfaces of the electrode 10 and the semiconductor elements 20A, 20B bonded to each other and causes damage to electrical connections between the electrode 10 and the semiconductor elements 20A, 20B, and consequently operational failure of and damage to the semiconductor device 1 may occur.

In addition, even if the encapsulating resin 50 is not peeled in a stage to undergo the thermal curing, the peeling of the encapsulating resin 50 may progress by repetitive heating and cooling thereof due to the heat produced by the semiconductor elements 20A, 20B in a stage that the semiconductor device 1 is repeatedly used.

The peeling of the encapsulating resin 50 just as described tends to be remarkable when a distance between the semiconductor element 20A and the semiconductor element 20B is reduced by upsizing of the semiconductor elements 20A, 20B or downsizing of the semiconductor device 1.

Therefore, first to ninth embodiments, which will be described below, provide a semiconductor device in which the above problem is solved.

<First Embodiment>

Figure 3:
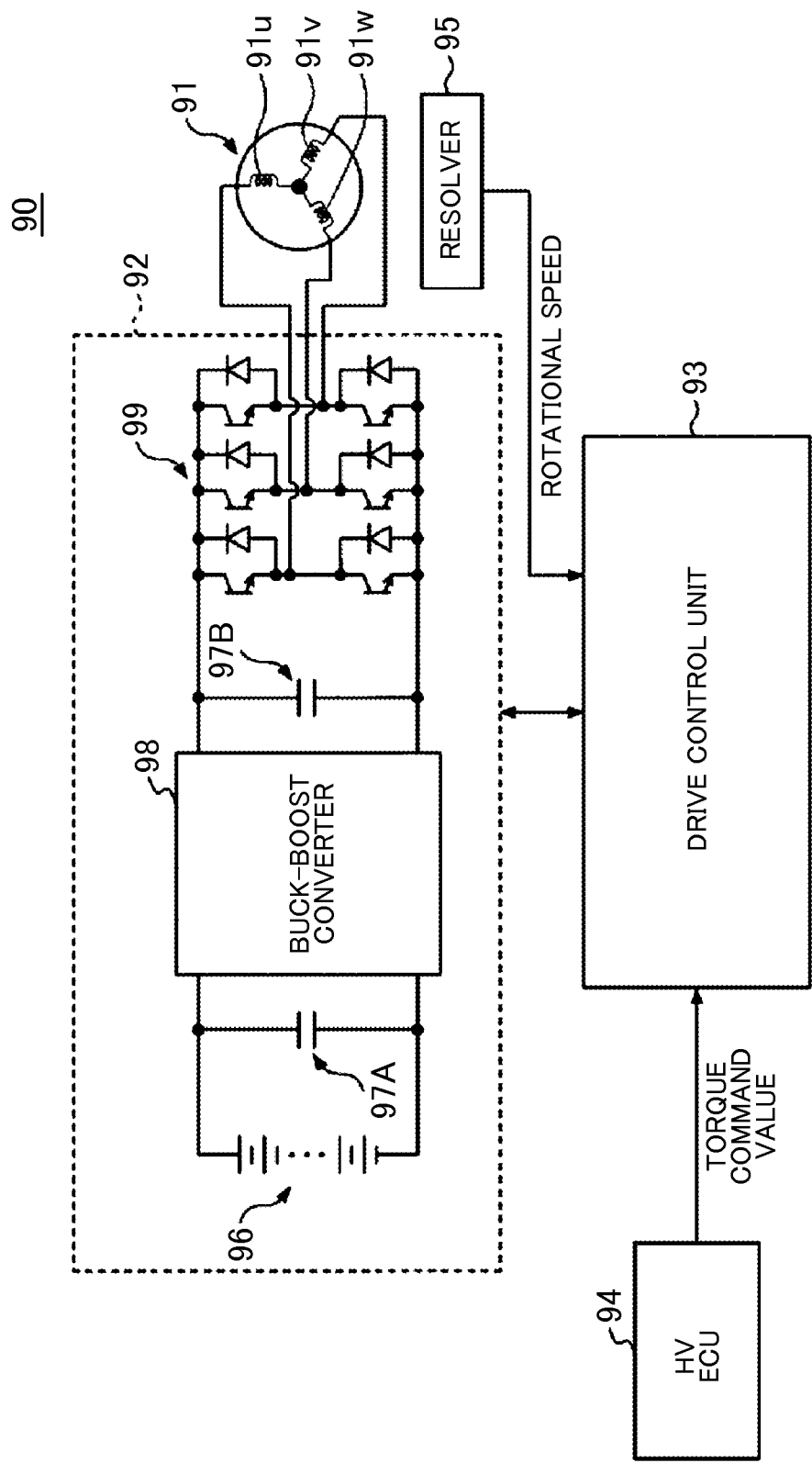
FIG. 3 is a view for showing a drive system that includes an electric motor driven by a power supply circuit including a semiconductor device in a first embodiment.

FIG. 3 is a view for showing a drive system that includes an electric motor driven by a power supply circuit including a semiconductor device according to a first embodiment.

A drive system 90 includes an electric motor 91, a power supply circuit 92, a drive control unit 93, a hybrid vehicle electronic control unit (HVECU) 94, and a resolver 95, and is used for a hybrid vehicle, for example.

The electric motor 91 is a motor generator (MG) installed in the vehicle and is also a three-phase synchronous rotary electric machine that functions as a motor when electric power is supplied from a battery 96 included in the power supply circuit 92 and functions as a generator during driving by an unillustrated engine or during braking of the vehicle.

As the electric motor 91, a mode for using the motor generator with both functions as the motor and as' the generator as a single unit is described herein; however, this is merely illustrative, and a single unit of the rotary electric machine that only has a function as the motor and another single unit of the rotary electric machine that only has a function as the generator may be used instead. Also, a plurality of the motor generators may be used.

When the plurality of the motor generators are used, any one of the electric motors 91 may be used as the generator for charging the battery 96 while another one of the electric motor 91 may be used as a drive motor for mainly generating power.

The power supply circuit 92 includes the battery 96, a smoothing capacitor 97A, a buck-boost converter 98, a smoothing capacitor 97B, and an inverter 99.

The battery 96 is a chargeable/dischargeable secondary battery. For example, a lithium ion battery pack or a nickel-hydrogen battery pack that has a terminal voltage of about 200V to about 300V, a capacitor, or the like can be used as the battery 96.

The smoothing capacitor 97A is disposed between the battery 96 and the buck-boost converter 98 and suppresses voltage fluctuation on the battery 96 side in the power supply circuit 92.

The buck-boost converter 98 includes a reactor and a plurality of switching elements, increases a voltage on the battery 96 side in the power supply circuit 92 to output it to the inverter 99 side, and lowers a voltage on the inverter 99 side to output it to the battery 96 side.

For example, the buck-boost converter 98 uses an energy storing function of the reactor to increase the voltage of about 200 V to about 300 V on the battery 96 side to a high voltage of about 600V, for example. In addition, when supplying the electric power from the inverter 99 side to the battery 96 side as charging power, the buck-boost converter 98 lowers the voltage on the inverter 99 side and outputs it to the battery 96 side.

The smoothing capacitor 97B is disposed between the buck-boost converter 98 and the inverter 99 and suppresses voltage fluctuation on the inverter 99 side in the power supply circuit 92.

The inverter 99 converts the direct-current electric power to the three-phase alternating-current driving electric power to supply it to the electric motor 91 and also converts the three-phase alternating-current regenerative electric power that is regenerated by the electric motor 91 to the direct-current electric power to supply it to the battery 96.

The inverter 99 includes two switching elements that are connected in series and, for each of the switching elements, further includes arms for three phases in which diodes are connected in parallel. An intermediate point of each of the arms is connected to a three-phase winding $91u$, $91v$, or $91w$. It should be noted that signals indicative of voltage values of the input voltage and the output voltage of the inverter 99 are input to the drive control unit 93.

The two switching elements and the two diodes that are included in each of the arms of the inverter 99 are the semiconductor elements included in the semiconductor device of the first embodiment. The switching elements are the IGBTs, for example, and the diodes are the FWDs, for example. The semiconductor device of the first embodiment as a power card that supplies and regenerates the electric power is used for each of the arms of the inverter 99.

The drive control unit 93 is a device that controls driving of the inverter 99 in the power supply circuit 92 so as to control driving of the electric motor 91.

The drive control unit 93 generates a voltage command in a sine wave control mode, an overmodulation control mode, or a rectangular wave control mode, for example, to control the driving of the electric motor 91 through the inverter 99. The drive control unit 93 is configured by an ECU, for example.

The HVECU 94 is connected to a throttle position sensor and outputs a torque command value that corresponds to a degree of depression of a throttle by a driver of the vehicle. The torque command value represents torque required for the electric motor 91. The torque command value output by the HVECU 94 is input to the drive control unit 93.

The resolver 95 is an example of a rotational speed detecting unit that detects a rotational speed of a rotary shaft of the electric motor 91. A signal indicative of the rotational speed of the electric motor 91 that is detected by the resolver 95 is input to the drive control unit 93.

Figure 4A:
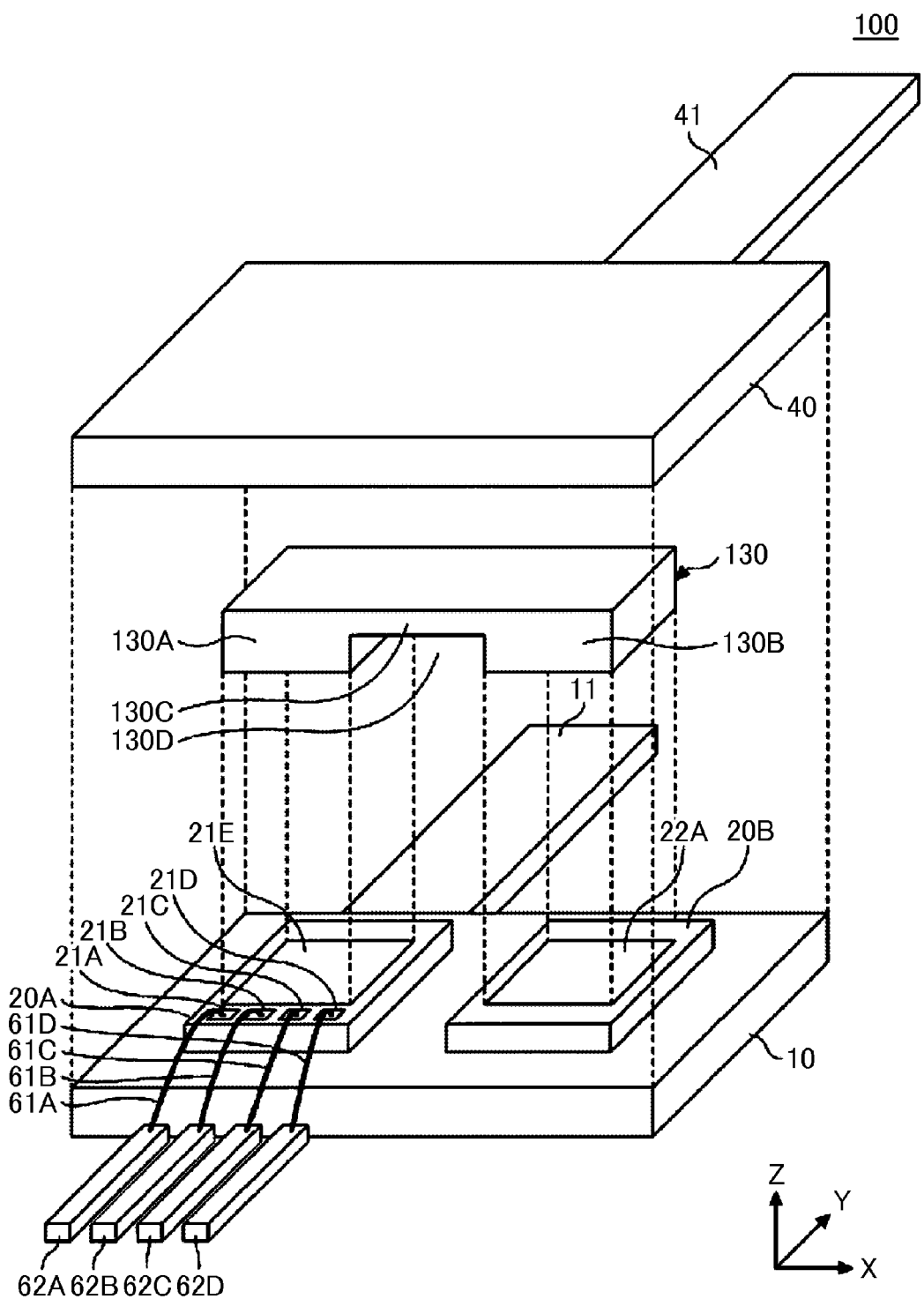
FIG. 4A is an exploded perspective view of the semiconductor device in the first embodiment.
Figure 4B:
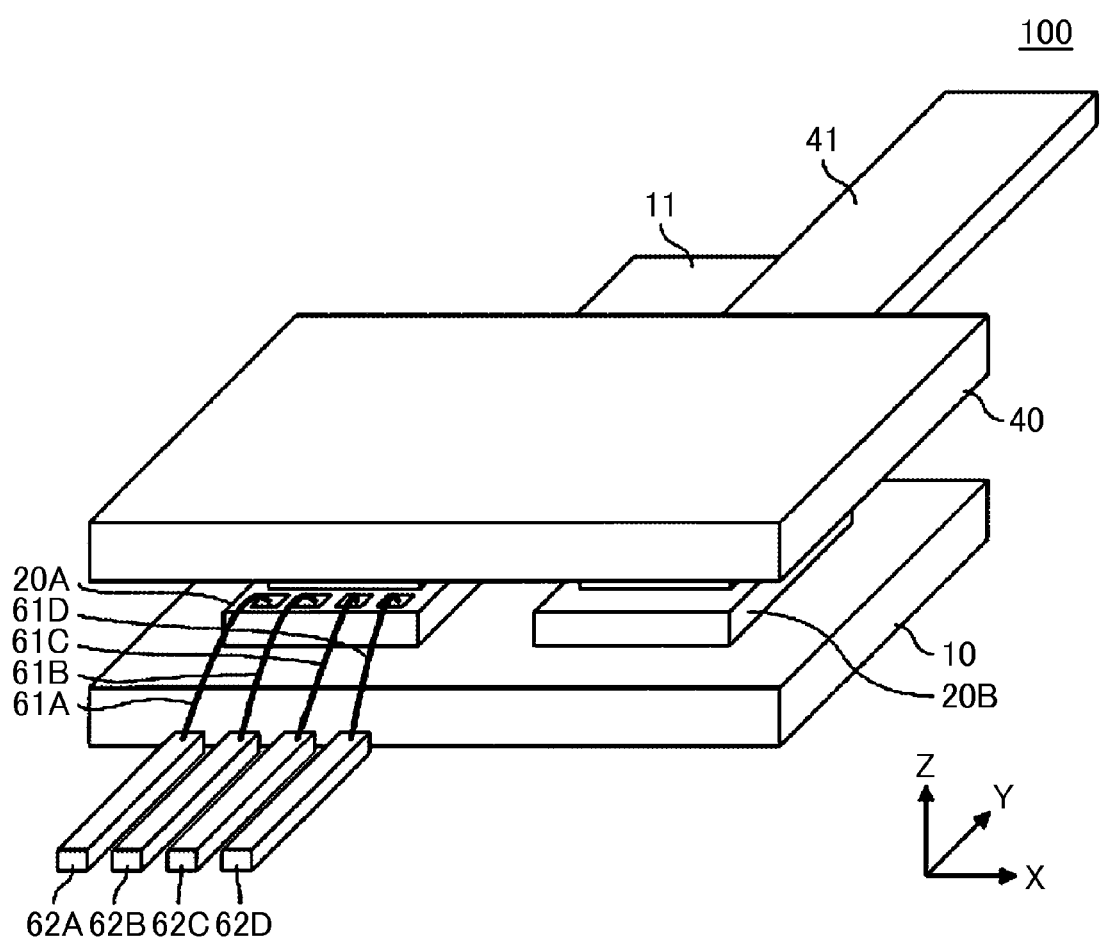
FIG. 4B is a perspective view for showing an internal structure of the semiconductor device in the first embodiment.
Figure 4C:
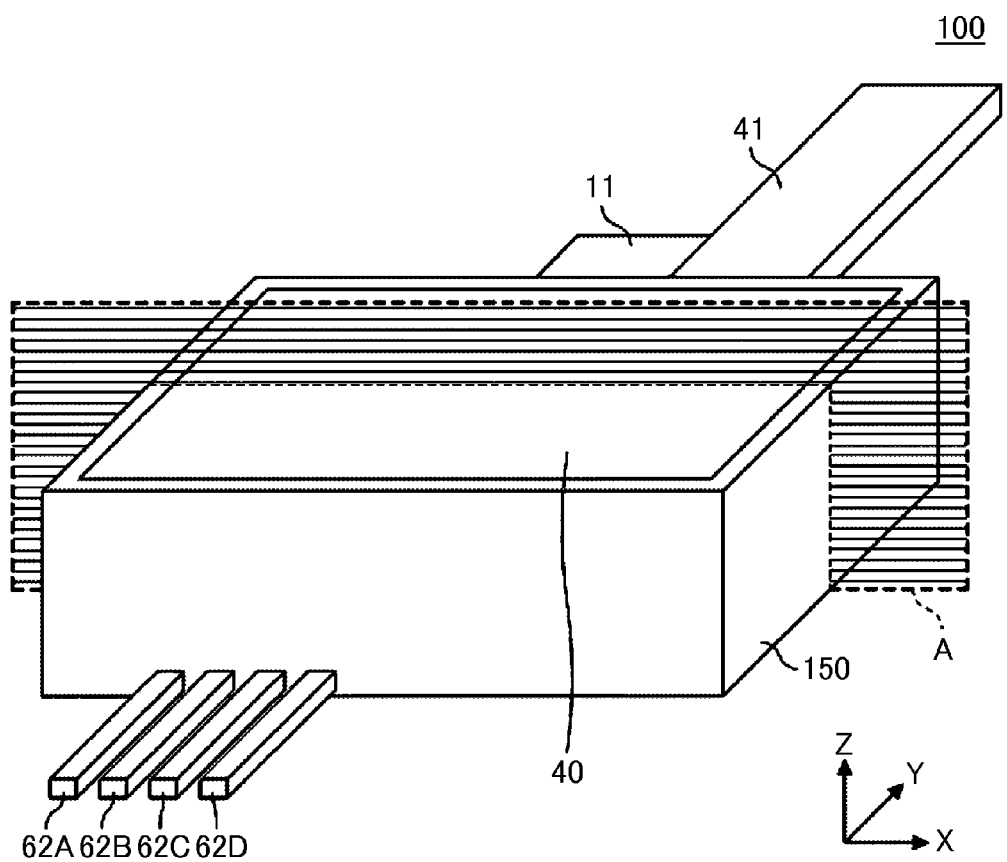
FIG. 4C is a perspective view for showing the semiconductor device in the first embodiment.
Figure 5:
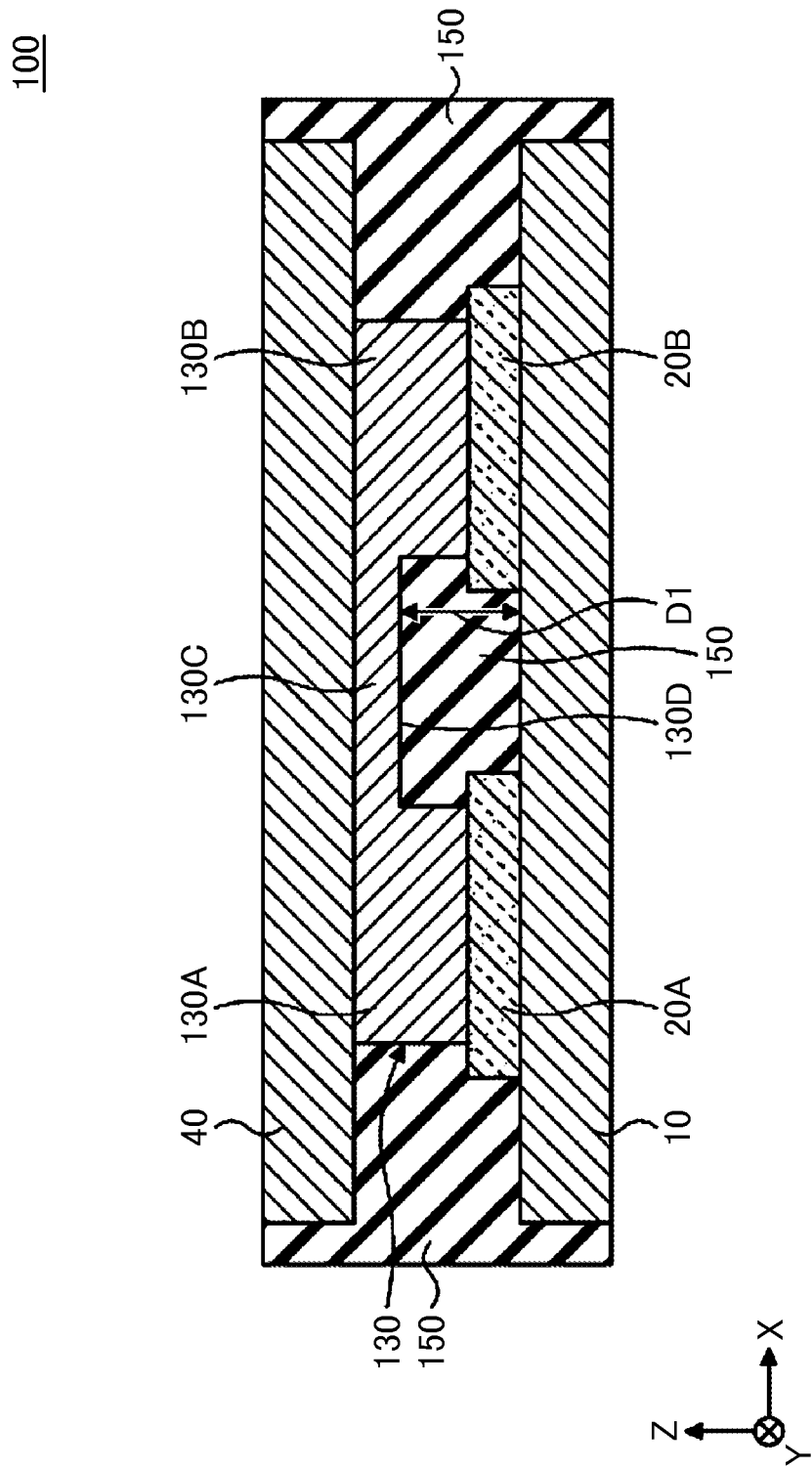
FIG. 5 is a cross-sectional view of the semiconductor device in the first embodiment.

FIG. 4A is an exploded perspective view of the semiconductor device in the first embodiment. FIG. 4B is a perspective view for showing an internal structure of the semiconductor device in the first embodiment. FIG. 4C is a perspective view for showing the semiconductor device in the first embodiment. FIG. 5 is a cross-sectional view of the semiconductor device in the first embodiment.

A semiconductor device 100 of the first embodiment includes the electrode 10, the semiconductor elements 20A, 20B, a spacer 130, the electrode 40, and an encapsulating resin 150. The components of the semiconductor device 100 in the first embodiment that are same or similar to the components of the semiconductor device 1 in the comparative example are denoted by the same reference numerals for the description.

For ease of understanding, the encapsulating resin 150 is not shown in FIG. 4A and FIG. 4B. A difference between FIG. 4B and FIG. 4C is whether the encapsulating resin 150 is present or not. In other words, when the electrode 10, the semiconductor elements 20A, 20B, the spacer 130, and the electrode 40 that are shown in FIG. 4B are sealed by the encapsulating resin 150, the semiconductor device 100 shown in FIG. 4C can be obtained. FIG. 5 shows a cross section that is taken along a plane A shown by the broken line in FIG. 4C and shows a cross section that can be obtained when the semiconductor device 100 is cut in a thickness direction along a center axis that is parallel to a longitudinal direction thereof.

Here, a description will be made on a mode in which the semiconductor element 20A is the IGBT and the semiconductor element 20B is the FWD. The semiconductor device 100 that includes the semiconductor elements 20A, 20B is included in the inverter 99 in FIG. 3.

The electrode 10 functions as an electrode for driving the semiconductor elements 20A, 20B and also functions as a heat radiating plate for radiating the heat produced by the semiconductor elements 20A, 20B. The electrode 10 is configured of copper or a copper alloy, for example. The electrode 10 is an example of the first metal plate.

The semiconductor elements 20A, 20B are connected to an upper surface of the electrode 10. A collector of the IGBT is present on a lower surface of the semiconductor element 20A. The collector of the semiconductor element 20A is connected to the upper surface of the electrode 10 by soldering, for example. In addition, a cathode of the FWD is present on a lower surface of the semiconductor element 20B. The cathode of the semiconductor element 20B is connected to the upper surface of the electrode 10 by soldering, for example.

Furthermore, as shown in FIG. 4A a bus bar 11 is connected to the electrode 10. The electrode 10 is connected to the electric motor 91, the smoothing capacitor 97B, or the like (see FIG. 3) through the bus bar 11.

Terminals 21A, 21B, 21C, 21D on an upper surface of the semiconductor element 20A are respectively connected to control terminals 62A, 62B, 62C, 62D by bonding wires 61A, 61B, 61C, 61D.

The control terminals 62A to 62D are fixed by an unillustrated lead frame, and as shown in FIG. 4C, the lead frame is removed after sealing by the encapsulating resin 150. The control terminals 62A to 62D are insulated from the electrode 10. At least one of the control terminals 62A to 62D is connected to a gate of the IGBT. The control terminals 62A to 62D are used for input of a control signal for drive control of the semiconductor element 20A and the like.

It should be noted that the bonding wires 61A to 61D are configured of an aluminum alloy or high purity aluminum, for example. The control terminals 62A to 62D are configured of copper or the copper alloy, for example.

In addition to the terminals 21A to 21D, an emitter 21E of the IGBT is present on the upper surface of the semiconductor element 20A. The emitter 21E is connected to a first section 130A of the spacer 130. The emitter 21E and the first section 130A are connected by soldering, for example.

An anode 22A of the FWD is present on an upper surface of the semiconductor element 20B. The anode 22A is connected to a second section 130B of the spacer 130. The anode 22A and the second section 130B are connected by soldering, for example.

The emitter 21E of the semiconductor element 20A and the anode 22A of the semiconductor element 20B are connected to each other by the spacer 130 and are also connected to the electrode 40 through the spacer 130.

As shown in FIG. 4A and FIG. 5, the spacer 130 has the first section 130A, the second section 130B, and a connecting section 130C. It should be noted that the spacer 130 is not shown in FIG. 4B as being hidden by the electrode 40. In FIG. 5, the spacer 130 is covered by the encapsulating resin 150.

The connecting section 130C connects between the first section 130A and the second section 130B. The connecting section 130C is thinner than the first section 130A and the second section 130B, and an upper surface of the connecting section 130C constitutes the same surface as upper surfaces of the first section 130A and the second section 130B. Accordingly, the spacer 130 has a recessed section 130D on a bottom surface side of the connecting section 130C between the first section 130A and the second section 130B.

The first section 130A is disposed between the semiconductor element 20A and the electrode 40 and connects the emitter 21E on the upper surface of the semiconductor element 20A to the electrode 40. The second section 130B is disposed between the semiconductor element 20B and the electrode 40 and connects the anode 22A on the upper surface of the semiconductor element 20B to the electrode 40. Like the electrode 40, the spacer 130 is configured of copper or the copper alloy, for example.

It should be noted that the first section 130A and the second section 130B are respectively smaller than the semiconductor elements 20A, 20B in a plan view.

The electrode 40 is connected to the emitter 21E on the upper surface of the semiconductor element 20A and the anode 22A on the upper surface of the semiconductor element 20B through the spacer 130, and functions as an electrode for driving the semiconductor elements 20A, 20B and as a heat radiating plate for radiating the heat produced by the semiconductor elements 20A, 20B.

The electrode 40 is configured of copper or the copper alloy, for example. A bus bar 41 is connected to the electrode 40. The electrode 40 is connected to the electric motor 91 or the smoothing capacitor 97B through the bus bar 41. The electrode 40 is an example of the second metal plate.

As shown in FIG. 4C and FIG. 5, the encapsulating resin 150 is a resin for sealing the semiconductor elements 20A, 20B and the spacer 130B between the electrode 10 and the electrode 40. The encapsulating resin 150 also covers side surfaces of the electrodes 10, 40. The encapsulating resin 150 is configured of a thermosetting resin. The encapsulating resin 150 is configured of an epoxy resin, for example, in which a glass fiber or the like may be mixed. The encapsulating resin 150 is heated to approximately 80° C. to 200° C. to be cured and is then cooled.

The semiconductor elements 20A, 20B and the spacer 130 are sealed by the encapsulating resin 150 between the electrode 10 and the electrode 40, and the encapsulating resin 150 adheres to the electrode 10 and the electrode 40.

In FIG. 4C, an upper surface of the electrode 40 is exposed from the encapsulating resin 150, and the bus bar 41 and the control terminals 62A to 62D are extended therefrom for convenience of the description; however, a lower surface of the electrode 10 is also exposed from the encapsulating resin 150, and the bus bar 11 is also extended therefrom.

Figure 6:
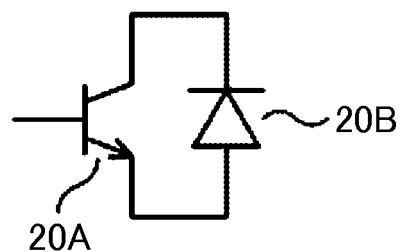
FIG. 6 is a view for showing an equivalent circuit of a semiconductor device 100 in the first embodiment.

FIG. 6 is a view for showing an equivalent circuit of the semiconductor device 100 in the first embodiment. The collector of the semiconductor element 20A that is configured by the IGBT is connected to the cathode of the semiconductor element 20B that is configured by the FWD through the electrode 10 (see FIG. 5), and the emitter of the semiconductor element 20A that is configured by the IGBT is connected to the anode of the semiconductor element 20B that is configured by the FWD through the spacer 130 (see FIG. 5).

The gate of the semiconductor element 20A that is configured by the IGBT is connected to the drive control unit 93 (see FIG. 3) through at least one pair of the bonding wires 61A to 61D and the control terminals 62A to 62D.

The semiconductor element 20A of the semiconductor device 100 is turned on/off by a control signal that is input from the drive control unit 93 to the gate. The electric current flows into the semiconductor element 20B when the semiconductor element 20A is turned off.

Next, a description will be made on a method of manufacturing the semiconductor device 100 in the first embodiment.

FIG. 7 to FIG. 11 show a manufacturing process of the semiconductor device 100 in the first embodiment.

First, the electrode 10, solder foils 71A, 71B, the semiconductor elements 20A, 20B, solder foils 72A, 72B, the spacer 130, solder foils 73A, 73B, and the control terminals 62A to 62D are aligned. A well-known jig can be used for alignment. It should be noted that the bus bar 11 is connected to the electrode 10.

The solder foils 71A, 71B, 72A, 72B, 73A, 73B are solder sheets that are formed by rolling a material such as AnAg solder containing tin and silver, SnCu solder containing tin and copper, or the like, for example.

The solder foil 71A is disposed between the electrode 10 and the semiconductor element 20A. The solder foil 71B is disposed between the electrode 10 and the semiconductor element 20B. The solder foil 72A is disposed between the semiconductor element 20A and the first section 130A of the spacer 130. The solder foil 72B is disposed between the semiconductor element 20B and the second section 130B of the spacer 130.

The solder foil 73A is disposed on the first section 130A of the spacer 130. The solder foil 73B is disposed on the second section 130B of the spacer 130.

It should be noted that surfaces of the electrodes 10, 40 and the spacer 130 may be applied with nickel plating or the like. In addition, portions of the surfaces of the electrodes 10, 40 and the spacer 130 that contact the solder foils 71A, 71B, 72A, 72B, 73A, 73B may be applied with gold plating to improve wettability.

Figure 7:
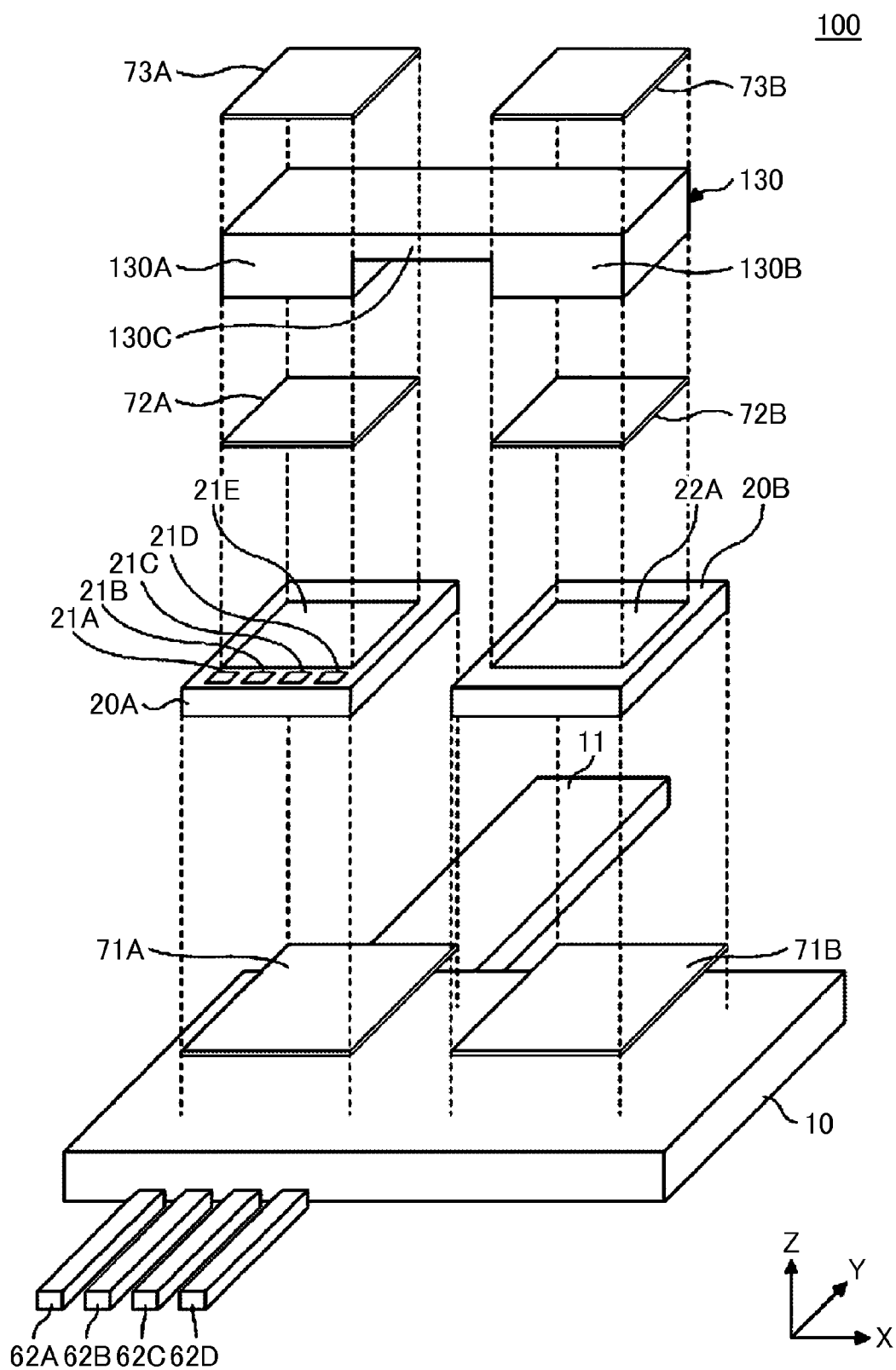
FIG. 7 is a view for showing a manufacturing process of the semiconductor device 100 in the first embodiment.

The solder foils 71A, 71B, 72A, 72B, 73A, 73B are melted in the state of alignment as shown in FIG. 7 to connect the electrode 10, the semiconductor elements 20A, 20B, and the spacer 130.

Figure 8:
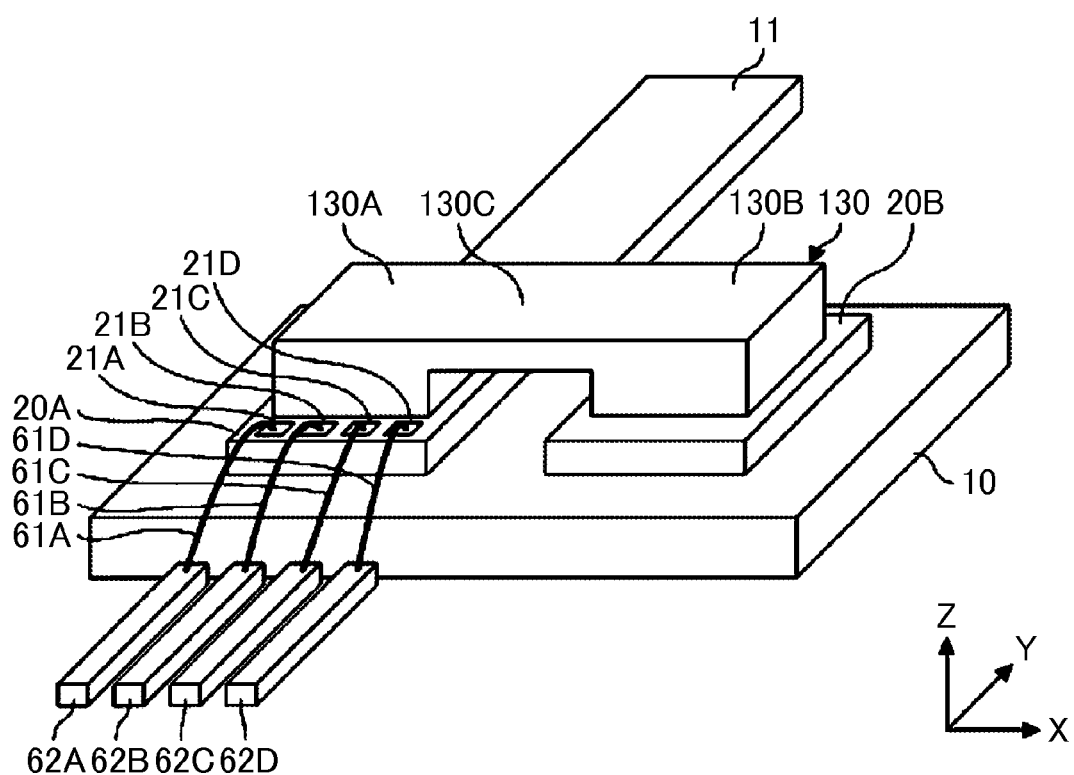
FIG. 8 is a view for showing the manufacturing process of the semiconductor device 100 in the first embodiment.

Next, as shown in FIG. 8, the terminals 21A to 21D of the semiconductor element 20A and the control terminals 62A to 62D are respectively connected by the bonding wires 61A to 61D. It should be noted that the solder foils 73A, 73B are not shown in FIG. 8 because the solder foils 73A, 73B are melted, in the process shown in FIG. 7 and adhered to an upper surface of the spacer 130.

In addition, because the solder foils 71A, 71B, 72A, 72B are respectively adhered between the electrode 10 and the semiconductor elements 20A, 20B and between the semiconductor elements 20A, 20B and the spacer 130, they are not shown in FIG. 8.

Figure 9:
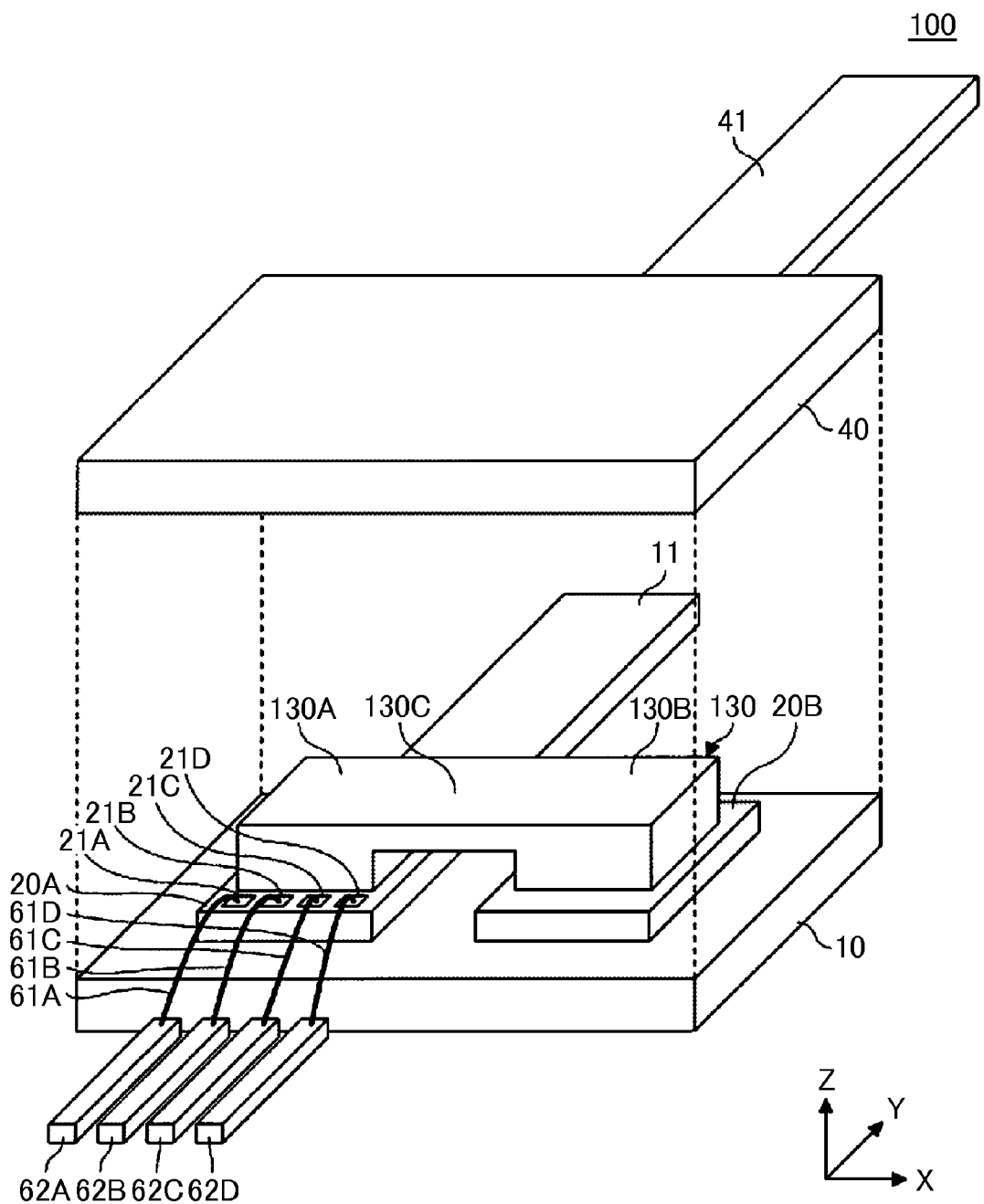
FIG. 9 is a view for showing the manufacturing process of the semiconductor device 100 in the first embodiment.

Next, as shown in FIG. 9, the electrode 40 is aligned, the solder adhered to the upper surface of the spacer 130 (the solder adhered by melting of the solder foils 73A, 73B) is melted, and the electrode 40 is bonded to the upper surface of the spacer 130. The bus bar 41 is connected to the electrode 40.

Figure 10:
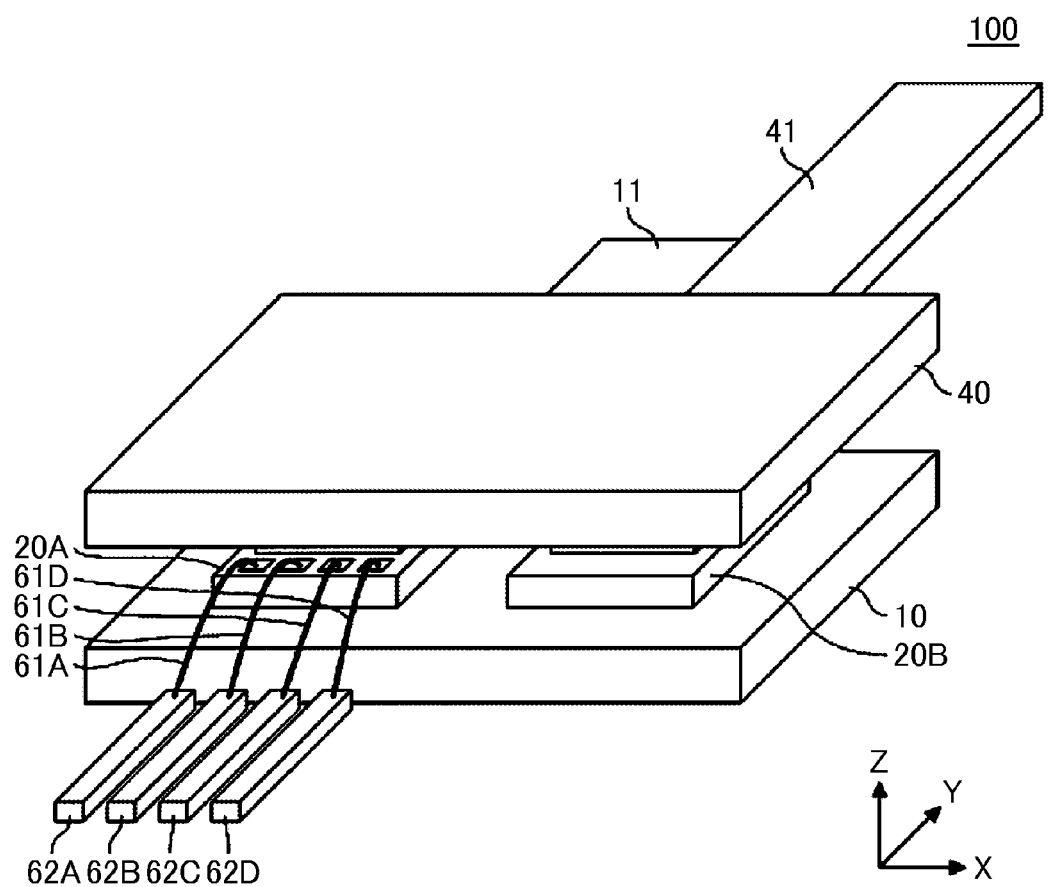
FIG. 10 is a view for showing the manufacturing process of the semiconductor device 100 in the first embodiment.

Accordingly, the electrode 10, the semiconductor elements 20A, 20B, the spacer 130, and the electrode 40 are bonded to complete a state shown in FIG. 10. The electrode 10, the semiconductor elements 20A, 20B, the spacer 130, and the electrode 40 that are bonded as shown in FIG. 10 are impregnated with a solution in which polyamide, polyimide, or the like is dissolved in an organic solvent so as to coat the surfaces thereof with a film of polyamide, polyimide, or the like before being sealed' by the encapsulating resin 150. This is performed to facilitate adherence of the encapsulating resin 150 to the surfaces of the electrode 10, the semiconductor elements 20A, 20B, the spacer 130, and the electrode 40.

In the last, the electrode 10, the semiconductor elements 20A, 20B, the spacer 130, the electrode 40, the bus bars 11, 41, and the control terminals 62A to 62D are sealed by the encapsulating resin 150. Sealing by the encapsulating resin 150 is achieved by performing a thermal curing treatment of the encapsulating resin 150.

In the thermal curing treatment, the semiconductor elements 20A, 20B, the spacer 130, the electrode 40, the bus bars 11, 41, and the control terminals 62A to 62D shown in FIG. 10 are placed in a heated mold, the thermosetting resin is poured into the mold while being heated, and the thermosetting resin in the mold is applied with a supplementary pressure while heated to accelerate a cured reaction of the thermosetting resin.

Figure 11:
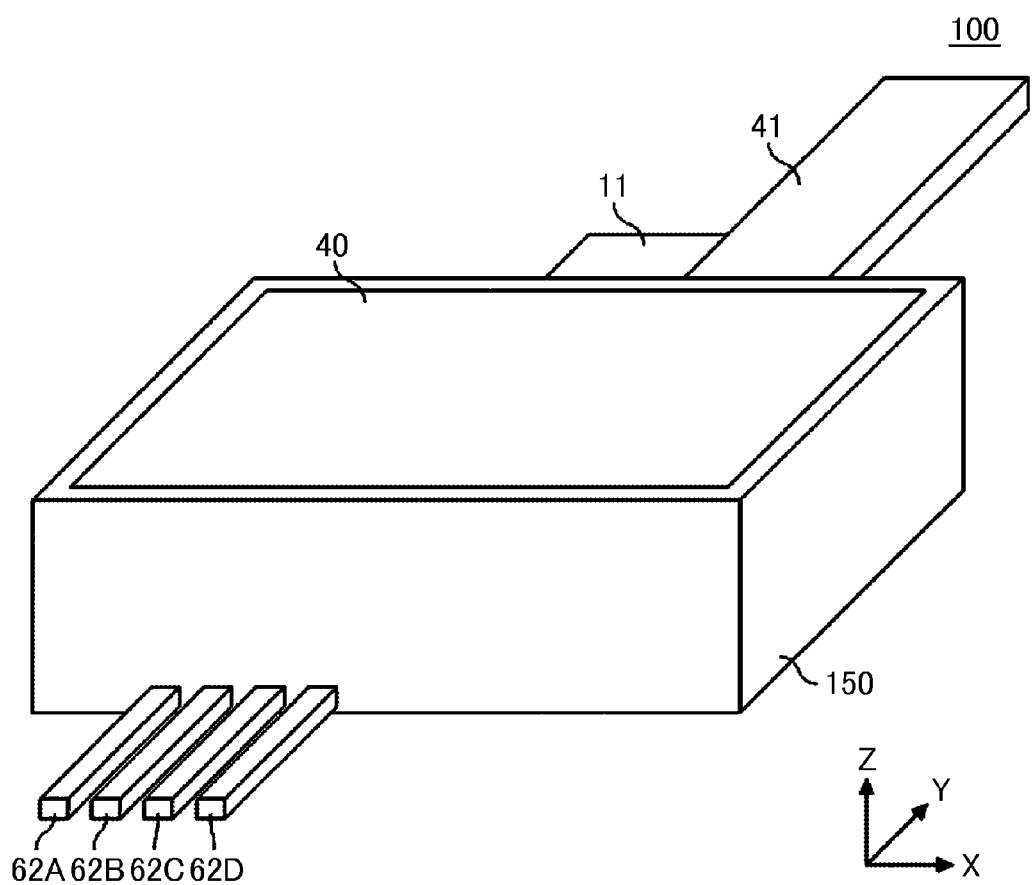
FIG. 11 is a view for showing the manufacturing process of the semiconductor device 100 in the first embodiment.

The thermosetting resin is heated at a temperature of approximately 80° C. to 200° C., for example, and is then cooled to obtain the encapsulating resin 150 shown in FIG. 11. The encapsulating resin 150 seals the side surfaces of the electrode 10, the semiconductor elements 20A, 20B, the spacer 130, and the side surfaces of the electrode 40. In addition, portions on the outer side of the lower surface of the electrode 10, the upper surface of the electrode 40, the bus bars 11, 41, and the control terminals 62A to 62D are exposed from the encapsulating resin 150.

In the semiconductor device 100 of the first embodiment described above, as shown in FIG. 5, a thickness D1 of the encapsulating resin 150 in the region between the semiconductor element 20A and the semiconductor element 20B is smaller than a thickness of the encapsulating resin 50 in the semiconductor device 1 (see FIG. 1) of the comparative example due to the connecting section 130C of the spacer 130.

In other words, in the semiconductor device 100 of the first embodiment, the thickness D1 of the encapsulating resin 150 between the semiconductor element 20A and the semiconductor element 20B is smaller than a thickness of the encapsulating resin 150 in a location other than that between the semiconductor element 20A and the semiconductor element 20B due to the connecting section 130C of the spacer 130 in the region between the semiconductor element 20A and the semiconductor element 20B.

Accordingly, a contraction amount of the encapsulating resin 150 in the region between the semiconductor element 20A and the semiconductor element 20B is reduced, and thus the stress applied to the encapsulating resin 150 is lowered. In other words, the stress that is generated by the contraction of the encapsulating resin 150 in the region between the semiconductor element 20A and the semiconductor element 20B is relaxed to a greater extent than stress generated by the contraction of the encapsulating resin 150 in a location other than that between the semiconductor element 20A and the semiconductor element 20B.

Thus, it is possible in the region between the semiconductor element 20A and the semiconductor element 20B to suppress peeling of the encapsulating resin 150 from the electrode 10. In addition, because the peeling of the encapsulating resin 150 is suppressed, favorable connection states between the electrode 10 and the semiconductor elements 20A, 20B can be maintained.

As a result, according to the first embodiment, it is possible by suppressing the peeling of the encapsulating resin 150 to provide the semiconductor device 100 in which fatigue fractures between the semiconductor elements 20A, 20B and the electrode 10 are suppressed.

Here, it should be noted that the region between the semiconductor element 20A and the semiconductor element 20B means a region located between the semiconductor element 20A and the semiconductor element 20B in the plan view. In addition, a location (region) other than that between the semiconductor element 20A and the semiconductor element 20B means a location (region) other than that between the semiconductor element 20A and the semiconductor element 20B in the plan view.

Furthermore, according to the first embodiment, it is possible to provide the semiconductor device 100 in which the peeling of the encapsulating resin 150 can be suppressed not only in a stage of the thermal curing of the encapsulating resin 150 but also in a stage of repetitive use of the semiconductor device 100 where heating and cooling thereof is repeated by the heat generation of the semiconductor element 20A and the semiconductor element 20B.

Moreover, according to the semiconductor device 100 of the first embodiment, the spacer 130 is larger than the spacers 30A, 30B of the semiconductor device 1 in the comparative example by the connecting section 130C. Therefore, a thermal capacity of the spacer 130 is increased, the heat produced by the semiconductor elements 20A, 20B is transiently absorbed, and thus cooling performance of the semiconductor elements 20A, 20B can be improved.

In particular, in a case where the semiconductor device 100 is installed in a hybrid vehicle, the inverter 99 is exposed to a high temperature every time the electric motor 91 is driven or regenerated. In such a circumstance, it is extremely beneficial to use the semiconductor device 100 of the first embodiment whose cooling performance has been improved.

In the semiconductor device 100 of the first embodiment, because the spacer 130 has the connecting section 130C, a connection path between the semiconductor element 20A and the semiconductor element 20B is shorter than that in the semiconductor device 1 of the comparative example.

Accordingly, a resistance value of a resistance component and parasitic inductance between the semiconductor element 20A and the semiconductor element 20B are reduced, and thus a heating value and a surge voltage that is generated along with the switching operation are reduced.

In an area between the spacer 130 and the electrode 40, the solder foils 73A, 73B (see FIG. 7) respectively connect between the first section 130A and the electrode 40 and between the second section 130B and the electrode 40. In other words, because the connecting section 130C of the spacer 130 and the electrode 40 are not connected by soldering, the connecting section 130C can be defaulted in a direction toward the electrode 10.

Accordingly, even if the stress is generated by the contraction of the encapsulating resin 150 between the semiconductor element 20A and the semiconductor element 20B, the stress applied to the encapsulating resin 150 can be absorbed due to the deflection of the connecting section 130C.

It should be noted that because the spacer 130 and the electrode 40 are bonded by the solder foils 73A, 73B, the connecting section 130C and the electrode 40 are adhered to each other, and thus the encapsulating resin 150 does not enter between the spacer 130 and the electrode 40.

A thickness of the connecting section 130C of the spacer 130 may be set according to a distance between the semiconductor element, 20A and the semiconductor element 20B or a type of the thermosetting resin that forms the encapsulating resin 150 such that the peeling of the encapsulating resin 150 located between the connecting section 130C and the electrode 10 does not occur.

A description has been made so far on the mode in which the first section 130A of the spacer 130 and the second section 130B are respectively bonded to the electrode 40 by the solder foils 73A, 73B; however, the entire upper surface of the spacer 130 may be bonded to the electrode 40 by the solder foil. In other words, the first section 130A of the spacer 130, the second section 130B, and the upper surface of the connecting section 130C altogether may be bonded to the electrode 40 by the solder foil.

Also in this case, the thickness of the encapsulating resin 150 between the connecting section 130C and the electrode 10 is smaller than that of the encapsulating resin 50 (see FIG. 1) in the region between the semiconductor element 20A and the semiconductor element 20B of the semiconductor device 1 in the comparative example (see FIG. 1); therefore, it is possible to suppress the peeling of the encapsulating resin 150 from the electrode 10 in the region between the semiconductor element 20A and the semiconductor element 20B. In addition, because the peeling of the encapsulating resin 150 is suppressed, the favorable connection states between the electrode 10 and the semiconductor elements 20A, 20B can be maintained.

As a result, according to the first embodiment, it is possible to provide the semiconductor device 100 in which the fatigue fractures between the semiconductor elements 20A, 20B and the electrode 10 are suppressed by suppressing the peeling of the encapsulating resin 150.

A description has been made so far on the mode in which the semiconductor device 100 includes the two semiconductor elements 20A, 20B and in which the thickness of the encapsulating resin 150 is reduced in the region between the semiconductor element 20A and the semiconductor element 20B.

However, the semiconductor device 100 may include the three or more semiconductor elements. In such a case, the thickness of the encapsulating resin 150 may be reduced by positioning the connecting section 130C of the spacer 130 in a region between two each of the semiconductor elements. Accordingly, it is possible to suppress the peeling of the encapsulating resin 150 from the electrode 10 between the semiconductor elements.

A description has been made so far on the mode in which the electrode 10 as an example of the first metal plate and the electrode 40 as an example of the second metal plate are located on inside of the encapsulating resin 150 in an X-axis direction and a Y-axis direction; however, the electrode 10 and/or the electrode 40 may be projected from the encapsulating resin in the X-axis direction and/or the Y-axis direction. In this case, a portion of the electrode 10 and/or the electrode 40 that is projected from the encapsulating resin 150 may be used as a lead, for example.

<Second Embodiment>

Figure 12B:
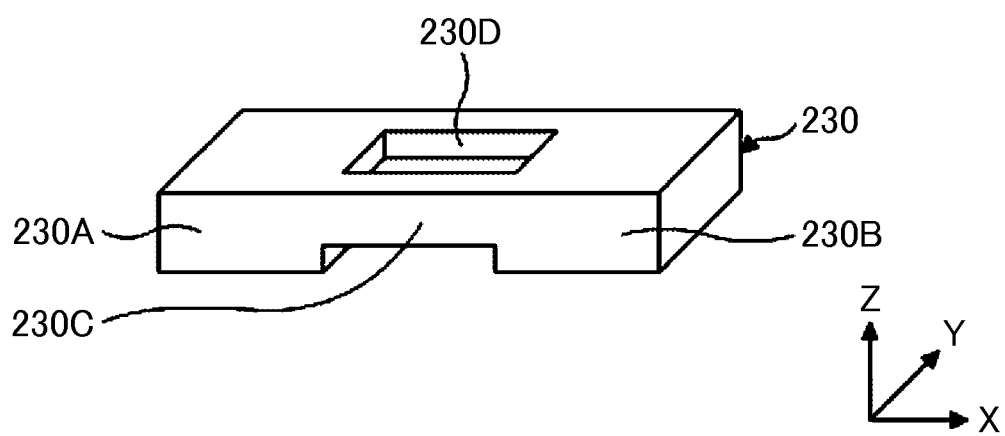
FIG. 12B is a perspective view for showing a spacer of the semiconductor device in the second embodiment.

FIG. 12A is a cross-sectional view of the semiconductor device according to a second embodiment, and FIG. 12B is a perspective view for showing the spacer of the semiconductor device in the second embodiment. A semiconductor device 200 in the second embodiment differs from the semiconductor device 100 in the first embodiment in terms of a structure of a spacer 230.

Because the other structure of the semiconductor device 200 in the second embodiment is the same as that of the semiconductor device 100 in the first embodiment, the same or similar components thereof are denoted by the same reference numerals, and the description thereof is not repeated.

The spacer 230 is the same as the spacer 130 of the first embodiment except that a recessed section 230D is included, and has same dimensions.

The cross section shown in FIG. 12A corresponds to the cross section shown in FIG. 5, and represents a cross section that can be obtained when the semiconductor device 200 is cut in a thickness direction along a center axis that is parallel to a longitudinal direction thereof.

The semiconductor device 200 of the second embodiment includes the electrode 10, the semiconductor elements 20A, 20B, the spacer 230, the electrode 40, and the encapsulating resin 150.

The spacer 230 has a first section 230A, a second section 230B, and a connecting section 230C. The first section 230A and the second section 230B are the same as the first section 130A of the spacer 130 and the second section 130B of the first embodiment.

The recessed section 230D is formed at the center on an upper surface side of the connecting section 230C. The recessed section 230D is located between the semiconductor element 20A and the semiconductor element 20B in the plan view.

The electrode 40 is bonded to an upper surface of the spacer 230 by the unillustrated solder foil. In the bonding between the spacer 230 and the electrode 40, like the spacer 130 of the first embodiment, only upper surfaces of the first section 230A and the second section 230B are bonded to the electrode 40 by the solder foils. As shown in FIG. 7, this is similar to the first section 130A and the second section 130B in the first embodiment that are bonded to the electrode 40 by the solder foils 73A, 73B.

Accordingly, in a case where the stress is applied to the encapsulating resin 150 between the connecting section 230C and the electrode 10, the connecting section 230C is more likely to be deflected than the connecting section 130C of the spacer 130 in the first embodiment because it has become thin due to the formation of the recessed section 230D.

Therefore, even when the stress is applied to the encapsulating resin 150 between the semiconductor element 20A and the semiconductor element 20B due to the contraction of the encapsulating resin 150, the connecting section 230C is deflected to relax the stress, and thus it is possible to suppress the peeling of the encapsulating resin 50 from the electrode 10 between the semiconductor element 20A and the semiconductor element 20B.

It should be noted that, because the recessed section 230D defines a space surrounded by the spacer 230 and the electrode 40 after the bonding of the spacer 230 to the electrode 40 by the solder foils, the encapsulating resin 150 does not enter.

As it has been described so far, according to the second embodiment, the connecting section 230C can more likely to be deflected than the connecting section 130C of the spacer 130 in the first embodiment by providing the recessed section 230D on the upper surface side of the connecting section 230C of the spacer 230.

Therefore, the stress that is generated by the contraction of the encapsulating resin 150 in the region between the semiconductor element 20A and the semiconductor element 20B is relaxed to the greater extent than the stress that is generated by the contraction of the encapsulating resin 150 in a location other than that between the semiconductor element 20A and the semiconductor element 20B.

As a result, it is possible to suppress the peeling of the encapsulating resin 150 from the electrode 10 between the semiconductor element 20A and the semiconductor element 20B.

<Third Embodiment>

Figure 13A:
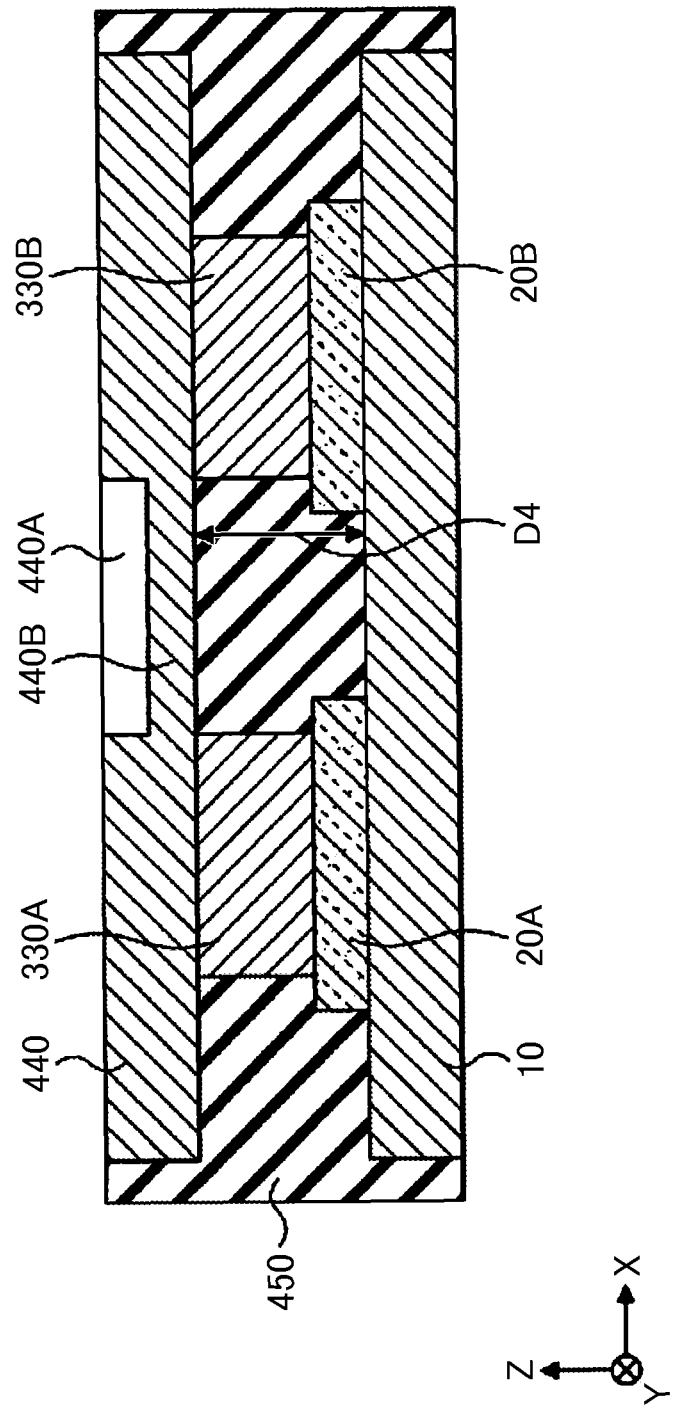
FIG. 13A is a cross-sectional view of the semiconductor device according to a third embodiment.
Figure 13B:
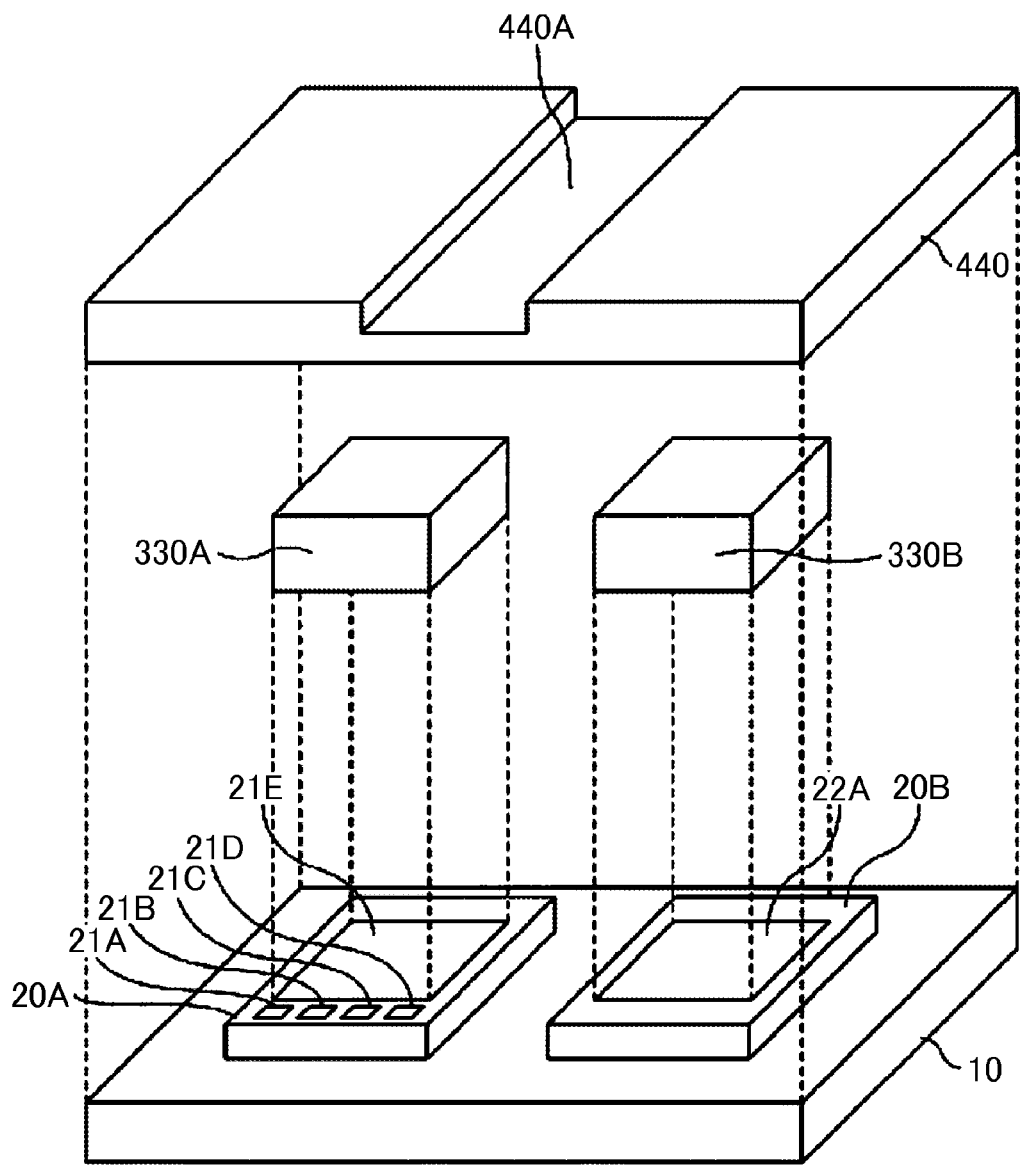
FIG. 13B is an exploded perspective view of an electrode in the third embodiment.

FIG. 13A is a cross-sectional view of the semiconductor device according to a third embodiment, and FIG. 13B is an exploded perspective view of the electrode in the third embodiment. It should be noted that an encapsulating resin 450 and the solder foil are not shown in FIG. 13B. In addition, the control terminals 62A to 62D and the bus bars 11, 41 (see FIG. 4A) are not shown in FIG. 13B.

In the semiconductor device 400 of the third embodiment, structures of the spacers 330A, 330B and an electrode 440 differ from the structures of the spacer 130 and the electrode 40 in the semiconductor device 100 of the first embodiment. In association with the above, a structure of the encapsulating resin 450 differs from the structure of the encapsulating resin 150 in the semiconductor device 100 of the first embodiment. Because the other structure is the same as the structure of the semiconductor device 100 in the first embodiment, the same or similar components are denoted by the same reference numerals, and the description thereof is not repeated.

Here, an XYZ coordinate system shown in FIG. 13B will be defined. An X-axis is parallel to longitudinal directions of the semiconductor device 400, the electrode 10, and the electrode 440, a Y-axis is parallel to short-side directions of the semiconductor device 400, the electrode 10, and the electrode 440, and a Z-axis is parallel to thickness directions of the semiconductor device 400, the electrode 10, and the electrode 440.

FIG. 13B is the perspective exploded view that corresponds to FIG. 4A in the first embodiment. The cross-sectional view shown in FIG. 13A is a view for showing a cross section that can be obtained when the semiconductor device 400 of the third embodiment is cut in a thickness direction by a plane along a center axis in the longitudinal direction (X-axis direction) thereof.

The semiconductor device 400 of the third embodiment includes the electrode 10, the semiconductor elements 20A, 20B, the spacers 330A, 330B, the electrode 440, and the encapsulating resin 450.

The spacers 330A, 330B correspond to the spacer 130 of the first embodiment from which the connecting section 130C is removed, and respectively correspond to the first section 130A and the second section 130B. In other words, the spacers 330A, 330B of the semiconductor device 400 in the third embodiment are separated from each other.

Like the first section 130A in the first embodiment, the spacer 330A is bonded to the upper surface of the semiconductor element 20A by the solder foil. Like the second section 130B in the first embodiment, the spacer 330B is bonded to the upper surface of the semiconductor element 20B by the solder foil. In addition, upper surfaces of the spacers 330A, 330B are bonded to the electrode 440 by the unillustrated solder foils.

The spacer 330A is an example of the first section, and the spacer 330B is an example of the second section.

The electrode 440 has a recessed section 440A in a portion located between the semiconductor element 20A and the semiconductor element 20B in the plan view. The recessed section 440A is formed from one end to the other end of the electrode 440 in the short-side direction (Y-axis direction). A thin section 440B of the electrode 440 is a portion that is thinned by the recessed section 440A.

The encapsulating resin 450 is the same as the encapsulating resin 150 in the first embodiment except that it is formed between the electrode 10 and the electrode 440 in a region between the spacer 330A and the spacer 330B.

In the semiconductor device 400 of the third embodiment, a thickness D4 of the encapsulating resin 450 in the region between the semiconductor element 20A and the semiconductor element 20B is the same as the thickness of the encapsulating resin 50 in the region between the semiconductor element 20A and the semiconductor element 20B in the semiconductor device 1 of the comparative example.

However, the electrode 440 has the thin section 440B that is located on the inside of the region between the semiconductor element 20A and the semiconductor element 20B in the plan view. A depth of the thin section 440B is half the thickness of a portion other than the thin section 440B in the electrode 440, for example. Accordingly, the electrode 440 is likely to be deflected in the thin section 440B.

Thus, in a case where the stress is generated between the electrode 10 and the encapsulating resin 450 or between the electrode 440 and the encapsulating resin 450 in the region between the semiconductor element 20A and the semiconductor element 20B due to the contraction of the encapsulating resin 450, the thin section 440B of the electrode 440 is deflected, and the stress applied to the encapsulating resin 450 is relaxed.

Therefore, even when the stress is applied to the encapsulating resin 450 between the semiconductor element 20A and the semiconductor element 20B due to the contraction of the encapsulating resin 450, the thin section 440B is deflected to relax the stress. In other words, the stress that is generated by the contraction of the encapsulating resin 450 in the region between the semiconductor element 20A and the semiconductor element 20B is relaxed to the greater extent than the stress that is generated by the contraction of the encapsulating resin 450 in a region other than that between the semiconductor element 20A and the semiconductor element 20B.

As a result, it is possible to suppress the peeling of the encapsulating resin 450 from the electrode 10 between the semiconductor element 20A and the semiconductor element 20B.

As it has been described so far, according to the third embodiment, it is possible to maintain a favorable connection state between the electrode 10 and the semiconductor elements 20A and 20B.

As a result, according to the third embodiment, it is possible to provide the semiconductor device 400 in which the fatigue fractures between the semiconductor elements 20A, 20B and the electrode 10 are suppressed.

It should be noted that a width and a depth of the recessed section 440A as well as a width and a thickness of the thin section 440B may be set according to a positional relationship between the semiconductor element 20A and 20B or the like.

The description has been made so far on the mode in which the recessed section 440A is formed on the upper surface side of the electrode 440; however, the recessed section 440A may be formed on a lower surface side of the electrode 440 (a side that contacts the encapsulating resin 450) or may be formed on both of the upper surface and the lower surface of the electrode 440.

In addition, the recessed section 440A may be filled with a metal that has lower rigidity than a material that forms the electrode 440 (copper or the copper alloy, for example). As the metal having lower rigidity than the material that forms the electrode 440, aluminum, tin, indium, or an alloy containing thereof may be used, for example. If the recessed section 440A is filled with such a metal, a heat radiation property of the electrode 440 can further be improved.

It should be noted that the description has been made so far on the mode in which the semiconductor device 400 includes the two semiconductor elements 20A, 20B and the electrode 440 is provided with the thin section 440B in the region between the semiconductor element 20A and the semiconductor element 20B.

However, the semiconductor device 400 may include the three or more semiconductor elements. In such a case, the stress on the encapsulating resin 450 may be relaxed by positioning the thin section 440B in a region between two each of the semiconductor elements. Accordingly, it is possible to suppress the peeling of the encapsulating resin 450 from the electrode 10 between the semiconductor elements.

It should be noted that the recessed section 440A does not have to be formed from the one end to the other end of the electrode 440 in the short-side direction (Y-axis direction) in FIG. 13B. The electrode 440 may be formed such that one end or both ends of the recessed section 440A do not reach the end of the electrode 440.

<Fourth Embodiment>

Figure 14A:
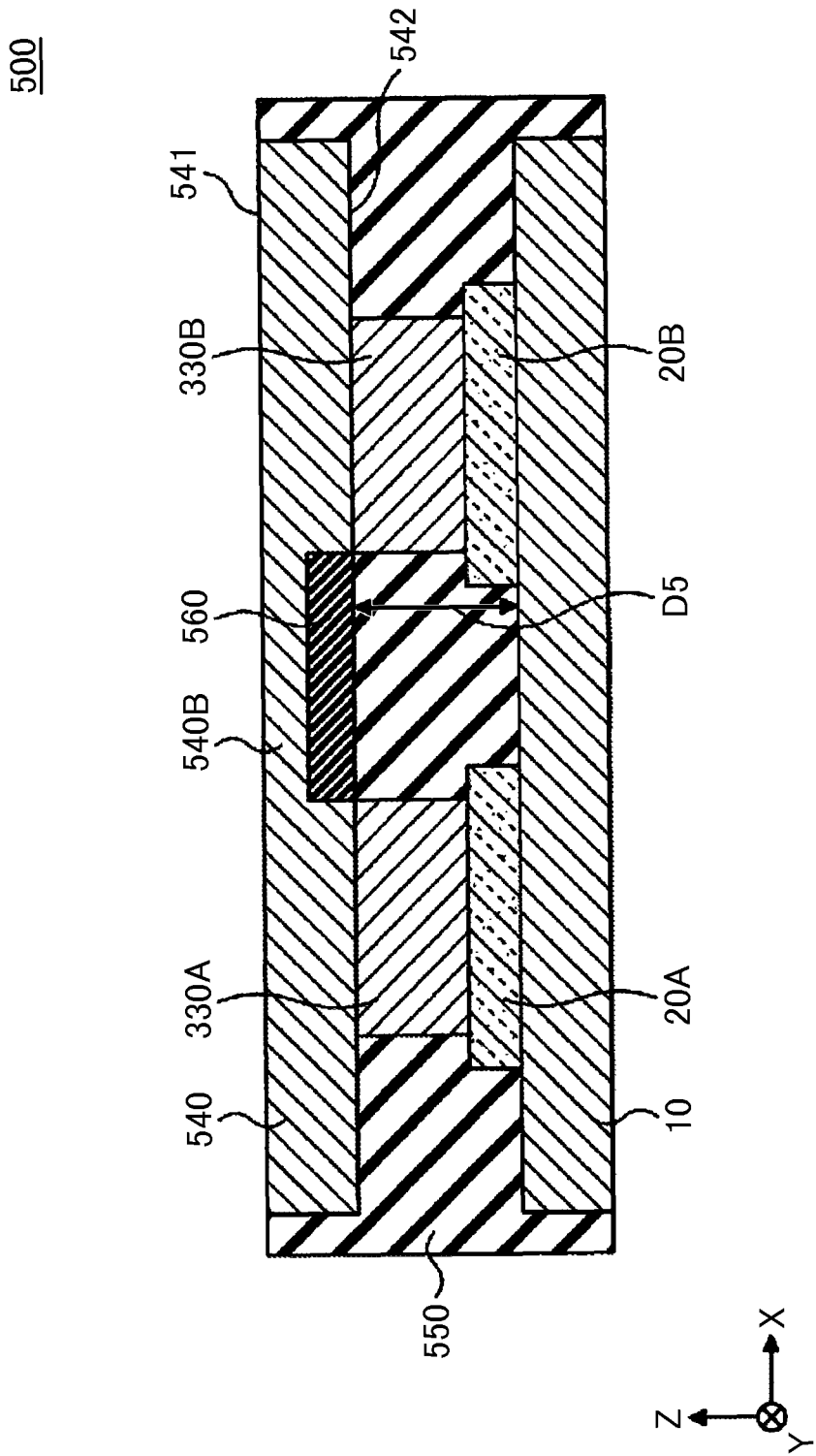
FIG. 14A is a cross-sectional view of the semiconductor device according to a fourth embodiment.
Figure 14B:
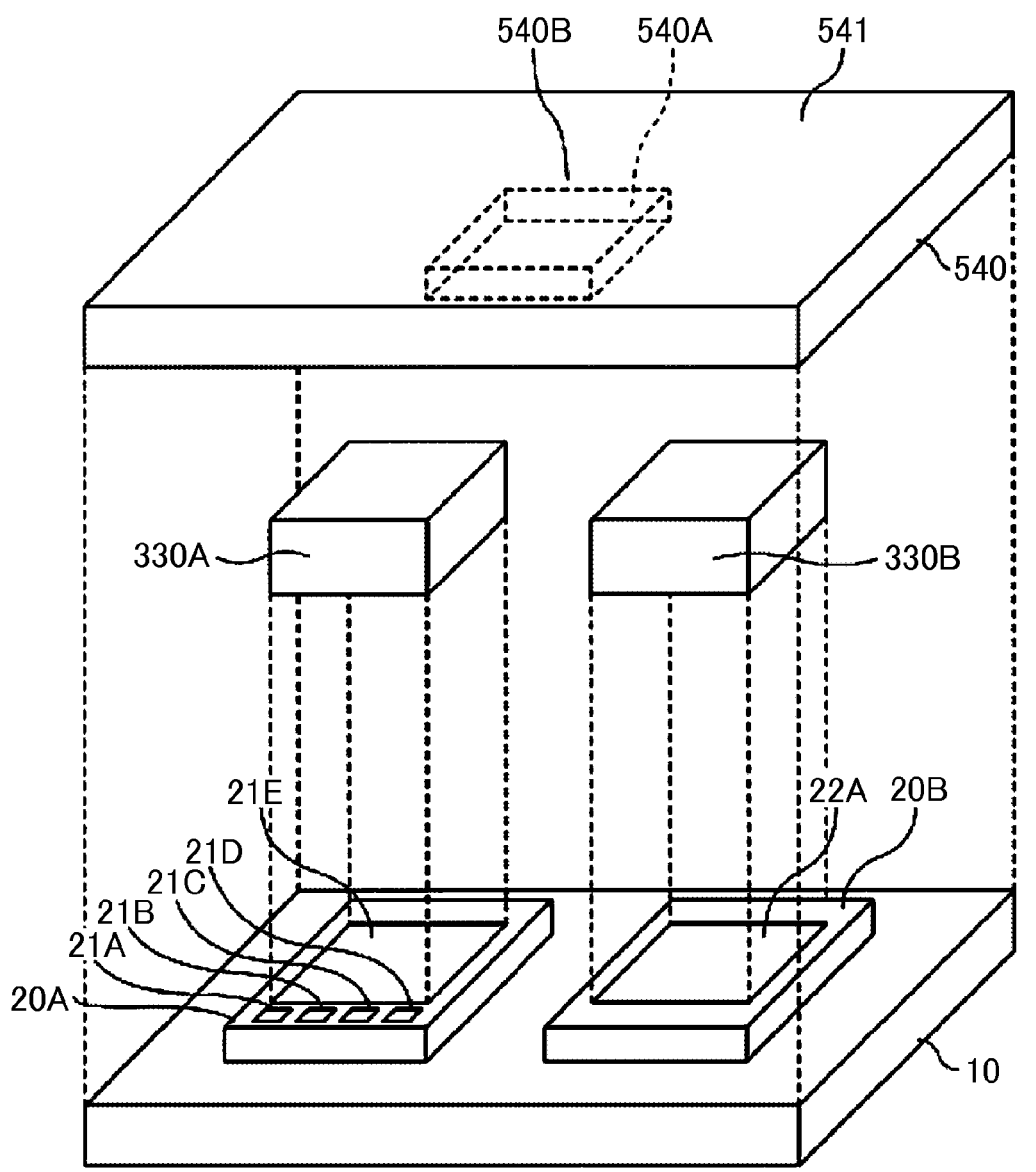
FIG. 14B is an exploded perspective view of the electrode in the fourth embodiment.
Figure 14C:
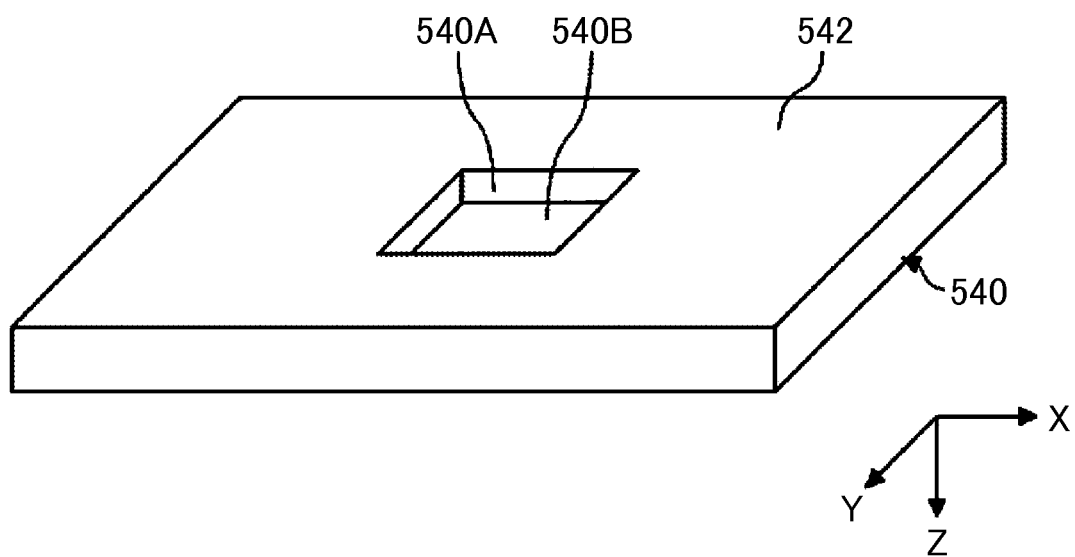
FIG. 14C shows the reversed electrode in the fourth embodiment that is shown in FIG. 14B.

FIG. 14A is a cross-sectional view of the semiconductor device according to a fourth embodiment, and FIG. 14B is an exploded perspective view of the electrode in the fourth embodiment. FIG. 14C shows the reversed electrode in the fourth embodiment that is shown in FIG. 14B.

It should be noted that an encapsulating resin 550 and the solder foil are not shown in FIG. 14B and FIG. 14C. In addition, the control terminals 62A to 62D and the bus bars 11, 41 (see FIG. 4A) are not shown in FIG. 14B and FIG. 14C.

In a semiconductor device 500 of the fourth embodiment, a structure of an electrode 540 differs from the structure of the electrode 440 in the semiconductor device 400 of the third embodiment. Because the other structure is the same as the structure of the semiconductor device 400 in the third embodiment, the same or similar components are denoted by the same reference numerals, and the description thereof is not repeated.

The exploded perspective view in FIG. 14B is an exploded perspective view that corresponds to FIG. 4A in the first embodiment. The cross-sectional view shown in FIG. 14A is a view for showing a cross section that can be obtained when the semiconductor device 500 of the fourth embodiment is cut in a thickness direction by a plane along a center axis in a longitudinal direction (X-axis direction) thereof.

The semiconductor device 500 of the fourth embodiment includes the electrode 10, the semiconductor elements 20A, 20B, the spacers 330A, 330B, the electrode 540, the encapsulating resin 550, and a stress relaxing section 560.

Here, the XYZ coordinate system will be defined as shown in FIG. 14A to FIG. 14C. The X-axis is parallel to longitudinal directions of the semiconductor device 500, the electrode 10, and the electrode 540, the Y-axis is parallel to short-side directions of the semiconductor device 500, the electrode 10, and the electrode 540, and the Z-axis is parallel to thickness directions of the semiconductor device 500, the electrode 10, and the electrode 540.

As shown in FIG. 14A, the electrode 540 has an upper surface 541 and a lower surface 542. Because FIG. 14C shows the electrode 540 shown in FIG. 14B in a reversed manner, FIG. 14B shows the upper surface 541 of the electrode 540 while FIG. 14C shows the lower surface 542 of the electrode 540.

As shown in FIG. 14B and FIG. 14C, the electrode 540 of the semiconductor device 500 in the fourth embodiment has a recessed section 540A that is recessed from the lower surface 542. As shown in FIG. 14C, the recessed section 540A is formed at the center of the lower surface 542 in the electrode 540.

The recessed section 540A is formed to be located between the spacer 330A and the spacer 330B in the plan view in a state that the electrode 540 is bonded to the spacers 330A, 330B. In other words, the recessed section 540A is located between the semiconductor element 20A and the semiconductor element 20B in the plan view in a state that the semiconductor device 500 is completed. It should be noted that a depth of the recessed section 540A is half a depth of the electrode 540, for example.

A portion that is thinned by the recessed section 540A is a thin section 540B. A thickness of the thin section 540B equals to a thickness of the electrode 540 from which the depth of the recessed section 540A is subtracted. Accordingly, if the depth of the recessed section 540A is half the thickness of the electrode 540, the thickness of the thin section 540B is half the thickness of the electrode 540.

As shown in FIG. 14A, the stress relaxing section 560 is disposed in the recessed section 540A of the electrode 540.

The stress relaxing section 560 can be formed of any material as long as the material has sufficiently lower elasticity than the electrode 40 or the spacers 330A, 330B, and can be formed of a stress relaxation material such as a silicon resin, a urethane resin, the polyamide resin, a polyimide resin, a rubber-based resin, or the like, for example. For example, the stress relaxing section 560 may be formed by turning the recessed section 540A of the electrode 540 upward and by applying or pouring the stress relaxation material into the recessed section 540A. It should be noted that the stress relaxing section 560 may be formed of a material having lower elasticity than the encapsulating resin 550.

The stress relaxing section 560 is a member that is elastically deformed to relax the stress applied to the encapsulating resin 550 when the stress is generated between the encapsulating resin 550 and the stress relaxing section 560 due to the contraction of the encapsulating resin 550.

The encapsulating resin 550 is the same as the encapsulating resin 450 of the third embodiment except that it is formed between the electrode 10 and the stress relaxing section 560 in the region between the spacer 330A and the spacer 330B.

In the semiconductor device 500 of the fourth embodiment, a thickness D5 of the encapsulating resin 550 in the region between the semiconductor element 20A and the semiconductor element 20B is substantially the same as the thickness of the encapsulating resin 50 in the region between the semiconductor element 20A and the semiconductor element 20B in the semiconductor device 1 of the comparative example.

However, the electrode 540 has the recessed section 540A that is located on the inside of the region between the semiconductor element 20A and the semiconductor element 20B in the plan view. The stress relaxing section 560 is formed in the recessed section 540A that is formed in the lower surface 542 of the electrode 540. The stress relaxing section 560 is elastically deformed to relax the stress applied to the encapsulating resin 550 when the stress is generated between the encapsulating resin 550 and the stress relaxing section 560 due to the contraction of the encapsulating resin 550.

In addition, the electrode 540 has the thin section 540B that is located on the inside of the region between the semiconductor element 20A and the semiconductor element 20B in the plan view. A depth of the thin section 540B is half the thickness of a portion other than the thin section 540B in the electrode 540, for example. Accordingly, the electrode 540 is likely to be deflected in the thin section 540B.

Therefore, when the stress is generated between the electrode 10 and the encapsulating resin 550 or between relaxing section 560 and the encapsulating resin 550 in the region between the semiconductor element 20A and the semiconductor element 20B due to the contraction of the encapsulating resin 550, the stress applied to the encapsulating resin 550 is relaxed.

In other words, the stress that is generated by the contraction of the encapsulating resin 550 in the region between the semiconductor element 20A and the semiconductor element 20B is relaxed to the greater extent than the stress that is generated by the contraction of the encapsulating resin. 550 in a region other than that between the semiconductor element 20A and the semiconductor element 20B.

In addition, when the stress as described above is applied to the encapsulating resin 550, the thin section 540B of the electrode 540 is deflected to relax the stress.

Accordingly, even when the stress is applied to the encapsulating resin 550 between the semiconductor element 20A and the semiconductor element 20B due to the contraction of the encapsulating resin 550, the stress relaxing section 560 relaxes the stress applied to the encapsulating resin 550. Furthermore, the stress is also relaxed by the deflection of the thin section 540B.

Therefore, it is possible to suppress the peeling of the encapsulating resin 550 from the electrode 10 between the semiconductor element 20A and the semiconductor element 20B.

As it has been described so far, according to the fourth embodiment, it is possible to maintain the favorable connection state between the electrode 10 and the semiconductor elements 20A and 20B.

As a result, according to the fourth embodiment, it is possible to provide the semiconductor device 500 in which the fatigue fractures between the semiconductor elements 20A, 20B and the electrode 10 are suppressed.

It should be noted that a width, the depth, and the elasticity of the stress relaxing section 560 may be set according to a relationship thereof with the stress that is possibly applied to the encapsulating resin 550.

In addition, a width and the depth of the recessed section 540A or a width and the thickness of the thin section 540B may be set according to a positional relationship thereof with the semiconductor elements 20A and 20B.

The description has been made so far on the mode in which the stress relaxing section 560 is disposed in the one recessed section 540A that is formed at the center of the lower surface 542 in the electrode 540; however, the recessed section 540A may be a plurality of groove-shaped recessed sections or may be a plurality of holes that are arranged in a matrix.

It has been described on the mode in which the semiconductor device 500 includes the two semiconductor elements 20A, 20B and in which the stress relaxing section 560 is disposed between the encapsulating resin 550 and the electrode 540 in the region between the semiconductor element 20A and the semiconductor element 20B.

However, the semiconductor device 500 may include the three or more semiconductor elements. In such a case, the stress on the encapsulating resin 550 may be relaxed by positioning the stress relaxing section 560 in a region between two each of the semiconductor elements. Accordingly, it is possible to suppress the peeling of the encapsulating resin 550 from the electrode 10 between the semiconductor elements.

FIG. 14D is a cross-sectional view for showing the semiconductor device according to a first modification of the fourth embodiment. The semiconductor device in the first modification of the fourth embodiment is obtained by modifying the structures of the recessed section 540A and the stress relaxing section 560 that are shown in FIG. 14A and FIG. 14B.

Figure 14E:
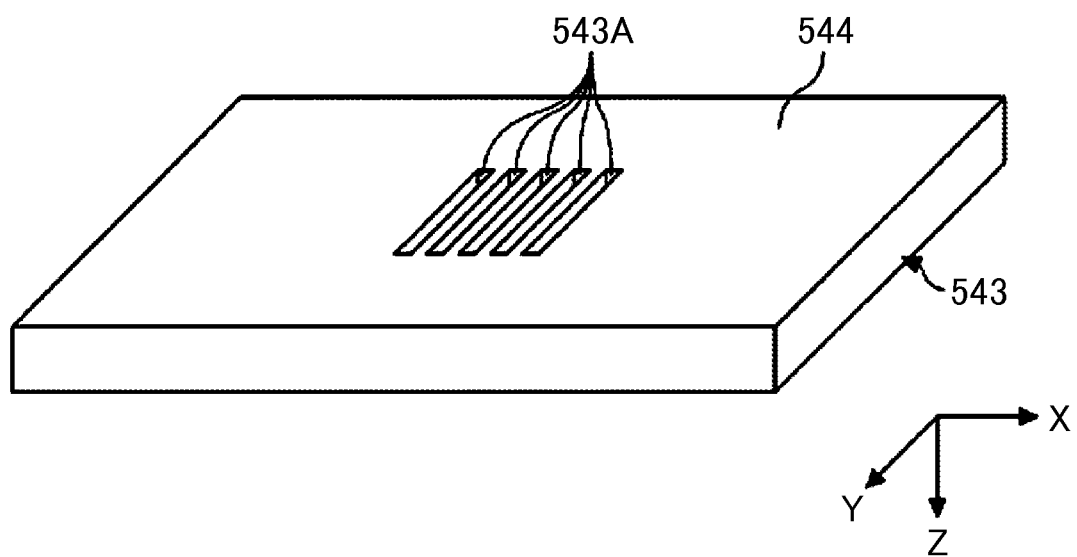
FIG. 14E is a view for showing a reversed electrode 543 of a semiconductor device 500A in the first modification of the fourth embodiment that is shown in FIG. 14D.

Like FIG. 14A to FIG. 14C, the XYZ coordinate system is defined in FIG. 14D and FIG. 14E.

FIG. 14E is a view for showing a reversed electrode 543 of a semiconductor device 500A in the first modification of the fourth embodiment that is shown in FIG. 14D.

The semiconductor device 500A in the first modification of the fourth embodiment that is shown in FIG. 14D includes the electrode 10, the semiconductor elements 20A, 20B, the spacers 330A, 330B, the electrode 543, the encapsulating resin 550, and a stress relaxing section 561.

While FIG. 14D shows the stress relaxing section 561, FIG. 14E shows the electrode 543 before the stress relaxing section 561 is formed.

In the semiconductor device 500A of the first modification of the fourth embodiment, the electrode 540 and the stress relaxing section 560 of the semiconductor device 500 in the fourth embodiment are replaced by the electrode 543 and the stress relaxing section 561.

The electrode 543 has an upper surface 544 and a lower surface 545. The electrode 543 has recessed sections 543A and a thin section 543B. The recessed sections 543A and the thin section 543B are obtained by modifying the recessed section 540A and the thin section 540B (see FIG. 14A and FIG. 14B).

The recessed sections 543A are five groove-shaped recessed sections that are formed at the center of the lower surface 545 in the electrode 543. The thin section 543B is a section in which the electrode 543 is partially and regularly thinned by the five recessed sections 543A.

As shown in FIG. 14D, the stress relaxing section 561 is formed on the inside of each of the five groove-shaped recessed sections 543A. Like the stress relaxing section 560 in the fourth embodiment, the stress relaxing section 561 is configured of the stress relaxation material.

Because a width of the recessed section 543A is smaller than that of the recessed section 543A in the fourth embodiment, the stress relaxation material can be injected into the recessed section 543A using a capillary phenomenon.

Accordingly, when the stress is generated between the electrode 10 and the encapsulating resin 550 or between the stress relaxing section 561 and the encapsulating resin 550 in the region between the semiconductor element 20A and the semiconductor element 20B due to the contraction of the encapsulating resin 550, the stress relaxing section 561 relaxes the stress applied to the encapsulating resin 550.

In other words, the stress that is generated by the contraction of the encapsulating resin 550 in the region between the semiconductor element 20A and the semiconductor element 20B is relaxed to the greater extent than the stress that is generated by the contraction of the encapsulating resin 550 in a region other than that between the semiconductor element 20A and the semiconductor element 20B.

In addition, when the stress as described above is applied to the encapsulating resin 550, the thin section 543B of the electrode 543 is deflected to relax the stress.

Accordingly, even when the stress is applied to the encapsulating resin 550 between the semiconductor element 20A and the semiconductor element 20B due to the contraction of the encapsulating resin 550, the stress relaxing section 561 relaxes the stress applied to the encapsulating resin 550. Furthermore, the stress is also relaxed by the deflection of the thin section 543B.

Therefore, it is possible to suppress the peeling of the encapsulating resin 550 from the electrode 10 between the semiconductor element 20A and the semiconductor element 20B.

As it has been described so far, according to the first modification of the fourth embodiment, it is possible to maintain the favorable connection state between the electrode 10 and the semiconductor elements 20A and 20B.

As a result, according to the first modification of the fourth embodiment, it is possible to provide the semiconductor device 500A in which the fatigue fractures between the semiconductor elements 20A, 20B and the electrode 10 are suppressed.

It should be noted that the groove section 543A may be formed by drilling, for example.

In addition, the recessed section 543A may not be groove-shaped but may be a cylindrical recessed hole whose opening is circular or rectangular, for example. Such a recessed section may be formed in the lower surface 545 of the electrode 543 in the matrix. The recessed sections arranged in the matrix may be formed by drilling, for example. The stress relaxation material can more easily be injected into the recessed section that is recessed in a shape of a circular or rectangular cylinder by using the capillary phenomenon than into the groove-shaped recessed section 543A.

It should be noted that the description has been made so far on the mode in which the semiconductor device 500A includes the two semiconductor elements 20A, 20B and in which the stress relaxing section 561 is disposed between the encapsulating resin 550 and the electrode 540 in the region between the semiconductor element 20A and the semiconductor element 20B.

However, the semiconductor device 500A may include the three or more semiconductor elements. In such a case, the stress on the encapsulating resin 550 may be relaxed by positioning the stress relaxing section 561 in a region between two each of the semiconductor elements. Accordingly, it is possible to suppress the peeling of the encapsulating resin 550 from the electrode 10 between the semiconductor elements.

Figure 14F:
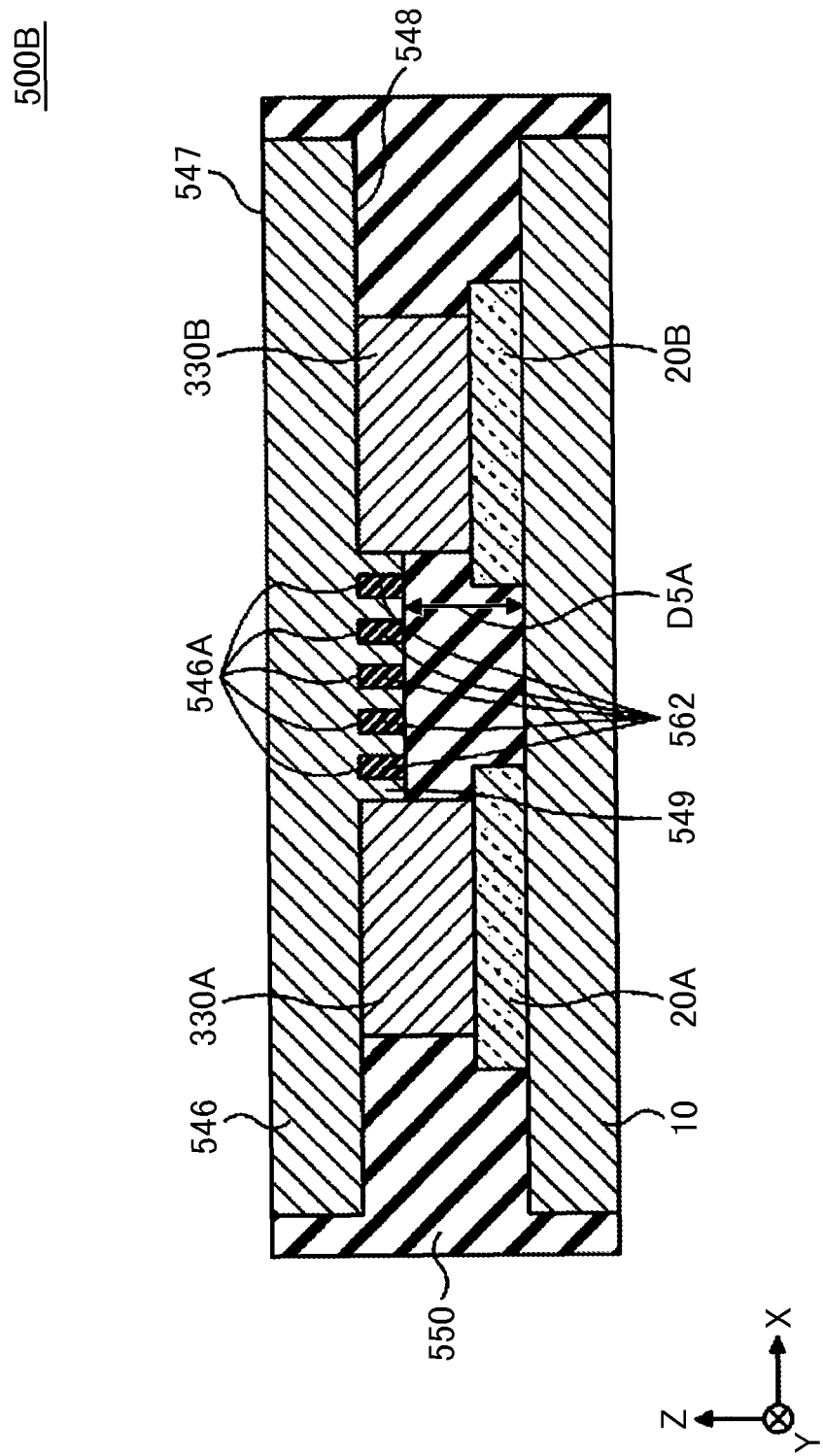
FIG. 14F is a cross-sectional view for showing the semiconductor device according to a second modification of the fourth embodiment.

FIG. 14F is a cross-sectional view for showing the semiconductor device according to a second modification of the fourth embodiment. The semiconductor device in the second modification of the fourth embodiment is obtained by modifying the structures of the recessed section 540A and the stress relaxing section 560 that are shown in FIG. 14A and FIG. 14B.

Figure 14G:
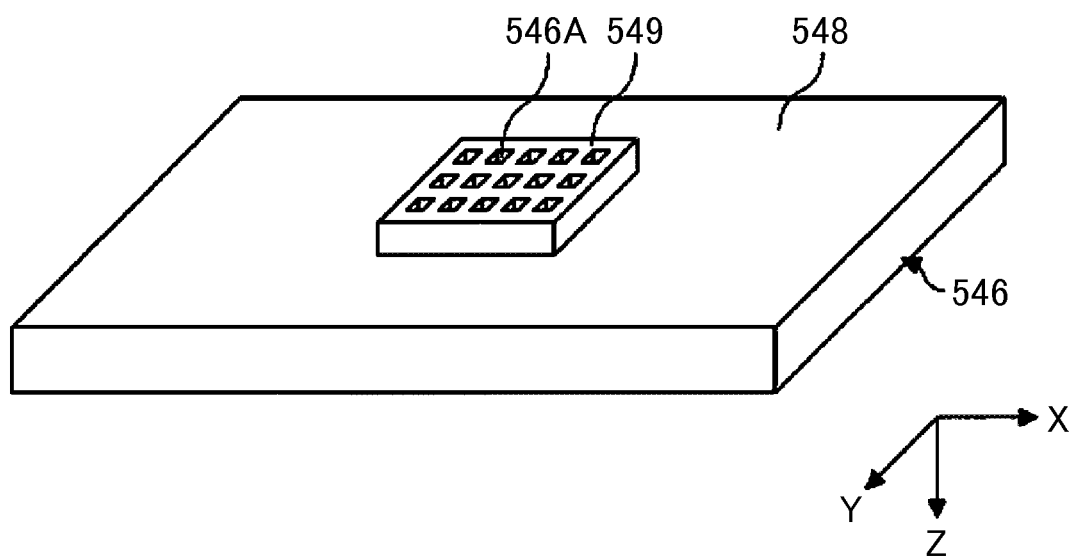
FIG. 14G shows a reversed electrode 546 of a semiconductor device 500B in the second modification of the fourth embodiment that is shown in FIG. 14F.

It should be noted that the XYZ coordinate system is defined in FIG. 14F and FIG. 14G like FIG. 14A to FIG. 14C.

FIG. 14G shows a reversed electrode 546 of a semiconductor device 500B in the second modification of the fourth embodiment that is shown in FIG. 14F.

The semiconductor device 500B in the second modification of the fourth embodiment that is shown in FIG. 14F includes the electrode 10, the semiconductor elements 20A, 20B, the spacers 330A, 330B, the electrode 546, the encapsulating resin 550, and a stress relaxing section 562.

In the semiconductor device 500B in the second modification of the fourth embodiment, the electrode 540 and the stress relaxing section 560 of the semiconductor device 500 in the fourth embodiment are replaced by the electrode 546 and the stress relaxing section 562.

While FIG. 14F shows the stress relaxing section 562, FIG. 14G shows the electrode 546 before the stress relaxing section 562 is formed.

The electrode 546 includes an upper surface 547 and a lower surface 548. The electrode 546 has a projected section 549 at the center of the lower surface 548. The projected section 549 is a section in which a section located between the spacer 330A and the spacer 330B is projected downward in the plan view. The projected section 549 has a length to be fitted between the spacer 330A and the spacer 330B in the X-axis direction, and has the same length as the spacers 330A, 330B in the Y-axis direction. In addition, a height of the projected section 549 (length in a Z-axis direction) is set to be a half of heights of the spacers 330A, 330B, for example.

The electrode 546 has recessed sections 546A that are formed on a lower surface side of the projected section 549. The recessed sections 546A are recessed sections that are arranged in the matrix in the projected section 549 at the center of the lower surface 548 of the electrode 546. While FIG. 14F shows the five recessed sections 546A that are arranged in the X-axis direction, the recessed sections 546A is arranged in three rows in the Y-axis direction.

Although FIG. 14G shows a mode in which openings of the recessed sections 546A are square shaped, each of the openings of the recessed sections 546A may be in a circular shape or in another shape. In addition, although FIG. 14G shows a mode in which the recessed sections 546A are arranged in five rows in the X-axis direction and in the three rows in the Y-axis direction, this is merely an example, and the number of the recessed sections 546A may be set arbitrary.

The stress relaxing section 562 is formed on the inside of the plurality of the recessed sections 546A that are arranged in the matrix. Like the stress relaxing section 560 in the fourth embodiment, the stress relaxing section 562 is configured of the stress relaxation material.

Because the recessed section 546A is hollowed out in a cylindrical shape, the stress relaxation material can be injected into the recessed sections 546A using the capillary phenomenon.

Accordingly, when the stress is generated between the electrode 10 and the encapsulating resin 550 or between the stress relaxing section 562 and the encapsulating resin 550 in the region between the semiconductor element 20A and the semiconductor element 20B due to the contraction of the encapsulating resin 550, the stress applied to the encapsulating resin 550 is relaxed.

In other words, the stress that is generated by the contraction of the encapsulating resin 550 in the region between the semiconductor element 20A and the semiconductor element 20B is relaxed to the greater extent than the stress that is generated by the contraction of the encapsulating resin 550 in a region other than that between the semiconductor element 20A and the semiconductor element 20B.

In addition, because the electrode 546 has the projected section 549, a thickness D5A of the encapsulating resin 550 between the projected section 549 and the electrode 10 is reduced by the projected section 549 when compared to a distance between the electrode 10 and the electrode 546.

Accordingly, the stress generated between the encapsulating resin 550 and the electrode 10 can be relaxed. Furthermore, even when the stress is applied to the encapsulating resin 550 between the semiconductor element 20A and the semiconductor element 20B due to the contraction of the encapsulating resin 550, the stress relaxing section 562 relaxes the stress applied to the encapsulating resin 550.

Therefore, it is possible to suppress the peeling of the encapsulating resin 550 from the electrode 10 between the semiconductor element 20A and the semiconductor element 20B.

As it has been described so far, according to the second modification of the fourth embodiment, it is possible to maintain the favorable connection state between the electrode 10 and the semiconductor elements 20A and 20B.

As a result, according to the second modification of the fourth embodiment, it is possible to provide the semiconductor device 500B in which the fatigue fractures between the semiconductor elements 20A, 20B and the electrode 10 are suppressed.

It should be noted that the description has been made so far on the mode in which the semiconductor device 500B includes the two semiconductor elements 20A, 20B and in which the projected section 549 and the stress relaxing section 562 are disposed between the encapsulating resin 550 and the electrode 540 in the region between the semiconductor element 20A and the semiconductor element 20B.

However, the semiconductor device 500B may include the three or more semiconductor elements. In such a case, the stress on the encapsulating resin 550 may be relaxed by positioning the projected section 549 and the stress relaxing section 562 in a region between each two of the semiconductor elements. Accordingly, it is possible to suppress the peeling of the encapsulating resin 550 from the electrode 10 between the semiconductor elements.

<Fifth Embodiment>

Figure 15A:
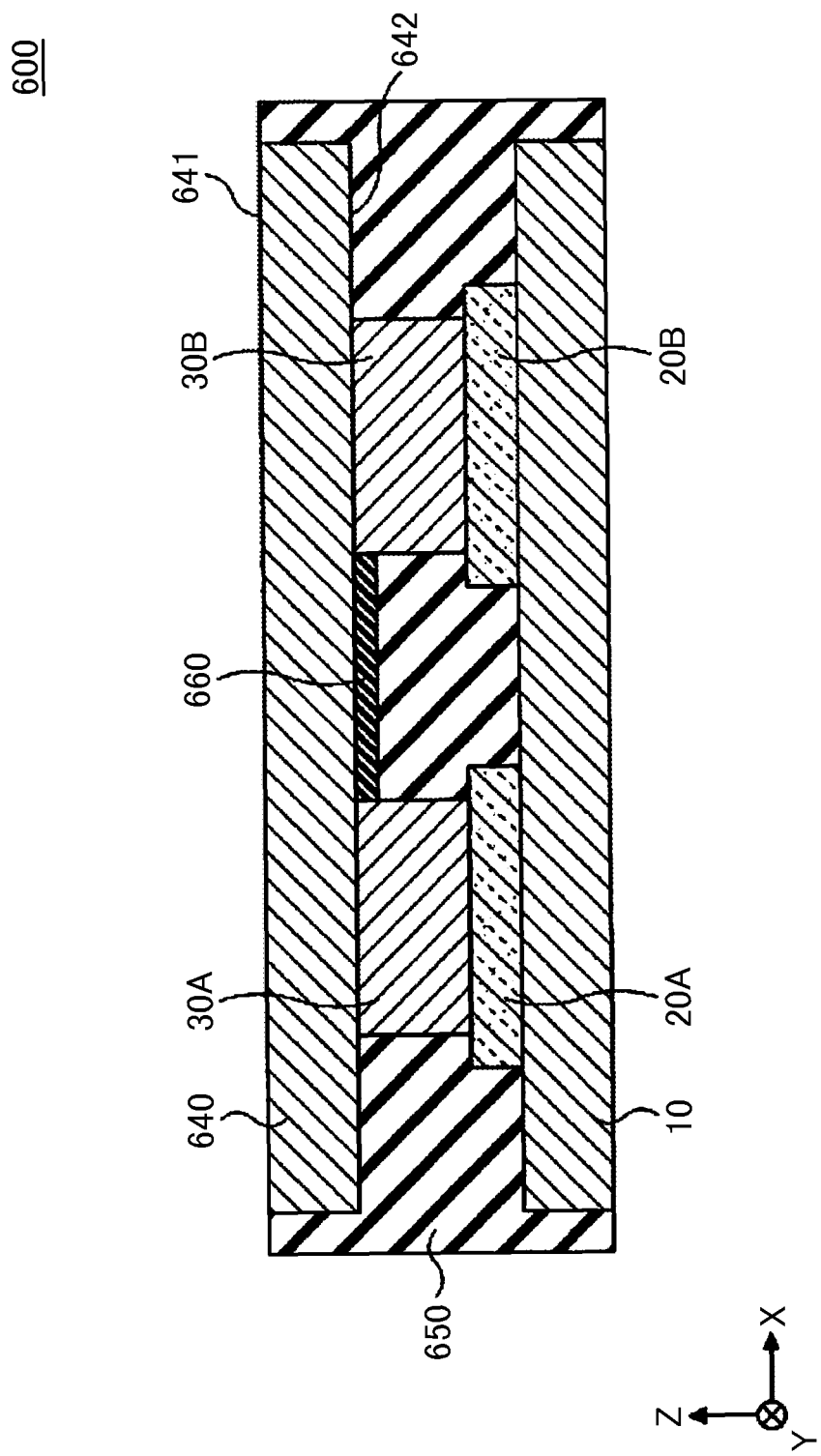
FIG. 15A is a cross-sectional view of the semiconductor device according to a fifth embodiment.
Figure 15B:
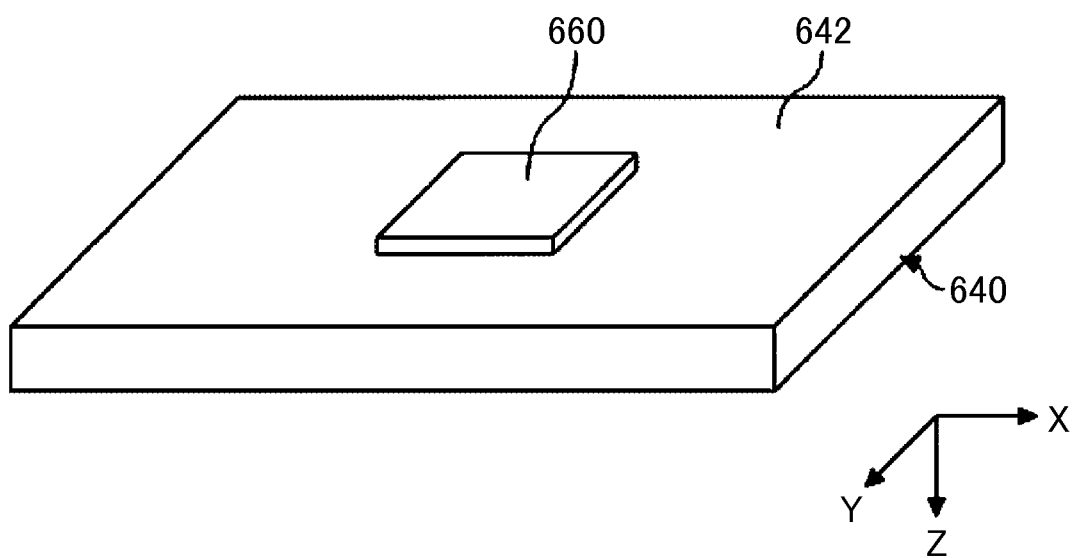
FIG. 15B is a view for showing a peeling layer of the semiconductor device in the fifth embodiment.

FIG. 15A is a cross-sectional view of the semiconductor device according to a fifth embodiment. FIG. 15B is a view for showing a peeling layer of the semiconductor device in the fifth embodiment. As illustrated, the XYZ coordinate system is defined in FIG. 15A and FIG. 15B.

The cross-sectional view shown in FIG. 15A is a view for showing a cross section that can be obtained when a semiconductor device 600 of the fifth embodiment is cut in a thickness direction by a plane along a center axis in a longitudinal direction (X-axis direction) thereof. FIG. 15B is a view for showing a reversed electrode 640 of the semiconductor device 600 that is shown in FIG. 15A.

As shown in FIG. 15A, the semiconductor device 600 of the fifth embodiment includes the electrode 10, the semiconductor elements 20A, 20B, the spacers 30A, 30B, the electrode 640, an encapsulating resin 650, and a peeling film 660.

The semiconductor device 600 of the fifth embodiment is provided with the peeling film 660 instead of the stress relaxing section 560 of the semiconductor device 500 in the fourth embodiment. It should be noted that a lower surface of the electrode 640 is flat in the fifth embodiment. Because the other structure is same as the structure of the semiconductor device 500 in the fourth embodiment, the same or similar components are denoted by the same reference numerals, and the description thereof is not repeated.

The electrode 640 is a plate-shaped electrode and has an upper surface 641 and a lower surface 642. The lower surface 642 of the electrode 640 is bonded to the spacers 30A, 30B.

As shown in FIG. 15B, the peeling film 660 is formed at the center of the lower surface 642 of the electrode 640. The peeling film 660 is located between the spacer 30A and the spacer 30B in the X-axis direction and has the same length as the spacers 30A, 30B in the Y-axis direction.

In addition to a resin film that is made from the rubber-based resin, the silicon resin, the urethane resin, a polyethylene resin, a polypropylene resin Teflon® resin, or the like, for example, the peeling film 660 may be a metal film made from gold, nickel, copper, or the like, for example. Furthermore, as the peeling film 660, adhesive non-curing grease, an oil-based paste, a high viscous liquid may be applied to or formed at the center of the lower surface 642 of the electrode 640.

It should be noted that the resin film can be applied to the lower surface 642 of the electrode 640 and that the metal film is formed on the lower surface 642 of the electrode 640 by a sputtering method or the like. In addition, a film made from polyamide, polyimide, or the like does not have to be coated on a portion where the peeling film 660 is formed.

When a certain magnitude of the stress is generated between the encapsulating resin 650 and the electrode 640 in a region between the spacer 30A and the spacer 30B, the peeling film 660 peels the encapsulating resin 650 from the electrode 640. The peeling film 660 is an example of a peeling induction film.

Thermal stress is generated between the electrode 10 and the semiconductor elements 20A, 20B due to a difference in a linear expansion coefficient therebetween; however, the thermal stress is not generated between the spacers 30A, 30B and the electrode 640 because they are both configured of copper or the copper alloy.

Accordingly, even when the encapsulating resin 650 is peeled from the electrode 640 in the region between the spacer 30A and the spacer 30B, a problem does not occur in the semiconductor device 600.

Thus, when the certain magnitude of the stress is generated between the encapsulating resin 650 and the electrode 640, the peeling film 660 peels the encapsulating resin 650 from the electrode 640; therefore, it is possible to relax the stress that is generated between the electrode 10 and the encapsulating resin 650 in the region between the semiconductor element 20A and the semiconductor element 20B.

As it has been described so far, according to the fifth embodiment, due to the formation of the peeling film 660 at the center of the lower surface 642 of the electrode 640, when the certain degree of the stress is generated between the electrode 640 and the encapsulating resin 650 in the region between the spacer 30A and the spacer 30B, the peeling film 660 peels the encapsulating resin 650 from the electrode 640.

Accordingly, the stress that is generated by the contraction of the encapsulating resin 650 in the region between the semiconductor element 20A and the semiconductor element 20B is relaxed to the greater extent than the stress that is generated by the contraction of the encapsulating resin 650 in a region other than that between the semiconductor element 20A and the semiconductor element 20B.

As a result, it is possible to suppress the peeling of the encapsulating resin 650 from the electrode 10 between the semiconductor element 20A and the semiconductor element 20B.

It should be noted that, because a portion of the lower surface 642 in the electrode 640 that is not formed with the peeling film 660 is adhered to the encapsulating resin 650, the semiconductor elements 20A, 20B, and the spacers 30A, 30B are sealed by the encapsulating resin 650.

As it has been described so far, according to the fifth embodiment, it is possible to maintain the favorable connection state between the electrode 10 and the semiconductor elements 20A and 20B.

As a result, according to the fifth embodiment, it is possible to provide the semiconductor device 600 in which the fatigue fractures between the semiconductor elements 20A, 20B and the electrode 10 are suppressed.

It should be noted that the description has been made so far on the mode in which the semiconductor device 600 includes the two semiconductor elements 20A, 20B and in which the peeling film 660 is disposed between the encapsulating resin 650 and the electrode 640 in the region between the semiconductor element 20A and the semiconductor element 20B.

However, the semiconductor device 600 may include the three or more semiconductor elements. In such a case, the stress on the encapsulating resin 650 may be relaxed by positioning the peeling film 660 in a region between two each of the semiconductor elements. Accordingly, it is possible to suppress the peeling of the encapsulating resin 650 from the electrode 10 between the semiconductor elements.

<Sixth Embodiment>

The semiconductor device according to a sixth embodiment differs from the semiconductor devices 100 to 600 in the first to the fifth embodiments in terms of the structure of the spacer.

Figure 16A:
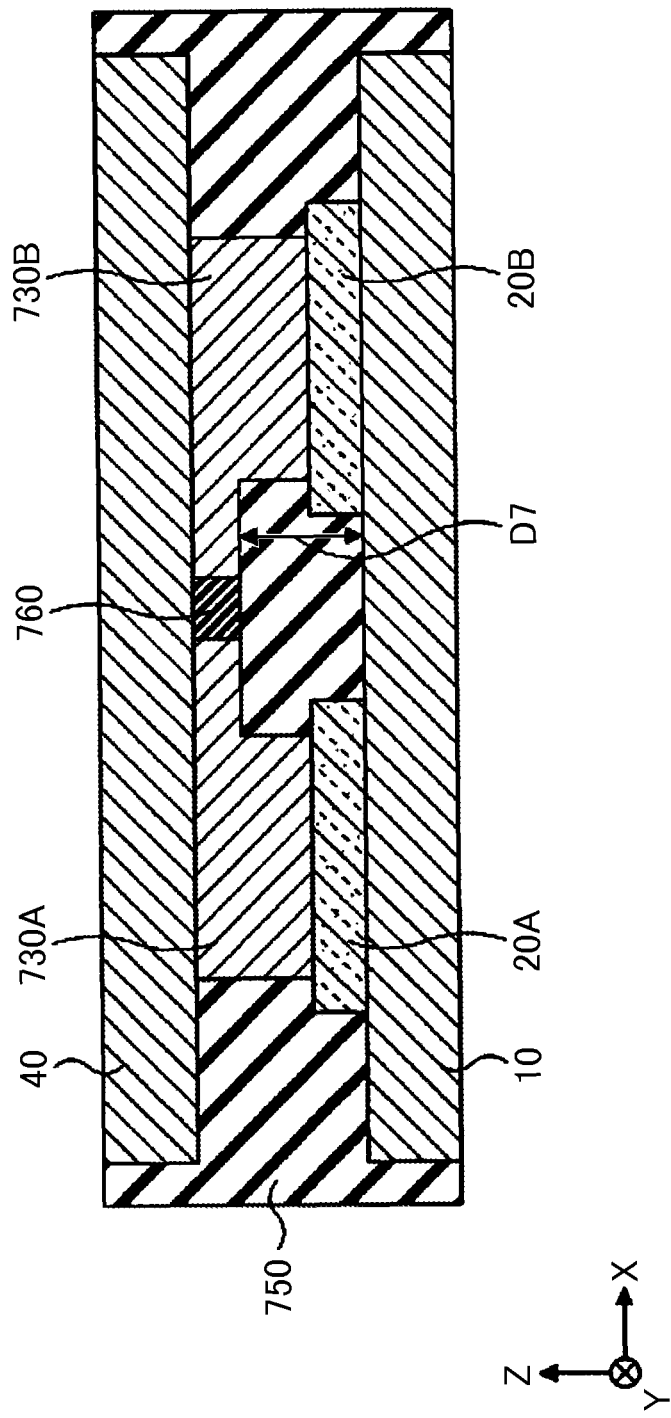
FIG. 16A is a cross-sectional view for showing the semiconductor device according to a sixth embodiment.
Figure 16B:
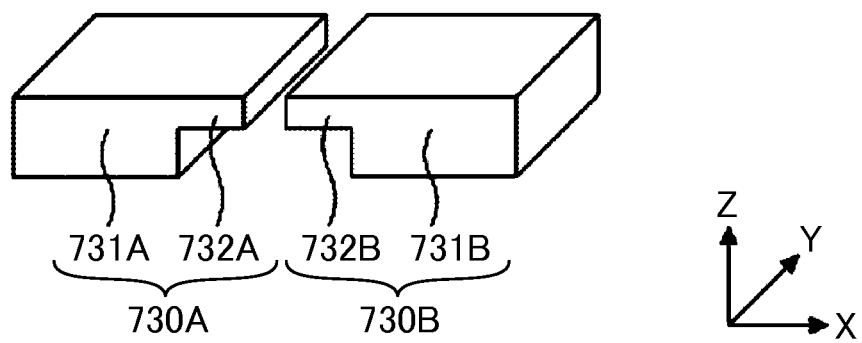
FIG. 16B is a perspective view for showing the spacer of the semiconductor device in the sixth embodiment.

FIG. 16A is a cross-sectional view for showing the semiconductor device according to the sixth embodiment. FIG. 16B is a perspective view for showing the spacer of the semiconductor device in the sixth embodiment. As illustrated, the XYZ coordinate system is defined in FIG. 16A and FIG. 16B.

The cross-sectional view shown in FIG. 16A is a view for showing a cross section that can be obtained when a semiconductor device 700 of the sixth embodiment is cut in a thickness direction by a plane along a center axis in a longitudinal direction (X-axis direction) thereof.

The semiconductor device 700 of the sixth embodiment includes the electrode 10, the semiconductor elements 20A, 20B, spacers 730A, 730B, the electrode 40, an encapsulating resin 750, and a stress relaxing section 760.

In the semiconductor device 700 of the sixth embodiment, structures of the spacers 730A, 730B, the encapsulating resin 750, and the stress relaxing section 760 differ from those in the semiconductor device 100 of the first embodiment. Because the other components are the same as those in the semiconductor device 100 of the first embodiment, the same or similar components are denoted by the same reference numerals, and the description thereof is not repeated.

As shown in FIG. 16A and FIG. 16B, the spacer 730A and the spacer 730B are separated. The spacer 730A has a base section 731A and a projected section 732A. The spacer 730B has a base section 731B and a projected section 732B.

The base section 731A of the spacer 730A is the same as the first section 130A of the spacer 130 (see FIG. 5) in the semiconductor device 100 of the first embodiment. The projected section 732A is projected to a positive direction of the X-axis from an upper side of the base section 731A. The spacer, 730A in the sixth embodiment has a shape in which the projected section 732A is bonded to the first section 130A in the first embodiment.

The base section 731A is an example of the first section, and the projected section 732A is an example of a first projected section.

The base section 731B of the spacer 730B is the same as the second section 130B of the spacer 130 (see FIG. 5) in the semiconductor device 100 of the first embodiment. The projected section 732B is projected in a negative direction of the X-axis from an upper side of the base section 731B. The spacer 730B in the sixth embodiment has a shape in which the projected section 732B is bonded to the second section 130B in the first embodiment.

The base section 731B is an example of the second section, and the projected section 732B is an example of a second projected section.

It should be noted that dimensions in the X-axis direction of the base sections 731A, 731B of the spacers 730A, 730B in the sixth embodiment are respectively longer than dimensions in the X-axis direction of the first section 130A, the second section 130B of the spacer 130 in the first embodiment. This will be described later in detail with reference to FIG. 22.

The base section 731A of the spacer 730A is connected to the emitter in the upper surface of the semiconductor element 20A while the base section 731B of the spacer 730B is connected to the anode in the upper surface of the semiconductor element 20B.

There is a distance between a tip of the projected section 732A in the spacer 730A and a tip of the projected section 732B in the spacer 730B, and the stress relaxing section 760 is disposed between the tip of the projected section 732A and the tip of the projected section 732B.

The stress relaxing section 760 can be made of any material as long as it has substantially lower elasticity than the electrode 40 or the spacers 730A, 730B, and can be formed of the stress relaxation material such as the silicon resin, the urethane resin, the polyamide resin, the polyimide resin, the rubber-based resin, or the like, for example. It should be noted that the stress relaxing section 760 may be formed of a material that has lower elasticity than the encapsulating resin 750.

The stress relaxing section 760 is formed such that, for example, the spacers 730A, 730B are respectively bonded to the upper surfaces of the semiconductor elements 20A, 20B and that the stress relaxation material is further applied between the projected section 732A and the projected section 732B in a state that the electrode 40 is bonded to upper surfaces of the spacers 730A, 730B.

It should be noted that, if a space between the tip of the projected section 732A and the tip of the projected section 732B is narrow enough to realize the capillary phenomenon, the capillary phenomenon is used to form the stress relaxing section 760 between the projected section 732A and the projected section 732B.

The electrode 40 is bonded to the upper surfaces of the spacers 730A, 730B. It should be noted that the stress relaxing section 760 may be formed before the electrode 40 is bonded onto the spacers 730A, 730B.

The encapsulating resin 750 seals the electrode 10, the semiconductor elements 20A, 20B, the spacers 730A, 730B, the electrode 40, and the stress relaxing section 760. The encapsulating resin 750 can be formed in a same manner as the encapsulating resin 150 in the first embodiment.

Next, a description will be made on a method of manufacturing the semiconductor device 700 in the sixth embodiment. FIG. 17 to FIG. 21 show a manufacturing process of the semiconductor device 700 in the sixth embodiment.

First, the electrode 10, the solder foils 71A, 71B, the semiconductor elements 20A, 20B, the solder foils 72A, 72B, the spacers 730A, 730B, the solder foils 73A, 73B, and the control terminals 62A to 62D are aligned. A well-known jig can be used for alignment. It should be noted that the bus bar 11 is connected to the electrode 10.

The solder foils 71A, 71B, 72A, 72B, 73A, 73B are the solder sheets that are formed by rolling a material that contains AnAg solder containing tin and silver, SnCu solder containing tin and copper, or the like, for example.

The solder foil 71A is disposed between the electrode 10 and the semiconductor element 20A. The solder foil 71B is disposed between the electrode 10 and the semiconductor element 20B. The solder foil 72A is disposed between the semiconductor element 20A and the base section 731A of a spacer 730A. The solder foil 72B is disposed between the semiconductor element 20B and the base section 731B of the spacer 730B.

The solder foil 73A is disposed on the base section 731A of the spacer 730A. The solder foil 73B is disposed on the base section 731B of the spacer 730B.

It should be noted that surfaces of the electrodes 10, 40 and the spacers 730A, 730B may be applied with nickel plating or the like. In addition, portions of the surfaces of the electrodes 10, 40 and the spacers 730A, 730B that contact the solder foils 71A, 71B, 72A, 72B, 73A, 73B may be applied with gold plating to improve the wettability.

The solder foils 71A, 71B, 72A, 72B, 73A, 73B are melted in the state of alignment as shown in FIG. 17 to connect the electrode 10, the semiconductor elements 20A, 20B, and the spacers 730A, 730B.

Figure 18:
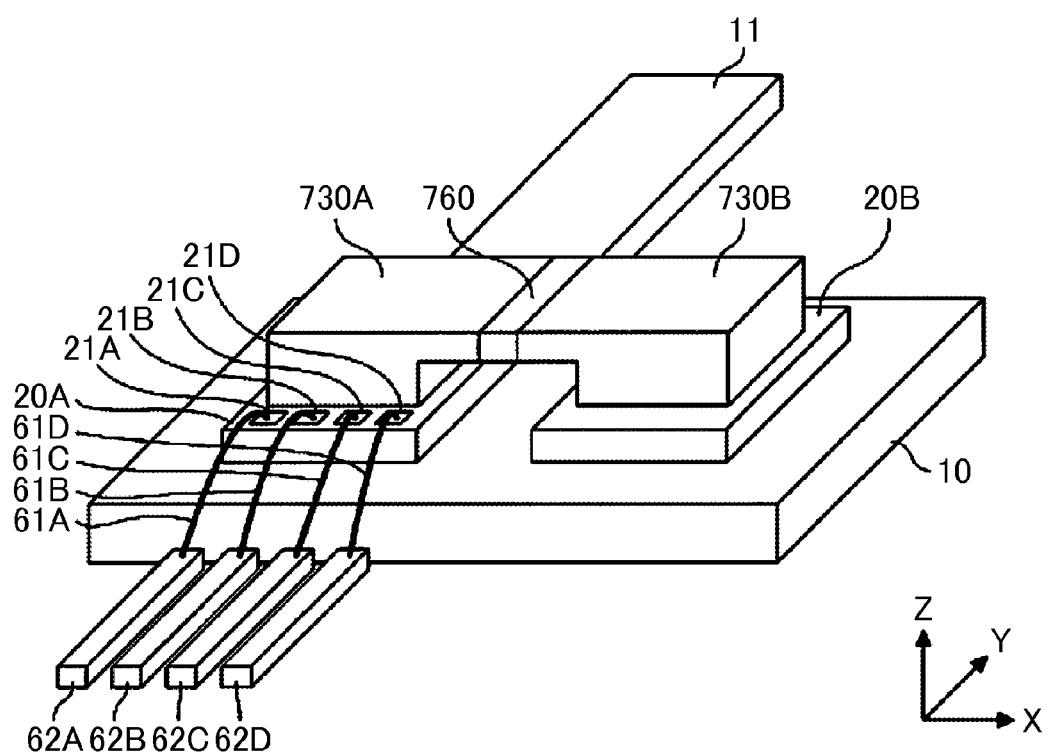
FIG. 18 is a view for showing the manufacturing process of the semiconductor device 700 in the sixth embodiment.

Next, as shown in FIG. 18, the terminals 21A to 21D of the semiconductor element 20A and the control terminals 62A to 62D are respectively connected by the bonding wires 61A to 61D. It should be noted that the solder foils 73A, 73B are not shown in FIG. 18 because the solder foils 73A, 73B are melted in the process shown in FIG. 17 and adhered to the upper surfaces of the spacers 730A, 730B.

In addition, because the solder foils 71A, 71B, 72A, 72B are respectively adhered between the electrode 10 and the semiconductor elements 20A, 20B and between the semiconductor elements 20A, 20B and the spacers 730A, 730B, they are not shown in FIG. 18.

Figure 19:
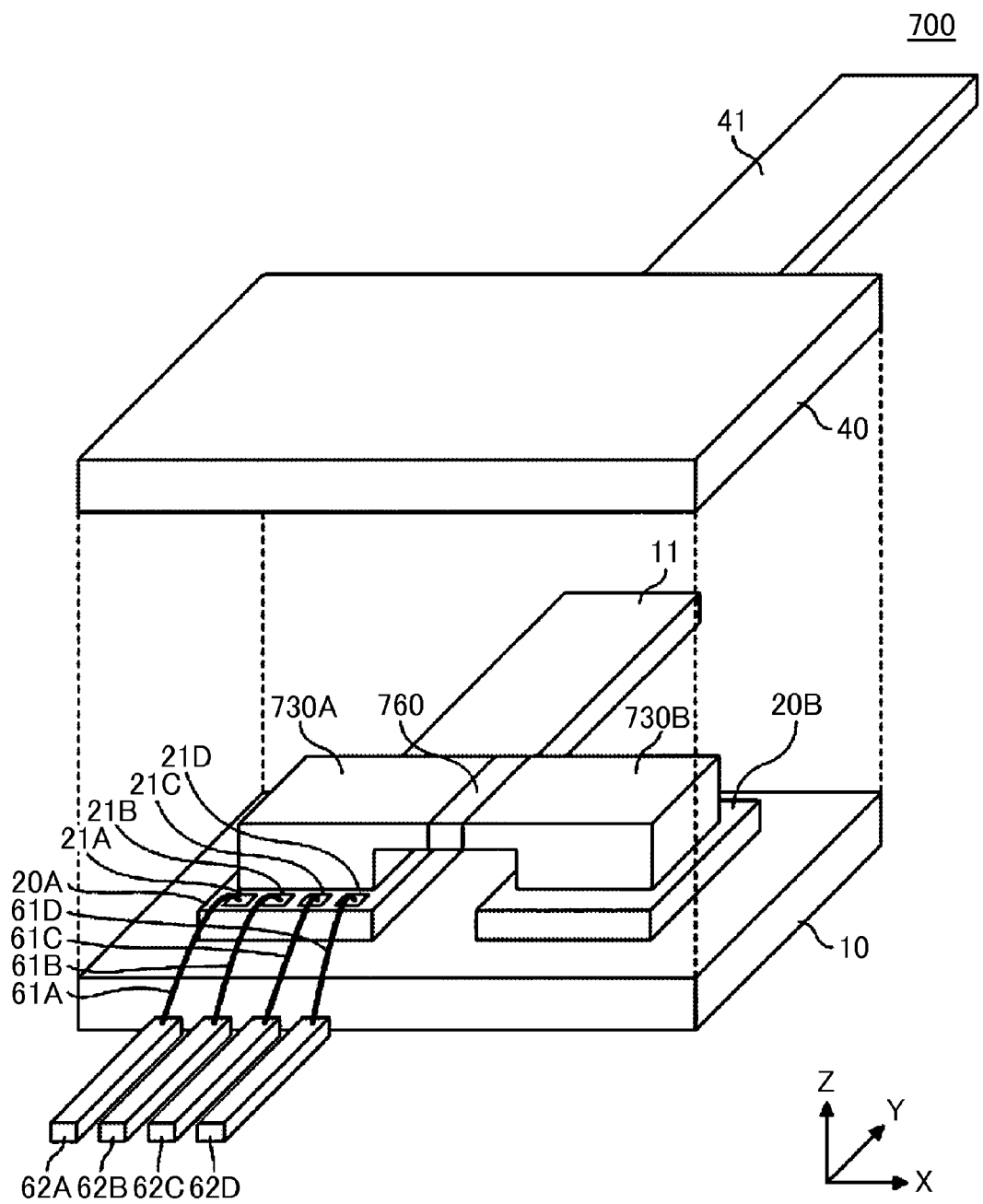
FIG. 19 is a view for showing the manufacturing process of the semiconductor device 700 in the sixth embodiment.

Next, as shown in FIG. 19, the electrode 40 is aligned, the solder adhered to the upper surfaces of the spacers 730A, 730B (the solder adhered by melting of the solder foils 73A, 73B) is melted, and the electrode 40 is bonded to the upper surfaces of the spacers 730A, 730B. The bus bar 41 is connected to the electrode 40.

Figure 20:
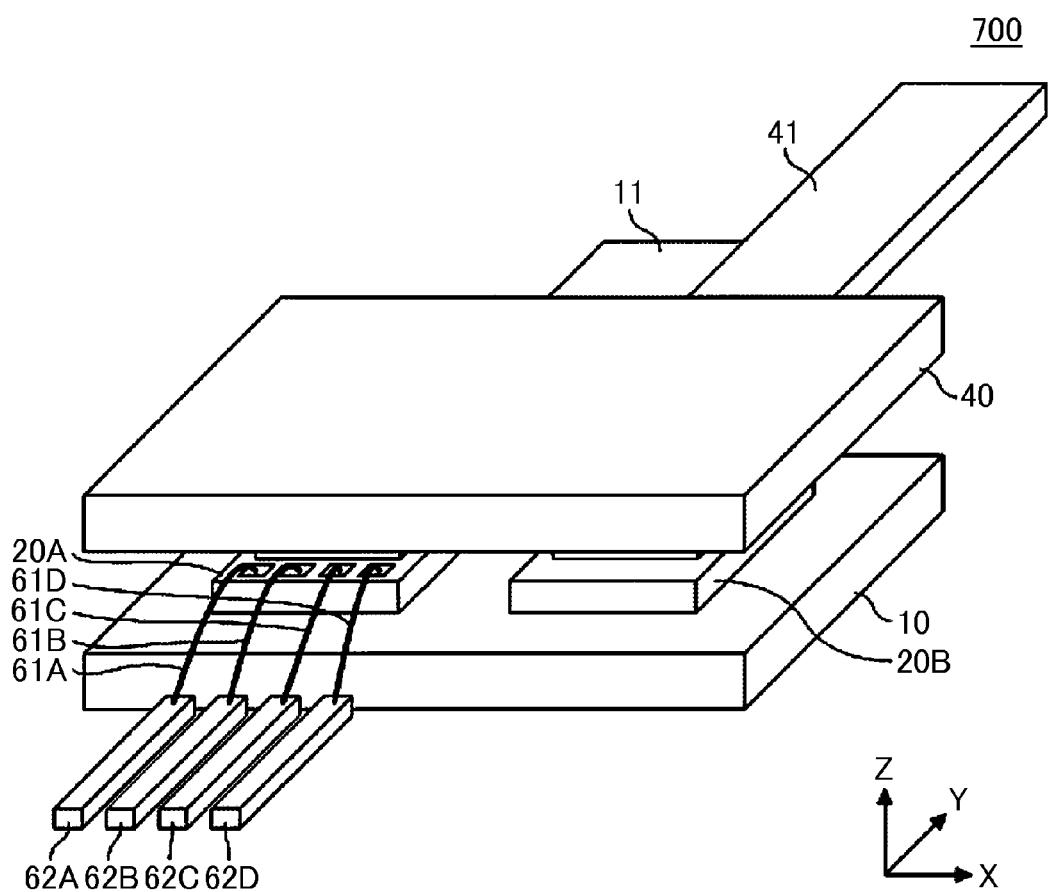
FIG. 20 is a view for showing the manufacturing process of the semiconductor device 700 in the sixth embodiment.

Accordingly, the electrode 10, the semiconductor elements 20A, 20B, the spacers 730A, 730B, and the electrode 40 are bonded to complete a state shown in FIG. 20.

Next, the stress relaxing section 760 is formed in a gap between the projected section 732A of the spacer 730A and the projected section 732B of the spacer 730B. As described above, the stress relaxing section 760 can be formed of any material as long as it has the substantially lower elasticity than the electrode 40 or the spacers 730A, 730B and can be formed of the stress relaxation material such as the silicon resin, the urethane resin, the polyamide resin, the polyimide resin, the rubber-based resin, or the like, for example.

The stress relaxing section 760 is formed by applying the stress relaxation material between the projected section 732A and the projected section 732B, for example.

It should be noted that, if the space between the tip of the projected section 732A and the tip of the projected section 732B is narrow enough to realize the capillary phenomenon, the capillary phenomenon may be used to form the stress relaxing section 760 between the projected section 732A and the projected section 732B.

The electrode 10, the semiconductor elements 20A, 20B, the spacers 730A, 730B, the electrode 40, and the stress relaxing section 760 that are bonded as shown in FIG. 20 are impregnated with the solution in which polyamide, polyimide, or the like is dissolved in the organic solvent so as to coat the surfaces thereof with the film of polyamide, polyimide, or the like before being sealed by the encapsulating resin 150. This is performed to facilitate the adherence of the encapsulating resin 750 to the surfaces of the electrode 10, the semiconductor elements 20A, 20B, the spacers 730A, 730B, and the electrode 40.

In the last, the electrode 10, the semiconductor elements 20A, 20B, the spacers 730A, 730B, the electrode 40, the stress relaxing section 760, the bus bars 11, 41, and the control terminals 62A to 62D are sealed by the encapsulating resin 750. Sealing by the encapsulating resin 750 is achieved by performing the thermal curing treatment of the encapsulating resin 750.

In the thermal curing treatment, the semiconductor elements 20A, 20B, the spacers 730A, 730B, the electrode 40, the stress relaxing section 760, the bus bars 11, 41, and the control terminals 62A to 62D shown in FIG. 20 are placed in the heated mold, the thermosetting resin is poured into the mold while being heated, and the thermosetting resin in the mold is applied with the supplementary pressure while heated to accelerate the cured reaction of the thermosetting resin.

The thermosetting resin is heated at the temperature of approximately 80° C. to 200° C., for example, and is then cooled to obtain the encapsulating resin 750 shown in FIG. 21. The encapsulating resin 750 seals the side surfaces of the electrode 10, the semiconductor elements 20A, 20B, the spacers 730A, 730B, the electrode 40, and the side surfaces of the stress relaxing section 760. In addition, portions on the outer side of the lower surface of the electrode 10, the upper surface of the electrode 40, the bus bars 11, 41, and the control terminals 62A to 62D are exposed from the encapsulating resin 750.

As shown in FIG. 16A, in the semiconductor device 700 of the sixth embodiment as described above, a depth D7 of the encapsulating resin 750 is reduced in the region between the semiconductor element 20A and the semiconductor element 20B like the semiconductor device 100 in the first embodiment (see FIG. 5) due to the projected sections 732A, 732B of the spacers 730A, 730B and the stress relaxing section 760.

Accordingly, the contraction amount of the encapsulating resin 750 in the region between the semiconductor element 20A and the semiconductor element 20B is reduced, and the stress that is applied to the encapsulating resin 750 is thus reduced.

In other words, the stress that is generated by the contraction of the encapsulating resin 750 in the region between the semiconductor element 20A and the semiconductor element 20B is relaxed to the greater extent than the stress that is generated by the contraction of the encapsulating resin 750 in a region other than that between the semiconductor element 20A and the semiconductor element 20B.

In addition, the stress relaxing section 760 is formed between the projected section 732A and the projected section 732B. Accordingly, even when the stress is applied to the encapsulating resin 750, in the region between the spacer 730A and the spacer 730B, the stress relaxing section 760 relaxes the stress.

Therefore, it is possible to suppress the peeling of the encapsulating resin 750 from the electrode 10 in the region between the semiconductor element 20A and the semiconductor element 20B. In addition, it is possible to maintain the favorable connection states between the electrode 10 and the semiconductor elements 20A, 20B because the peeling of the encapsulating resin 750 is suppressed.

As a result, according to the sixth embodiment, it is possible to provide the semiconductor device 700 in which the fatigue fractures between the semiconductor elements 20A, 20B and the electrode 10 can be suppressed by suppressing the peeling of the encapsulating resin 750.

In addition, according to the sixth embodiment, it is possible to provide the semiconductor device 700 in which the peeling of the encapsulating resin 750 can be suppressed not only in the stage of the thermal curing of the encapsulating resin 750 but also in the stage of the repetitive use of the semiconductor device 700 where heating and cooling thereof is repeated by the heat generation of the semiconductor element 20A and the semiconductor element 20B.

Furthermore, according to the semiconductor device 700 of the sixth embodiment, the spacers 730A, 730B are larger than the spacers 30A, 30B of the semiconductor device 1 in the comparative example by the projected sections 732A, 732B. Therefore, the thermal capacities of the spacers 730A, 730B are increased, the heat produced by the semiconductor elements 20A, 20B is transiently absorbed, and thus the cooling performance of the semiconductor elements 20A, 20B can be improved.

In particular, in a case where the semiconductor device 700 is installed in the hybrid vehicle, the inverter 99 is exposed to the high temperature every time the electric motor 91 is driven or regenerated. In such a circumstance, it is extremely beneficial to use the semiconductor device 700 of the sixth embodiment whose cooling performance has been improved.

In the semiconductor device 700 of the sixth embodiment, because the spacers 730A, 730B respectively have the projected sections 732A, 732B, the connection path between the semiconductor element 20A and the semiconductor element 20B is shorter than that in the semiconductor device 1 of the comparative example.

Accordingly, the resistance value of the resistance component and the parasitic inductance between the semiconductor element 20A and the semiconductor element 20B are reduced, and thus the heating value and the surge voltage that is generated along with the switching operation are reduced.

It should be noted that thicknesses of the projected sections 732A, 732B in the spacers 730A, 730B may be set according to a thickness that is required for the stress relaxing section 760, a type of the stress relaxation material used for the stress relaxing section 760, the distance between the semiconductor element 20A and the semiconductor element 20B, a type of the thermosetting resin that forms the encapsulating resin 750, or the like.

As it has been described so far, according to the sixth embodiment, it is possible to provide the semiconductor device 700 in which the fatigue fractures between the semiconductor elements 20A, 20B and the electrode 10 are suppressed by suppressing the peeling of the encapsulating resin 750.

Here, a description will be made on tolerances of external dimensions of the spacers 730A, 730B in the semiconductor device 700 of the sixth embodiment and on a tolerance of an external dimension of the spacer 130 in the semiconductor device 100 of the first embodiment.

FIG. 22 is a view for illustrating the tolerance of the external dimension of the spacer 130 in the semiconductor device 100 of the first embodiment.

Figure 22A:
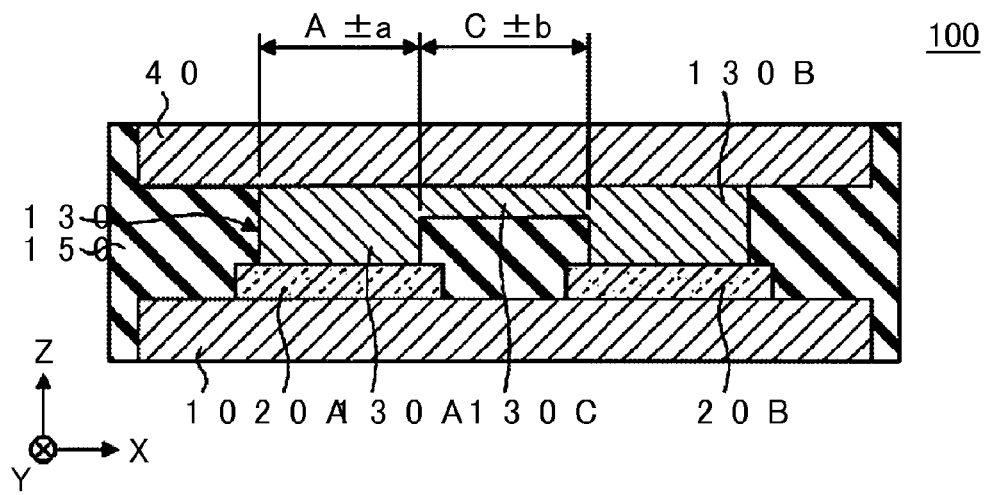
FIG. 22 is a view for illustrating a tolerance of an external dimension of a spacer 130 the semiconductor device 100 in the first embodiment.
Figure 22B:
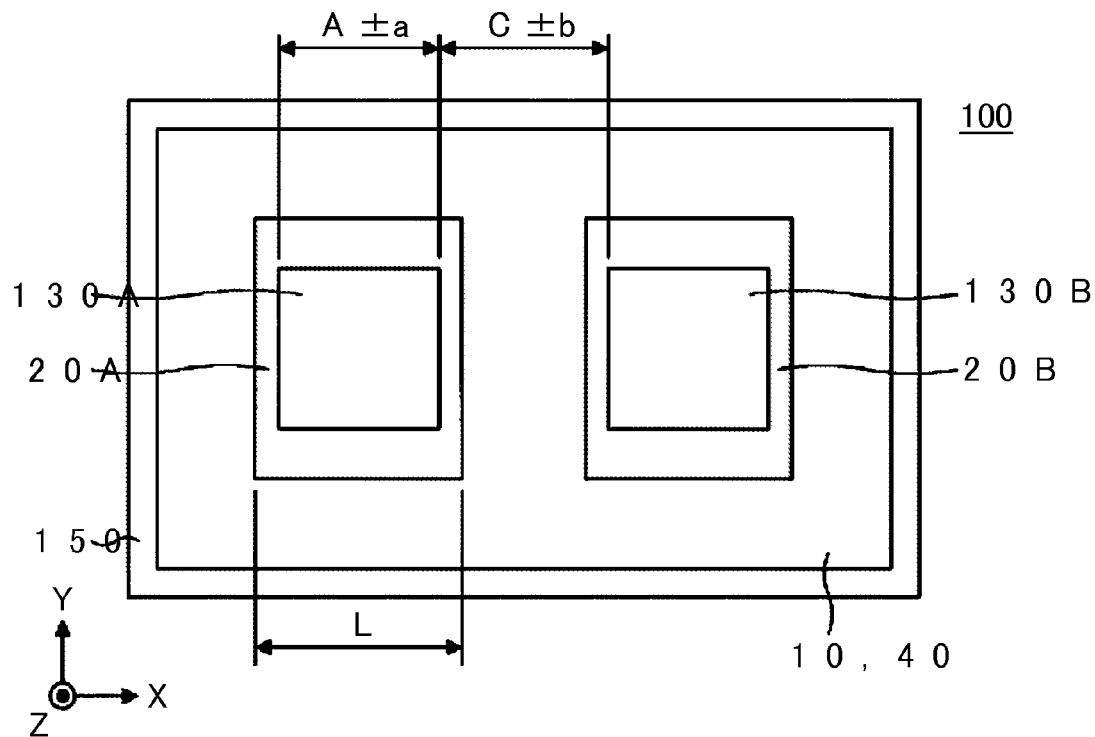

FIG. 22(A) is the same as FIG. 5 and shows the cross section that can be obtained when the semiconductor device 100 of the first embodiment is cut in a thickness direction along a center axis that is parallel to a longitudinal direction thereof. FIG. 22(B) is a view for showing positional relationships among the electrode 10, the semiconductor elements 20A, 20B, the spacer 130, the electrode 40, and the encapsulating resin 150 in the plan view. It should be noted that the electrode 10 and the electrode 40 have the same dimensions and that the positions thereof match each other in the plan view.

In addition, for convenience of the description, the semiconductor elements 20A, 20B are in the same size.

Here, the tolerance of the external dimension of the spacer 130 is only considered, and tolerances of the other components are not considered. As shown in FIG. 22(B), in the semiconductor device 100, the first section 130A and the second section 130B of the spacer 130 have to be smaller than the semiconductor elements 20A, 20B and located on the inner side thereof.

A length of the semiconductor element 20A in the X-axis direction is set as L, a length of the first section 130A in the X-axis direction is set as A, the tolerance of the first section 130A in the X-axis direction is set as a, a length of the connecting section 130C in the X-axis direction is set as C, and the tolerance of the connecting section 130C in the X-axis direction is set as b.

In other words, the length of the first section 130A in the X-axis direction can be represented as L±a in consideration of the tolerance a. In addition, the length of the connecting section 130C in the X-axis direction can be represented as C±b in consideration of the tolerance b.

Here, if consideration is made on the semiconductor element 20A and the first section 130A without considering the connecting section 130C, a relationship of an equation (1) is established between the semiconductor element 20A and the first section 130A.

$$L > A + a \quad (1)$$

Accordingly, the length A of the first section 130A in the spacer 130 can be represented by an equation (2).

$$A < L - a \quad (2)$$

In addition, in a case where the length of the connecting section 130C is fluctuated by ±b, the dimension of the first section 130A has to be within that of the semiconductor element 20A on the left side of the semiconductor element 20A when the tolerance is +b, and the dimension of the first section 130A has to be within that of the semiconductor element 20A on the right side of the semiconductor element 20A when the tolerance is −b.

Thus, if the tolerance b of the connecting section 130C is taken into consideration for the equation (2), an equation (3) is satisfied for the first section 130A and the connecting section 130C.

$$A < L - a - 2b \quad (3)$$

It should be noted that, because the spacer 130 is symmetrical about the connecting section 130C laterally and the dimensions of the first section 130A and the second section 130B are the same, the equation (3) is also satisfied for the second section 130B and the connecting section 130C.

As described above, when the spacer 130 has the connecting section 130C, the dimensions in the X-axis direction of the first section 130A and the second section 130B have to satisfy the equation (3).

As shown in FIG. 22(A), in the semiconductor device 100 of the first embodiment, the length A in the X-axis direction of each of the first section 130A and the second section 130B in the spacer 130 has to satisfy the equation (3).

On the other hand, in the semiconductor device 700 of the sixth embodiment, because the spacer 730A and the spacer 730B are separated from each other, there is no need to consider the tolerance ±b of the length C in the X-axis direction of the connecting section 130C in the spacer 130 of the first embodiment.

In addition, the lengths in the X-axis direction of the base sections 731A, 731B in the spacers 730A, 730B are the same as the length A in the X-axis direction of the first section 130A in the spacer 130 of the first embodiment.

Accordingly, if the length in the X-axis direction of each of the base sections 731A, 731B in the spacers 730A, 730B of the sixth embodiment is set as A7, the length A7 has to satisfy an equation (4) that can be obtained by deleting the tolerance b from the equation (3).

$$A7 < L - a \quad (4)$$

Here, lengths in the Y-axis direction of the first section 130A and the second section 130B in the spacer 130 of the first embodiment are set to be the same as lengths in the Y-axis direction of the base sections 731A, 731B in the spacers 730A, 730B of the sixth embodiment.

In such a condition, the areas of the base sections 731A, 731B in the spacers 730A, 730B of the sixth embodiment that respectively contact the semiconductor elements 20A, 20B are (L−a)/(L−a−2b) times the areas of the first section 130A and the second section 130B in the spacer 130 of the first embodiment that respectively contact the semiconductor elements 20A, 20B.

In other words, the cooling efficiency of each of the spacers 730A, 730B in the semiconductor device 700 of the sixth embodiment can be improved by (L−a)/(L−a−2b) times the cooling efficiency of the spacer 130 in the semiconductor device. 100 of the first embodiment.

As it has been described so far, according to the sixth embodiment, because the peeling of the encapsulating resin 750 is suppressed, it is possible to suppress the fatigue fractures between the semiconductor elements 20A, 20B and the electrode 10 and also possible to provide the semiconductor device 700 in which the cooling efficiency of each of the semiconductor elements 20A, 20B is improved.

It should be noted that the description has been made so far on the mode in which the semiconductor device 700 includes the two semiconductor elements 20A, 20B and in which the projected sections 732A, 732B of the spacers 730A, 730B are disposed in the region between the semiconductor element 20A and the semiconductor element 20B.

However, the semiconductor device 700 may include the three or more semiconductor elements. In such a case, the stress on the encapsulating resin 750 may be relaxed by positioning the projected section of the spacer in a region between two each of the semiconductor elements. Accordingly, it is possible to suppress the peeling of the encapsulating resin 750 from the electrode 10 between the semiconductor elements.

It should be noted that the description has been made so far on the mode in which the stress relaxing section 760 is formed between the projected section 732A of the spacer 730A and the projected section 732B of the spacer 730B; however, the stress relaxing section 760 may not be formed.

Even without the stress relaxing section 760, the thickness of the encapsulating resin 750 in the region between the semiconductor element 20A and the semiconductor element 20B is reduced by the projected section 732A of the spacer 730A and the projected section 732B of the spacer 730B, and thus the stress applied to the encapsulating resin 750 is relaxed in the region between the semiconductor element 20A and the semiconductor element 20B.

Accordingly, when the stress on the encapsulating resin 750 can substantially be relaxed by the projected section 732A of the spacer 730A and the projected section 732B of the spacer 730B, there is no need to provide the stress relaxing section 760.

In addition, a distance between the projected section 732A of the spacer 730A and the projected section 732B of the spacer 730B can be set to any distance, and the tip of the projected section 732A may contact the tip of the projected section 732B.

<Seventh Embodiment>

The semiconductor device according to a seventh embodiment differs from the semiconductor device 700 of the sixth embodiment in terms of the structure of the spacer.

Figure 23A:
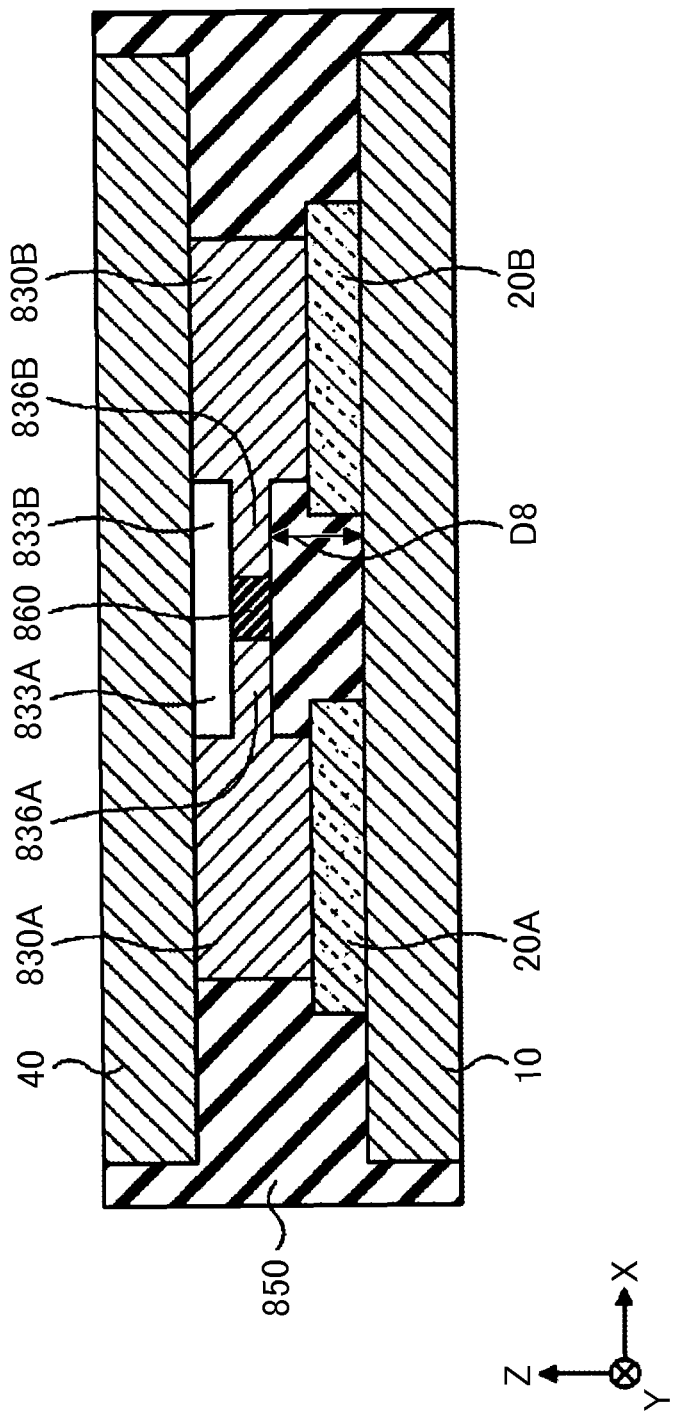
FIG. 23A is a cross-sectional view for showing the semiconductor device according to a seventh embodiment.
Figure 23B:
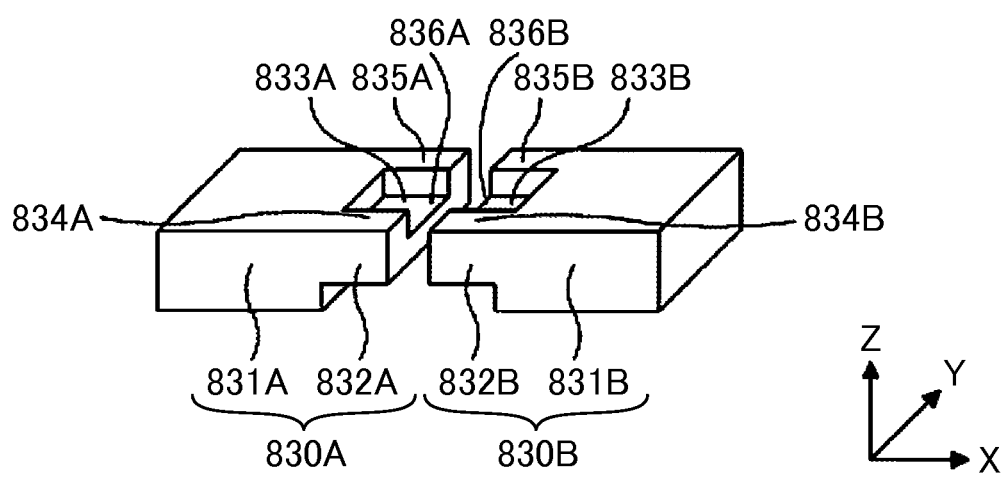
FIG. 23B is a perspective view for showing the spacer of the semiconductor device in the seventh embodiment.

FIG. 23A is a cross-sectional view for showing the semiconductor device according to the seventh embodiment. FIG. 23B is a perspective view for showing the spacer of the semiconductor device in the seventh embodiment. As illustrated, the XYZ coordinate system is defined in FIG. 23A and FIG. 23B.

The cross-sectional view shown in FIG. 23A is a view for showing a cross section that can be obtained when a semiconductor device 800 of the seventh embodiment is cut in the thickness direction by a plane along a center axis in a longitudinal direction (X-axis direction) thereof.

The semiconductor device 800 of the seventh embodiment includes the electrode 10, the semiconductor elements 20A, 20B, spacers 830A, 830B, the electrode 40, an encapsulating resin 850, and a stress relaxing section 860.

The semiconductor device 800 of the seventh embodiment differs from the semiconductor device 700 of the sixth embodiment in terms of structures of the spacers 830A, 830B, the encapsulating resin 850, and the stress relaxing section 860. Because the other components are same as those of the semiconductor device 700 in the sixth embodiment, the same or similar components are denoted by the same reference numerals, and the description thereof is not repeated.

As shown in FIG. 23A and FIG. 23B, the spacer 830A and the spacer 830B are separated from each other. The spacer 830A has a base section 831A and a projected section 832A. The spacer 830B has a base section 831B and a projected section 832B.

The base section 831A of the spacer 830A is the same as the base section 731A of the spacer 730A (see FIG. 16A and FIG. 16B) in the semiconductor device 700 of the sixth embodiment. The projected section 832A is projected from the upper side of the base section 831A in the positive direction of the X-axis. In addition, the projected section 832A is formed with a recessed section 833A. The recessed section 833A is formed at the center of a tip of the projected section 832A in the Y-axis direction. In other words, both sides of the recessed section 833A in the Y-axis direction are formed with wall sections 834A, 835A.

Furthermore, a portion of the projected section 832A that is thinned by the recessed section 833A constitutes a thin section 836A.

The base section 831B of the spacer 830B is the same as the base section 731B of the spacer 730B (see FIG. 16A and FIG. 16B) in the semiconductor device 700 of the sixth embodiment. The projected section 832B is projected from the upper side of the base section 831B in the negative direction of the X-axis. In addition, the projected section 832B is formed with a recessed section 833B. The recessed section 833B is formed at the center of a tip of the projected section 832B in the Y-axis direction. In other words, both sides of the recessed section 833B in the Y-axis direction are formed with wall sections 834B, 835B.

Furthermore, a portion of the projected section 832B that is thinned by the recessed section 833B constitutes a thin section 836B.

Here, the recessed section 833A is an example of a first recessed section that is formed on a surface of the tip of the projected section 832A, which is an example of the first projected section, on the side of the electrode 40, which is an example of the second metal plate. The recessed section 833B is an example of a second recessed section that is formed on a surface of the tip of the projected section 832B, which is an example of the second projected section, on a the side of the electrode 40, which is an example of the second metal plate.

The base section 831A of the spacer 830A is connected to the emitter in the upper surface of the semiconductor element 20A, and the base section 831B of the spacer 830B is connected to the anode in the upper surface of the semiconductor element 20B.

There is a distance between the tip of the projected section 832A in the spacer 830A and the tip of the projected section 832B in the spacer 830B, and the stress relaxing section 860 is disposed between the tip of the projected section 832A and the tip of the projected section 832B.

The stress relaxing section 860 can be formed of any material as long as it has substantially lower elasticity than the electrode 40 or the spacers 830A, 830B, and can be formed of the stress relaxation material such as the silicon resin, the urethane resin, the polyamide resin, the polyimide resin, the rubber-based resin, or the like, for example. It should be noted that the stress relaxing section 860 may be formed of a material whose elasticity is lower than the encapsulating resin 850.

The stress relaxing section 860 is formed such that, for example, the spacers 830A, 830B are respectively bonded to the upper surfaces of the semiconductor elements 20A, 20B and that the stress relaxation material is further applied between the projected section 832A and the projected section 832B in a state that the electrode 40 is bonded to upper surfaces of the spacers 830A, 830B.

It should be noted that, when a space between the tip of the projected section 832A and the tip of the projected section 832B is narrow enough to realize the capillary phenomenon, the capillary phenomenon is used to form the stress relaxing section 860 between the projected section 832A and the projected section 832B.

The electrode 40 is bonded to the upper surfaces of the spacers 830A, 830B. It should be noted that the stress relaxing section 860 may be formed before the electrode 40 is bonded onto the spacers 830A, 830B.

The stress relaxing section 860 is formed between the projected section 832A and the projected section 832B. Accordingly, as shown as a void space in FIG. 23B, the encapsulating resin 850 does not flow into a portion surrounded by the recessed sections 833A, 833B, the stress relaxing section 860, and the electrode 40, and thus the portion becomes hollow.

The encapsulating resin 850 seals the electrode 10, the semiconductor elements 20A, 20B, the spacers 830A, 830B, the electrode 40, and the stress relaxing section 860. The encapsulating resin 850 can be formed in a same manner as the encapsulating resin 150 in the first embodiment.

As shown in FIG. 23A, in the semiconductor device 800 of the seventh embodiment as described above, a thickness D8 of the encapsulating resin 850 is reduced in the region between the semiconductor element 20A and the semiconductor element 20B like the semiconductor device 100 of the first embodiment (see FIG. 5) due to the projected sections 832A, 832B of the spacers 830A, 830B and the stress relaxing section 860.

Accordingly, the contraction amount of the encapsulating resin 850 in the region between the semiconductor element 20A and the semiconductor element 20B is reduced, and the stress that is applied to the encapsulating resin 850 is thus reduced.

In addition, the stress relaxing section 860 is formed between the projected section 832A and the projected section 832B. Thus, even when the stress is applied to an encapsulating resin 850 in a region between the spacer 830A and the spacer 830B, the stress relaxing section 860 relaxes the stress.

In other words, the stress that is generated by the contraction of the encapsulating resin 850 in the region between the semiconductor element 20A and the semiconductor element 20B is relaxed to the greater extent than the stress that is generated by the contraction of the encapsulating resin 850 in a region other than that between the semiconductor element 20A and the semiconductor element 20B.

Furthermore, because the thin sections 836A, 836B of the projected sections 832A, 832B are thin, they can be deflected when the stress is applied thereto by the encapsulating resin 850.

Therefore, it is possible to suppress the peeling of the encapsulating resin 850 from the electrode 10 in the region between the semiconductor element 20A and the semiconductor element 20B. In addition, because the peeling of the encapsulating resin 850 is suppressed, it is possible to maintain the favorable connection states between the electrode 10 and the semiconductor elements 20A, 20B.

As a result, according to the seventh embodiment, it is possible to provide the semiconductor device 800 in which the fatigue fractures between the semiconductor elements 20A, 20B and the electrode 10 are suppressed by suppressing the peeling of the encapsulating resin 850.

In addition, according to the seventh embodiment, it is possible to provide the semiconductor device 800 in which the peeling of the encapsulating resin 850 can be suppressed not only in the stage of the thermal curing of the encapsulating resin 850 but also in the stage of the repetitive use of the semiconductor device 800 where heating and cooling thereof is repeated by the heat generation of the semiconductor element 20A and the semiconductor element 20B.

Furthermore, according to the semiconductor device 800 of the seventh embodiment, the spacers 830A, 830B are larger than the spacers 30A, 30B of the semiconductor device 1 in the comparative example by the projected sections 832A, 832B. Therefore, the thermal capacities of the spacers 830A, 830B are increased, the heat produced by the semiconductor elements 20A, 20B is transiently absorbed, and thus the cooling performance of the semiconductor elements 20A, 20B can be improved.

In particular, in a case where the semiconductor device 800 is installed in the hybrid vehicle, the inverter 99 is exposed to the high temperature every time the electric motor 91 is driven or regenerated. In such a circumstance, it is extremely beneficial to use the semiconductor device 800 of the seventh embodiment whose cooling performance has been improved.

Moreover, in the semiconductor device 800 of the seventh embodiment, because the spacers 830A, 830B respectively have the projected sections 832A, 8328, the connection path between the semiconductor element 20A and the semiconductor element 20B is shorter than that in the semiconductor device 1 of the comparative example.

Accordingly, the resistance value of the resistance component and the parasitic inductance between the semiconductor element 20A and the semiconductor element 20B are reduced, and thus the heating value and the surge voltage that is generated along with the switching operation are reduced.

It should be noted that thicknesses of the projected sections 832A, 832B in the spacers 830A, 830B may be set according to a thickness that is required for the stress relaxing section 860, a type of the stress relaxation material used for the stress relaxing section 860, the distance between the semiconductor element 20A and the semiconductor element 20B, a type of the thermosetting resin that forms the encapsulating resin 850, or the like.

As it has been described so far, according to the seventh embodiment, it is possible to provide the semiconductor device 800 in which the fatigue fractures between the semiconductor elements 20A, 20B and the electrode 10 are suppressed by suppressing the peeling of the encapsulating resin 850.

It should be noted that the description has been made so far on the mode in which the semiconductor device 800 includes the two semiconductor elements 20A, 20B and in which the projected sections 832A, 832B respectively having the recessed section 833A, the recessed section 833B are disposed in the region between the semiconductor element 20A and the semiconductor element 20B.

However, the semiconductor device 800 may include the three or more semiconductor elements. In such a case, the stress on the encapsulating resin 850 may be relaxed by positioning the recessed section of the projected section of the spacer in a region between two each of the semiconductor elements. Accordingly, it is possible to suppress the peeling of the encapsulating resin 850 from the electrode 10 between the semiconductor elements.

<Eighth Embodiment>

The semiconductor device according to an eighth embodiment differs from the semiconductor device 700 of the sixth embodiment in terms of the structure of the spacer.

Figure 24A:
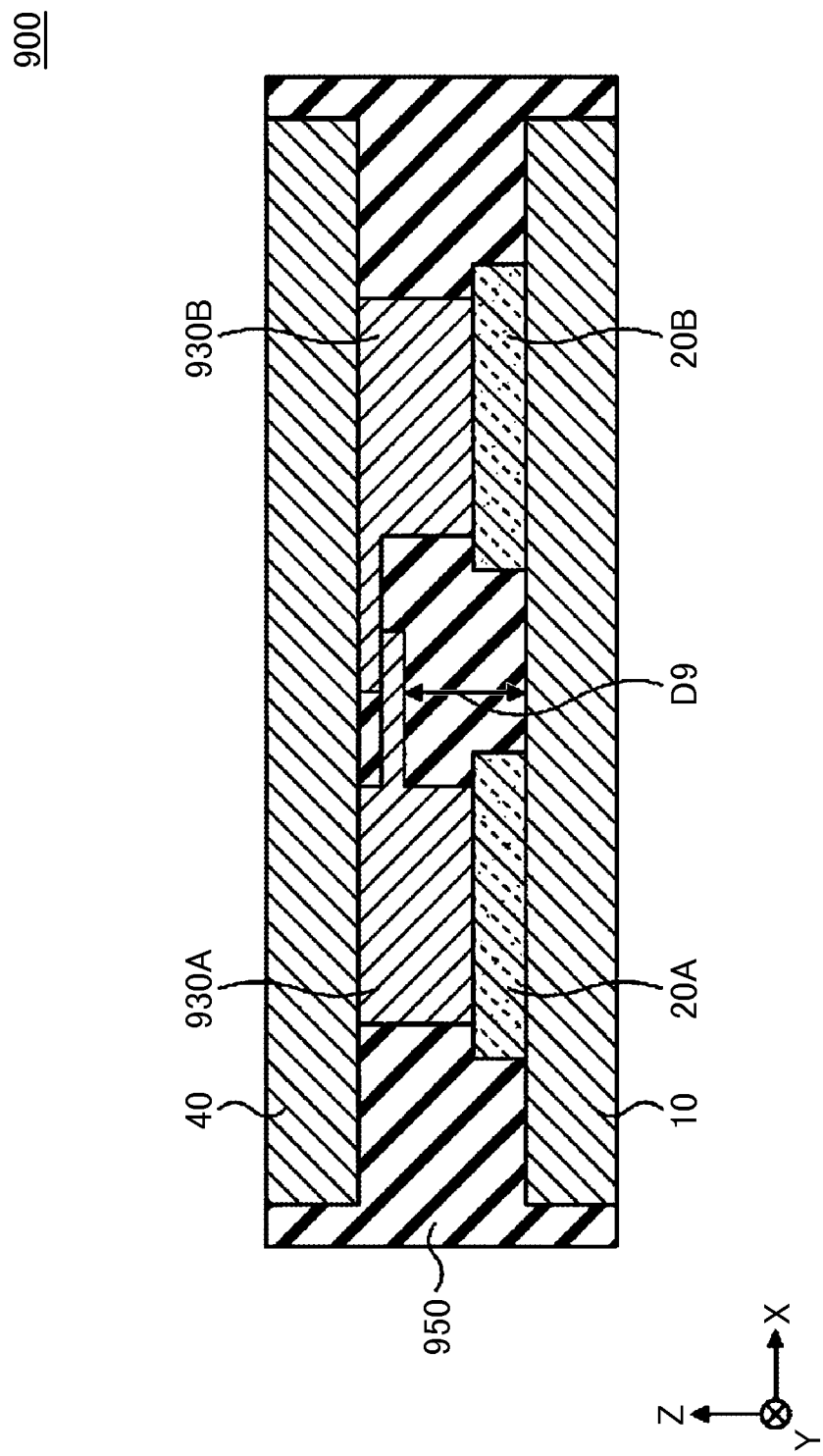
FIG. 24A is a cross-sectional view for showing the semiconductor device according to an eighth embodiment.

FIG. 24A is a cross-sectional view for showing the semiconductor device according to the eighth embodiment. FIG. 24B is a perspective view for showing the spacer of the semiconductor device in the eighth embodiment. As illustrated, the XYZ coordinate system is defined in FIG. 24A and FIG. 24B.

The cross-sectional view shown in FIG. 24A is a view of a cross section that can be obtained when a semiconductor device 900 of the eighth embodiment is cut in a thickness direction by a plane along a center axis in a longitudinal direction (X-axis direction) thereof.

The semiconductor device 900 of the eighth embodiment includes the electrode 10, the semiconductor elements 20A, 20B, spacers 930A, 930B, the electrode 40, and an encapsulating resin 950. In FIG. 24B, the spacers 930A, 930B shown in FIG. 24A are separately shown for ease of understanding.

The semiconductor device 900 of the eighth embodiment differs from the semiconductor device 700 of the sixth embodiment in terms of structures of the spacers 930A, 930B and the encapsulating resin 950. Because the other components are same as those of the semiconductor device 700 in the sixth embodiment, the same or similar components are denoted by the same reference numerals, and the description thereof is not repeated.

As shown in FIG. 24A and FIG. 24B, the spacer 930A and the spacer 930B are separated from each other. The spacer 930A has a base section 931A and a projected section 932A. The spacer 930B has a base section 931B and a projected section 932B.

The base section 931A of the spacer 930A is the same as the base section 731A of the spacer 730A (see FIG. 16A and FIG. 16B) in the semiconductor device 700 of the sixth embodiment. The projected section 932A is projected from an intermediate portion of the base section 931A in a height direction in the positive direction of the X-axis.

The base section 931B of the spacer 930B is the same as the base section 731B of the spacer 730B (see FIG. 16A and FIG. 16B) in the semiconductor device 700 of the sixth embodiment. The projected section 932B is projected from the upper side of the base section 931B in the negative direction of the X-axis.

As shown in FIG. 24A, a height of the projected section 932A in the spacer 930A and a height of the projected section 932B in the spacer 930B are set such that an upper surface of the projected section 932A abuts against a lower surface of the projected section 932B in a state that the spacers 930A, 930B are bonded to the upper surfaces of the semiconductor elements 20A, 20B.

In addition, as shown in FIG. 24A, a length in the X-axis direction of the projected section 932A in the spacer 930A and a length in the X-axis direction of the projected section 932B in the spacer 930B are set such that a tip of the projected section 932A overlaps with a tip of the projected section 932B in the state that the spacers 930A, 930B are bonded to the upper surfaces of the semiconductor elements 20A, 20B.

Here, portions of a tip of the projected section 932A and the tip of the projected section 932B that overlap with each other in the plan view are an example of an overlapping section.

It should be noted that the projected sections 932A, 932B respectively have same widths as the base sections 931A, 931B in the Y-axis direction.

Accordingly, the projected section 932A and the projected section 932E overlap with each other in the state that the spacers 930A, 930B are bonded to the upper surfaces of the semiconductor elements 20A, 20B, and the upper surface of the projected section 932A abuts against the lower surface of the projected section 932B.

The base section 931A of the spacer 930A is connected to the emitter in the upper surface of the semiconductor element 20A, and the base section 931B of the spacer 930B is connected to the anode in the upper surface of the semiconductor element 20B.

The electrode 40 is bonded to upper surfaces of the spacers 930A, 930B.

The encapsulating resin 950 seals the electrode 10, the semiconductor elements 20A, 20B, the spacers 930A, 930B, and the electrode 40. The encapsulating resin 950 can be formed in the same manner as the encapsulating resin 150 of the first embodiment.

As shown in FIG. 24A, the encapsulating resin 950 is formed between the projected sections 932A and 932B and the electrode 10 in the region between the semiconductor element 20A and the semiconductor element 20B. In addition, the encapsulating resin 950 is also formed on the upper side of the projected section 932A.

In the semiconductor device 900 of the eighth embodiment as described above, as shown in FIG. 24A, a thickness D9 of the encapsulating resin 950 is reduced in the region between the semiconductor element 20A and the semiconductor element 20B like the semiconductor device 100 of the first embodiment (see FIG. 5) due to the projected sections 932A, 932B of the spacers 930A, 930B.

Accordingly, the contraction amount of the encapsulating resin 950 in the region between the semiconductor element 20A and the semiconductor element 20B is reduced, and the stress applied to the encapsulating resin 950 is thus reduced.

In other words, the stress that is generated by the contraction of the encapsulating resin 950 in the region between the semiconductor element 20A and the semiconductor element 20B is relaxed to the greater extent than the stress that is generated by the contraction of the encapsulating resin 950 in a region other than that between the semiconductor element 20A and the semiconductor element 20B.

Therefore, it is possible to suppress the peeling of the encapsulating resin 950 from the electrode 10 in the region between the semiconductor element 20A and the semiconductor element 20B. In addition, because the peeling of the encapsulating resin 950 is suppressed, it is possible to maintain the favorable connection states between the electrode 10 and the semiconductor elements 20A, 20B.

As a result, according to the eighth embodiment, it is possible to provide the semiconductor device 900 in which the fatigue fractures between the semiconductor elements 20A, 20B and the electrode 10 are suppressed by suppressing the peeling of the encapsulating resin 950.

In addition, according to the eighth embodiment, it is possible to provide the semiconductor device 900 in which the peeling of the encapsulating resin 950 can be suppressed not only in the stage of the thermal curing of the encapsulating resin 950 but also in the stage of the repetitive use of the semiconductor device 900 where heating and cooling thereof is repeated by the heat generation of the semiconductor element 20A and the semiconductor element 20B.

Furthermore, according to the semiconductor device 900 of the eighth embodiment, the spacers 930A, 930B are larger than the spacers 30A, 30B of the semiconductor device 1 in the comparative example by the projected sections 932A, 932B. Therefore, the thermal capacities of the spacers 930A, 930B are increased, the heat produced by the semiconductor elements 20A, 20B is transiently absorbed, and thus the cooling performance of the semiconductor elements 20A, 20B can be improved.

In particular, in a case where the semiconductor device 900 is installed in the hybrid vehicle, the inverter 99 is exposed to the high temperature every time the electric motor 91 is driven or regenerated. In such a circumstance, it is extremely beneficial to use the semiconductor device 900 of the eighth embodiment whose cooling performance has been improved.

Moreover, in the semiconductor device 900 of the eighth embodiment, because the spacers 930A, 930B respectively have the projected sections 932A, 932B, the connection path between the semiconductor element 20A and the semiconductor element 20B is shorter than that in the semiconductor device 1 of the comparative example.

Accordingly, the resistance value of the resistance component and the parasitic inductance between the semiconductor element 20A and the semiconductor element 20B are reduced, and thus the heating value and the surge voltage that is generated along with the switching operation are reduced.

In the semiconductor device 900 of the eighth embodiment, because the spacer 930A and the spacer 930B are separated from each other, like the semiconductor device 700 of the sixth embodiment, there is no need to consider the tolerance ±b of the length C in the X-axis direction of the connecting section 130C in the spacer 130 of the first embodiment.

It should be noted that thicknesses of the projected sections 932A, 932B in the spacers 930A, 930B may be set according to the distance between the semiconductor element 20A and the semiconductor element 20B, a type of the thermosetting resin that forms the encapsulating resin 950, or the like.

As it has been described so far, according to the eighth embodiment, it is possible to provide the semiconductor device 900 in which the fatigue fractures between the semiconductor elements 20A, 20B and the electrode 10 are suppressed by suppressing the peeling of the encapsulating resin 950.

It should be noted that the description has been made so far on the mode in which the semiconductor device 900 includes the two semiconductor elements 20A, 20B and in which the projected sections 932A, 932B of the spacers 930A, 930B are disposed in the region between the semiconductor element 20A and the semiconductor element 20B.

However, the semiconductor device 900 may include the three or more semiconductor elements. In such a case, the stress on the encapsulating resin 950 may be relaxed by positioning the recessed section of the projected section of the spacer in a region between two each of the semiconductor elements. Accordingly, it is possible to suppress the peeling of the encapsulating resin 950 from the electrode 10 between the semiconductor elements.

In addition, the stress relaxing section may be provided between the projected section 932A and the projected section 932B by the application of the stress relaxation material between the projected section 932A and the projected section 932B or the like.

The semiconductor devices according to the illustrative embodiments of the present invention have been described so far; however, the present invention is not limited to the embodiments that have specifically been disclosed and is susceptible to various modifications and changes without departing from the scope of the claims.

DESCRIPTION OF THE REFERENCE NUMERALS AND SYMBOLS

100: SEMICONDUCTOR DEVICE
10: ELECTRODE
20A, 20B: SEMICONDUCTOR ELEMENTS
130: SPACER
130A: FIRST SECTION
130B: SECOND SECTION
130C: CONNECTING SECTION
40: ELECTRODE
150: ENCAPSULATING RESIN
200: SEMICONDUCTOR DEVICE
230: SPACER
230A: FIRST SECTION
230B: SECOND SECTION
230C: CONNECTING SECTION
230D: RECESSED SECTION
330A, 330B: SPACER
400: SEMICONDUCTOR DEVICE
440: ELECTRODE
450: ENCAPSULATING RESIN
500: SEMICONDUCTOR DEVICE
540: ELECTRODE
550: ENCAPSULATING RESIN
560: STRESS RELAXING SECTION
540A: RECESSED SECTION
540B: THIN SECTION
500A: SEMICONDUCTOR DEVICE
543: ELECTRODE
561: STRESS RELAXING SECTION
543A: RECESSED SECTION
543B: THIN SECTION
500B: SEMICONDUCTOR DEVICE
546: ELECTRODE
549: PROJECTED SECTION
546A: RECESSED SECTION
562: STRESS RELAXING SECTION
600: SEMICONDUCTOR DEVICE
640: ELECTRODE
650: ENCAPSULATING RESIN
660: PEELING FILM
700: SEMICONDUCTOR DEVICE
730A, 730B: SPACER
750: ENCAPSULATING RESIN
760: STRESS RELAXING SECTION
731A, 731B: BASE SECTION
732A, 732B: PROJECTED SECTION
800: SEMICONDUCTOR DEVICE
830A, 830B: SPACER
850: ENCAPSULATING RESIN
860: STRESS RELAXING SECTION
831A, 831B: BASE SECTION
832A, 832B: PROJECTED SECTION
833A, 833B: RECESSED SECTION
900: SEMICONDUCTOR DEVICE
930A, 930B: SPACER
931A, 931B: BASE SECTION
932A, 932B: PROJECTED SECTION
950: ENCAPSULATING RESIN

The invention claimed is:

1. A semiconductor device comprising:
a first metal plate;
plural semiconductor elements mounted on the first metal plate;
a spacer connected to surfaces opposite from mounted surfaces of the plural semiconductor elements on the first metal plate;
a second metal plate connected to a surface opposite from a connected surface of the spacer to the semiconductor elements; and
an encapsulating resin configured to seal the plural semiconductor elements between the first metal plate and the second metal plate,
wherein the encapsulating resin is configured of a thermosetting resin and is contracted after thermal curing by heating and cooling,
wherein first stress generated by contraction of the encapsulating resin between the plural semiconductor elements is relaxed to a greater extent than second stress generated by the contraction of the encapsulating resin in a portion other than that between the plural semiconductor elements,
wherein the spacer has:
a first section between the second metal plate and a first semiconductor element of the plural semiconductor elements;
a second section between the second metal plate and a second semiconductor element of the plural semiconductor elements; and
a connecting section for connecting between the first section and the second section,
wherein the encapsulating resin has a first thickness between the first metal plate and the connecting section and between the plural semiconductor elements so as to relax the first stress, the first thickness smaller than a second thickness of the encapsulating resin between the first metal plate and the second metal plate in a portion of the encapsulating resin other than that between the plural semiconductor elements, and
wherein the spacer has a recessed section in the connecting section on the second metal plate side.

2. The semiconductor device according to claim 1, wherein the recessed section is filled with a metal whose rigidity is lower than the spacer.

3. A semiconductor device comprising:
a first metal plate;
plural semiconductor elements mounted on the first metal plate;
a spacer connected to surfaces opposite from mounted surfaces of the plural semiconductor elements on the first metal plate;
a second metal plate connected to a surface opposite from a connected surface of the spacer to the semiconductor elements; and
an encapsulating resin configured to seal the plural semiconductor elements between the first metal plate and the second metal plate, wherein the encapsulating resin is configured of a thermosetting resin and is contracted after thermal curing by heating and cooling, wherein first stress generated by contraction of the encapsulating resin between the plural semiconductor elements is relaxed to a greater extent than second stress generated by the contraction of the encapsulating resin in a portion other than that between the plural semiconductor elements, wherein the spacer has a first section between the second metal plate and a first semiconductor element of the plural semiconductor elements and a second section between the second metal plate and a second semiconductor element of the plural semiconductor elements, wherein the second metal plate is formed with a stress relaxing section between the first section and the second section in a plan view, the stress relaxing section configured to relax stress on an interface between the second metal plate and the encapsulating resin, and wherein stress applied to the encapsulating resin is relaxed by the stress relaxing section so that the first stress is relaxed, wherein the second metal plate has a recessed section that is formed on the first metal plate side between the first section and the second section in the plan view, wherein the stress relaxing section is formed in the recessed section, and wherein the recessed section is formed of plural grooves or plural holes.

4. A semiconductor device comprising:
a first metal plate;
plural semiconductor elements mounted on the first metal plate:,
a spacer connected to surfaces opposite from mounted surfaces of the plural semiconductor elements on the first metal plate;
a second metal plate connected to a surface opposite from a connected surface of the spacer to the semiconductor elements; and
an encapsulating resin configured to seal the plural semiconductor elements between the first metal plate and the second metal plate,
wherein the encapsulating resin is configured of a thermosetting resin and is contracted after thermal curing by heating and cooling,
wherein first stress generated by contraction of the encapsulating resin between the plural semiconductor elements is relaxed to a greater extent than second stress generated by the contraction of the encapsulating resin in a portion other than that between the plural semiconductor elements,
wherein the spacer has a first section between the second metal plate and a first semiconductor element of the plural semiconductor elements and a second section between the second metal plate and a second semiconductor element of the plural semiconductor elements,
wherein the second metal plate is formed with a stress relaxing section between the first section and the second section in a plan view, the stress relaxing section configured to relax stress on an interface between the second metal plate and the encapsulating resin, and
wherein stress applied to the encapsulating resin is relaxed by the stress relaxing section so that the first stress is relaxed,
wherein the second metal plate has a recessed section that is formed on the first metal plate side between the first section and the second section in the plan view,
wherein the stress relaxing section is formed in the recessed section, and
wherein the second metal plate has a projected that is projected to the first metal plate side between the first section and the second section in the view and the recessed section is formed in the projecting setion.

5. A semiconductor device comprising:
a first metal plate;
plural semiconductor elements mounted on the first metal plate;
a spacer connected to surfaces opposite from mounted surfaces of the plural semiconductor elements on the first metal plate;
a second metal plate connected to a surface opposite from a connected surface of the spacer to the semiconductor elements; and
an encapsulating resin configured to seal the plural semiconductor elements between the first metal plate and the second metal plate,
wherein the encapsulating resin is configured of a thermosetting resin and is contracted after thermal curing by heating and cooling,
wherein first stress generated by contraction of the encapsulating resin between the plural semiconductor elements is relaxed to a greater extent than second stress generated by the contraction of the encapsulating resin in a portion other than that between the plural semiconductor elements,
wherein the spacer has a first section between the second metal plate and a first semiconductor element of the plural semiconductor elements and a second section between the second metal plate and a second semiconductor element of the plural semiconductor elements, and
wherein a peeling induction film configured to promote peeling of the encapsulating resin is formed on a surface on the first metal plate side of the second metal plate between the first section and the second section in a plan view.

6. A semiconductor device comprising:
a first metal plate;
plural semiconductor elements mounted on the first metal plate;
a spacer connected to surfaces opposite from mounted surfaces of the plural semiconductor elements on the first metal plate;
a second metal plate connected to a surface opposite from a connected surface of the spacer to the semiconductor elements; and
an encapsulating resin configured to seal the plural semiconductor elements between the first metal plate and the second metal plate,
wherein the encapsulating resin is configured of a thermosetting resin and is contracted after thermal curing by heating and cooling,
wherein first stress generated by contraction of the encapsulating resin between the plural semiconductor elements is relaxed to a greater extent than second stress generated by the contraction of the encapsulating resin in a portion other than that between the plural semiconductor elements,
wherein the spacer has:
a first section between the second metal plate and a first semiconductor element of the plural semiconductor elements;

a second section between the second metal plate and a second semiconductor element of the plural semiconductor elements;
a first projected section that is projected from the first section to the second section side; and
a second projected section that is projected from the second section to the first section side,
wherein a stress relaxing section configured to relax stress between the first projected section and the encapsulating resin and between the second projected section and the encapsulating resin is formed between the first projected section and the second projected section, and
wherein the spacer has a first recessed section that is formed in a surface on the second metal plate side at a tip of the first projected section and a second recessed section that is formed in a surface on the second metal plate side at a tip of the second projected section.

* * * * *

UNITED STATES PATENT AND TRADEMARK OFFICE
CERTIFICATE OF CORRECTION

PATENT NO. : 9,165,848 B2  
APPLICATION NO. : 14/347505  
DATED : October 20, 2015  
INVENTOR(S) : Ohno et al.

Page 1 of 1

It is certified that error appears in the above-identified patent and that said Letters Patent is hereby corrected as shown below:

In the specification

Column 5, line 48, change "and as' the" to -- and as the --

Column 10, line 15, change "being sealed' by" to -- being sealed by --

Column 11, line 63, change "can be defaulted in" to -- can be deformed in --

Column 33, line 49, change "8328, the" to -- 832B, the --

Column 35, line 20, change "Section 932E overlap" to -- section 932B overlap --

In the claims

Column 39, line 33, claim 4, change "plate:," to -- plate; --

Column 40, line 3, claim 4, change "a projected that" to -- a projected section that --

Column 40, line 5, claim 4, change "in the view" to -- in the plan view --

Column 40, line 6, claim 4, change "in the projecting setion" to -- in the projected section --

Signed and Sealed this  
Second Day of August, 2016

Michelle K. Lee  
*Director of the United States Patent and Trademark Office*